(12) United States Patent
Fang et al.

(10) Patent No.: US 12,074,585 B2
(45) Date of Patent: *Aug. 27, 2024

(54) TORSIONAL MODE QUARTZ CRYSTAL DEVICE

(71) Applicant: Statek Corporation, Orange, CA (US)

(72) Inventors: Yue Fang, Brea, CA (US); Jian Feng Chen, Fords, NJ (US)

(73) Assignee: Statek Corporation, Orange, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/319,319

(22) Filed: May 17, 2023

(65) Prior Publication Data

US 2024/0137006 A1 Apr. 25, 2024

Related U.S. Application Data

(63) Continuation of application No. 17/305,904, filed on Jul. 16, 2021, now Pat. No. 11,658,637, which is a
(Continued)

(51) Int. Cl.
*H03H 9/215* (2006.01)
*G01K 7/32* (2006.01)
(Continued)

(52) U.S. Cl.
CPC .............. *H03H 9/215* (2013.01); *G01K 7/32* (2013.01); *H03H 9/02023* (2013.01);
(Continued)

(58) Field of Classification Search
CPC ..... H03H 9/215; H03H 9/02023; H01L 41/04
See application file for complete search history.

(56) References Cited

U.S. PATENT DOCUMENTS

| 4,379,244 A | 4/1983 | Dinger |
| 4,384,232 A | 5/1983 | Debely |
(Continued)

FOREIGN PATENT DOCUMENTS

| EP | 0 161 533 A2 | 11/1985 |
| GB | 2006520 A | 5/1979 |
| JP | H06-112760 A | 4/1994 |

OTHER PUBLICATIONS

"Piezoelectric Quartz Tuning Forks for Scanning Probe Microscopy." www.nanonis.com, Nanonis GmbH, 2005, software.specs-zurich.com/upload/cms/user/TF2.pdf.
(Continued)

*Primary Examiner* — Jeffrey M Shin
(74) *Attorney, Agent, or Firm* — Knobbe, Martens, Olson & Bear, LLP

(57) ABSTRACT

The disclosed technology generally relates to quartz crystal devices and more particularly to quartz crystal devices configured to vibrate in torsional mode. In one aspect, a quartz crystal device configured for temperature sensing comprises a fork-shaped quartz crystal comprising a pair of elongate tines laterally extending from a base region in a horizontal lengthwise direction of the fork-shaped quartz crystal, wherein each of the tines has formed on one or both of opposing sides thereof a pair of vertically recessed groove structures laterally elongated in the horizontal lengthwise direction, wherein the pair of groove structures are separated in a horizontal widthwise direction by a line structure. The quartz crystal device further comprises a first electrode and a second electrode formed on the one or both of the opposing sides of each of the tines and configured such that, when an electrical bias is applied between the first and second electrodes, the fork-shaped quartz crystal vibrates in a torsional mode in which each of the tines twists about a
(Continued)

respective axis extending in the horizontal lengthwise direction.

25 Claims, 33 Drawing Sheets

Related U.S. Application Data continuation of application No. 16/999,579, filed on Aug. 21, 2020, now Pat. No. 11,070,192, which is a continuation-in-part of application No. 16/548,675, filed on Aug. 22, 2019, now Pat. No. 11,070,191.

(51) Int. Cl.
  *H03H 9/02* (2006.01)
  *H03H 9/05* (2006.01)
  *H03H 9/10* (2006.01)
  *H03H 9/13* (2006.01)

(52) U.S. Cl.
  CPC ........ *H03H 9/0547* (2013.01); *H03H 9/0595* (2013.01); *H03H 9/10* (2013.01); *H03H 9/13* (2013.01)

(56) References Cited

U.S. PATENT DOCUMENTS

| | | | |
|---|---|---|---|
| 4,437,773 A | 3/1984 | Dinger et al. | |
| 4,503,353 A | 3/1985 | Hermann | |
| 4,592,663 A | 6/1986 | EerNisse et al. | |
| 5,274,297 A | 12/1993 | Hermann et al. | |
| 5,334,900 A | 8/1994 | Kawashima | |
| 5,607,236 A | 3/1997 | Takagi et al. | |
| 5,998,233 A | 12/1999 | Sugitani et al. | |
| 6,587,009 B2 | 7/2003 | Kitamura et al. | |
| 6,791,243 B2 | 9/2004 | Kawashima | |
| 6,894,428 B2 | 5/2005 | Tanaya et al. | |
| 6,898,832 B2 | 5/2005 | Kawashima | |
| 6,903,618 B2 | 6/2005 | Kawashima | |
| 6,911,765 B2 | 6/2005 | Kawashima | |
| 6,915,548 B2 | 7/2005 | Kawashima | |
| 6,927,530 B2 | 8/2005 | Tanaya et al. | |
| 6,949,870 B2 | 9/2005 | Ono et al. | |
| 7,043,986 B2 | 5/2006 | Kikuchi et al. | |
| 7,412,764 B2 | 8/2008 | Kawashima | |
| 8,446,079 B2 | 5/2013 | Fang et al. | |
| 11,070,192 B2 | 7/2021 | Fang | |
| 11,658,637 B2 * | 5/2023 | Fang | H03H 9/13 310/370 |
| 2010/0301958 A1 | 12/2010 | Kawashima | |
| 2011/0227452 A1 | 9/2011 | Yamada | |
| 2018/0069521 A1 | 3/2018 | Sai | |
| 2019/0068163 A1 | 2/2019 | Kawashima | |

OTHER PUBLICATIONS

Bruech, Mario. (2009) "Introduction of Tuning Fork Quartz Crystals", Nakagawa Electronics Limited, pp. 1-16.

Dinger et al., "The Torsional Tuning Fork as a Temperature Sensor", 36$^{th}$ Annual Frequency Control Symposium—1982, IEEE, Jun. 2, 1982, pp. 265-274.

Extended European Search Report dated Dec. 7, 2020 in counterpart Application No. 20192204.4.

Seiko Epson Corporation, "Sensor Temperature Sensing Crystal, HTS—206", Product No. Q19HT2060xxxx00, https://web.archive.org/web/20190303085845/https://support.epson.biz/td/api/doc_check.php?dl=brief_HTS-206&lang=en as archived Mar. 3, 2019 in 2 pages.

Statek Corporation, "TS Series Miniature Quartz Temperature Sensor 160 KHz to 350 kHz", www.Statek.com.

* cited by examiner

TOP VIEW

SECTION VIEW
H-H

SECTION VIEW
I-I

TORSIONAL MODE QUARTZ CRYSTAL DEVICE

INCORPORATION BY REFERENCE TO ANY PRIORITY APPLICATIONS

Any and all applications for which a priority claim is identified in the Application Data Sheet as filed with the present application are hereby incorporated by reference under 37 CFR 1.57.

This application is a continuation of U.S. patent application Ser. No. 17/305,904, filed Jul. 16, 2021, entitled "TORSIONAL MODE QUARTZ CRYSTAL DEVICE," now U.S. Pat. No. 11,658,637, which is a continuation of U.S. patent application Ser. No. 16/999,579, filed Aug. 21, 2020, now U.S. Pat. No. 11,070,192, entitled "TORSIONAL MODE QUARTZ CRYSTAL DEVICE," which is a continuation-in-part of U.S. patent application Ser. No. 16/548,675, filed Aug. 22, 2019, now U.S. Pat. No. 11,070,191, entitled "TORSIONAL MODE QUARTZ CRYSTAL DEVICE." The content of each of these applications is incorporated herein by reference in its entirety.

BACKGROUND

Field

The disclosed technology generally relates to quartz crystal devices and more particularly to quartz crystal devices configured to vibrate in torsional mode.

Description of the Related Art

A crystal oscillator is an electronic oscillator circuit that uses the mechanical resonance of a vibrating crystal of piezoelectric material to create an electrical signal with a precise frequency. This frequency can provide a stable reference signal, e.g., a clock signal, for digital integrated circuits, and to stabilize frequencies for radio transmitters and receivers. One type of piezoelectric resonator used is quartz crystal, and oscillator circuits using the quartz crystal are referred to as quartz crystal oscillators.

A quartz crystal oscillator vibrates at a stable frequency by being distorted by an electric field when voltage is applied to an electrode near or on the crystal. This property is known as electrostriction or inverse piezoelectricity. When the field is removed, the quartz, which oscillates in a precise frequency, generates an electric field as it returns to its previous shape, which in turn can generate a voltage. This characteristic of a quartz crystal can be modeled as an RLC circuit. Advantages of quartz crystal oscillators include frequency accuracy, stability, and low power consumption. Because of these advantages, quartz crystal oscillators are used in many consumer devices such as wristwatches, clocks, radios, computers and cellphones, to name a few. Quartz crystals are also found inside test and measurement equipment, such as counters, signal generators, and oscilloscopes. However, high reliability is needed to fully benefit from the advantages of the quartz crystal oscillators.

SUMMARY

In one aspect, a quartz crystal device configured for temperature sensing comprises a fork-shaped quartz crystal comprising a pair of elongate tines laterally extending from a base region in a horizontal lengthwise direction of the fork-shaped quartz crystal. Each of the tines has formed on one or both of opposing sides thereof a vertically protruding line structure laterally elongated in the horizontal lengthwise direction. The quartz crystal device further comprises a first electrode and a second electrode formed on the one or both of the opposing sides of each of the tines and configured such that, when a bias is applied between the first and second electrodes, the fork-shaped quartz crystal vibrates in a torsional mode in which each of the tines twists about a respective axis extending in the horizontal lengthwise direction.

In a second aspect, a quartz crystal device configured for temperature sensing comprises a fork-shaped quartz crystal comprising a pair of elongate tines laterally extending from a base region in a horizontal lengthwise direction of the fork-shaped quartz crystal. The quartz crystal device further comprises a first electrode and a second electrode formed on the one or both of the opposing sides of each of the tines. Each of the first and second electrodes have surfaces facing each other in a widthwise direction of the fork-shaped quartz crystal and configured such that, when a bias is applied between the first and second electrodes, the fork-shaped quartz crystal vibrates in a torsional mode in which each of the tines twists about a respective axis extending in the horizontal lengthwise direction.

In a third aspect, a quartz crystal oscillator device configured for temperature sensing comprises a quartz crystal device bonded to a package substrate. The quartz crystal device comprises a fork-shaped quartz crystal device comprising a pair of elongate tines laterally extending from a base region in a horizontal lengthwise direction of the fork-shaped quartz crystal, wherein each of the tines has formed on one or both of opposing sides thereof a vertically protruding line structure laterally elongated in the horizontal lengthwise direction and electrodes configured such that the fork-shaped quartz crystal vibrates in a torsional mode in which each of the tines twists about an axis extending in the horizontal lengthwise direction. The quartz crystal oscillator device further comprises an integrated circuit (IC) die electrically connected to the quartz crystal device and bonded to the package substrate.

In a fourth aspect, a quartz crystal device configured for temperature sensing comprises a fork-shaped quartz crystal comprising a pair of elongate tines laterally extending from a base region in a horizontal lengthwise direction of the fork-shaped quartz crystal, wherein each of the tines has formed on one or both of opposing sides thereof a pair of vertically recessed groove structures laterally elongated in the horizontal lengthwise direction, wherein the pair of groove structures are separated in a horizontal widthwise direction by a line structure. The quartz crystal device further comprises a first electrode and a second electrode formed on the one or both of the opposing sides of each of the tines and configured such that, when an electrical bias is applied between the first and second electrodes, the fork-shaped quartz crystal vibrates in a torsional mode in which each of the tines twists about a respective axis extending in the horizontal lengthwise direction.

In a fifth aspect, a quartz crystal device configured for temperature sensing comprises a fork-shaped quartz crystal comprising a pair of elongate tines laterally extending from a base region in a horizontal lengthwise direction of the fork-shaped quartz crystal, wherein each of the tines has formed on one or both of opposing sides thereof a pair of vertically recessed groove structures laterally elongated in the horizontal lengthwise direction, wherein the groove structures are separated in a horizontal widthwise direction by a line structure. The quartz crystal device further comprises a first electrode and a second electrode formed on the one or both of the opposing sides of each of the tines, wherein each of the first and second electrodes have surfaces facing each other in a widthwise direction of the fork-shaped quartz crystal and configured such that, when an electrical bias is applied between the first and second electrodes, the fork-shaped quartz crystal vibrates in a torsional mode in which each of the tines twists about a respective axis extending in the horizontal lengthwise direction.

In a sixth aspect, a quartz crystal oscillator device configured for temperature sensing comprises a package substrate and a quartz crystal device bonded to the package substrate, wherein the quartz crystal device comprises a fork-shaped quartz crystal device comprising a pair of elongate tines laterally extending from a base region in a horizontal lengthwise direction of the fork-shaped quartz crystal. Each of the tines has formed on one or both of opposing sides thereof a pair of vertically recessed groove structures laterally elongated in the horizontal lengthwise direction, wherein the groove structures are separated in a horizontal widthwise direction by a line structure, and electrodes configured such that the fork-shaped quartz crystal vibrates in a torsional mode in which each of the tines twists about a respective axis extending in the horizontal lengthwise direction. The quartz crystal oscillator device further comprises an integrated circuit (IC) die electrically connected to the quartz crystal device and bonded to the package substrate.

DETAILED DESCRIPTION

The following detailed description is now directed to certain specific embodiments of the disclosure. In this description, reference is made to the drawings wherein like parts are designated with like numerals throughout the description and the drawings.

In the following, various embodiments of quartz crystal devices and quartz crystal oscillator devices are disclosed. In particular, the disclosed quartz crystal devices comprise a fork-shaped or tuning fork-shaped quartz crystal that is configured to vibrate in a torsional mode and/or operate as a temperature sensor. Advantageously, the quartz crystal devices are designed such that its vibrating frequency is both extremely sensitive to temperature and highly linear. The high sensitivity offers the ability to detect fine changes in temperature, where the degree of sensitivity can be tailored depending on various implementations disclosed herein. Further, a frequency-based technique has the advantage of being immune to amplitude noise in the measurement system, which is a feature not present in other types of temperature sensors such as a thermocouple, a thermistor, or resistance temperature detectors (RTDs). Furthermore, the disclosed fork-shaped quartz crystal devices can enable remote temperature sensing by using an antenna to pick up the frequency of the electromagnetic waves emitted by the fork-shaped quartz crystal device.

In various examples disclosed herein, a quartz crystal device configured for temperature sensing comprises a fork-shaped quartz crystal comprising a base region and a pair of elongate tines laterally extending from the base region in a lengthwise direction. The quartz crystal additionally comprises a first electrode and a second electrode formed on the one or both of opposing sides of each of the tines and configured such that, when a bias is applied between the first and second electrodes, the fork-shaped quartz crystal vibrates in a torsional mode in which each of the tines twists about an axis extending in the lengthwise direction.

Figure 1A:
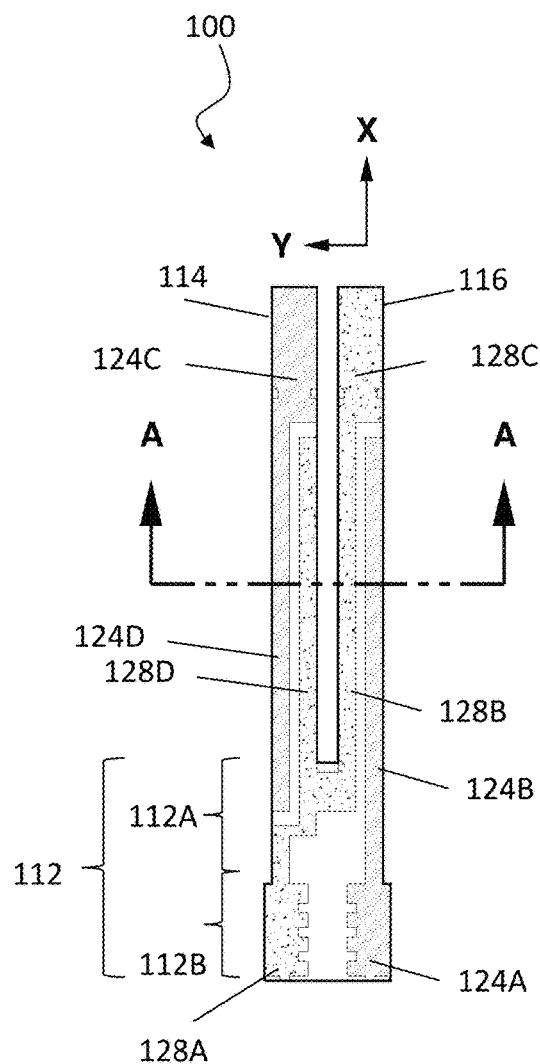
FIG. 1A schematically illustrates a plan view of a main surface of a fork-shaped torsional mode quartz crystal device.
Figure 1B:
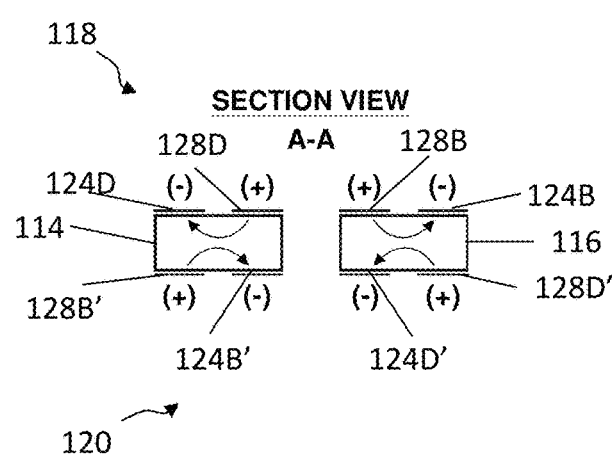
FIG. 1B schematically illustrates a cross-sectional view of the fork-shaped torsional mode quartz crystal device illustrated in FIG. 1A, including a schematic electric field path.

FIG. 1A schematically illustrates a plan view of an example fork-shaped torsional mode quartz crystal device 100. FIG. 1B schematically a cross-sectional view of the fork-shaped torsional mode quartz crystal device illustrated in FIG. 1A. The quartz crystal device 100 comprises a base 112, a first or left tine 114 projecting from the base 112 and extending generally along a lengthwise direction, e.g., X-axis. The fork-shaped quartz crystal device 100 additionally comprises a second or right tine 116 or prong projecting from the base 112 and extending generally along the same lengthwise direction. The tines can also be referred as arms or prongs. The first tine 114 and second tine 116 can be generally parallel to one another. In various quartz crystal devices disclosed herein, electrodes are formed on various surfaces thereof such that the tines are configured to vibrate at least in a torsional mode, as described below.

The base 112 supporting the first and second tines 114, 116 can include multiple portions. For example, in the illustrated example, the base 112 comprises a first or upper base portion 112A from which the first and second tines 114, 116 immediately extend and a second or lower base portion 112B forming a terminal portion of the quartz crystal device 100. The first and second base portions 112A, 112B can be defined by a first and second width, respectively. The second base portion 112B can be configured such that the fork-shaped torsional mode quartz crystal device 100 can be mounted to a ceramic package or other support structures. In the illustrated example, the second base portion 112B configured for mounting on a ceramic package is wider than the first base portion 112A connected to the first and second tines 114, 116. Such configuration can reduce the amount of vibration leakage from the first and second tines 114, 116 to the base 112, such that the fork-shaped torsional mode quartz crystal device 100 vibrates with increased efficiency. However, embodiments are not so limited and the first portion 112A can have the same or larger width than that of the second base portion 112B.

The fork-shaped torsional mode quartz crystal device 100 has various surfaces having formed thereon electrode patterns that are collectively adapted for vibration of the quartz crystal device 100 in a torsional mode. Referring to FIG. 1A, quartz crystal device 100 shows on a first or front side 118 (FIG. 1B) a first main surface, e.g., a front surface. The electrode patterns on the first main surface include a first electrode pattern 124 of a first polarity, e.g., one of a negative or positive electrode pattern, and a second electrode pattern 128 of a second polarity, e.g., the other of the negative or positive electrode pattern. While not illustrated, the fork-shaped torsional mode quartz crystal device 100 also has on a second or rear side 120 opposite the first or front side 118 a second main surface, e.g., a back surface. The second main surface back surface also includes various portions of the first electrode pattern 124' and the second electrode pattern 128' formed thereon. As described herein and throughout the specification, it will be understood that, while electrode patterns labeled with different reference numerals, e.g., first electrode patterns 124 and 124', may be formed on different surfaces, they may be electrically connected to each other and therefore be at the same potential.

As described herein and throughout the specification, relative positions of various features formed on a side of a quartz crystal device, e.g., the first electrode patterns 124, 124' and second electrode patterns 128, 128', may be described as viewed from the respective sides. As such, it will be appreciated that positions that are described as having opposite lateral positions, when disposed on opposing sides, may be referring to the same physical position. For example, in FIG. 1A, when viewed from the first side 118, the first and second tines 114, 116 are positioned on left and right relative positions, respectively, while when viewed from the second side 120 (FIG. 1B), the first and second tines 114, 116 would be positioned on right and left relative positions, respectively.

Referring to the plan view illustrated in FIG. 1A, viewed from the first side 118, the first (e.g., negative) electrode pattern 124 formed on the top surface includes first to fourth first electrode portions 124A-124D, and the second (e.g., positive) electrode pattern 128 formed on the top surface includes first to fourth second electrode portions 128A-128D. The first electrode pattern 124 includes a first portion 124A covering a first (right) side of the base 112 and extends upward therefrom in the x-direction in the form of the second thin strip portion 124B along a right or outer edge portion of the second tine 116, and terminates adjacent to the third portion 128C of the second electrode pattern 128 formed on the terminal end portion of the second tine 116. The first electrode pattern 124 additionally includes the third portion 124C formed on the terminal end portion of the first tine 114, extends downward therefrom in the x-direction in the form of the fourth thin strip portion 124D along a left or outer edge portion of the first tine 114, and terminates adjacent to the first portion 128A of the second electrode pattern 128 formed on the second (left) side of the base 112.

Still referring to the plan view illustrated in FIG. 1A, the second electrode pattern 128 formed on the top surface includes the first portion 128A covering a second (left side) of the base 112 and extends upward therefrom in the x-direction and forks or splits into the second thin strip portion 128B formed and extending upward along a left or inner edge portion of the second tine 116, and a fourth thin strip portion 128D formed along and extending upward along a right or inner edge portion of the first tine 114. The fourth thin strip portion 128D terminates adjacent to the third portion 124C of the first electrode pattern 124 formed on the terminal end of the first tine 114. The second thin strip portion 128B extends to connect to the third portion 128C of the second electrode pattern 128 formed on the terminal end portion of the second tine 116.

While not illustrated, the combination of the first and second electrode patterns 124', 128' formed on the rear side 120 may generally be shaped similarly as the combined pattern of the first and second electrode patterns 124, 128 formed on the front side 118 as described above, except that their polarities are interchanged. The first (e.g., negative) electrode pattern 124' formed on the bottom surface includes first to fourth portions 124A'-124D', and the second (e.g., positive) electrode pattern 128' formed on the bottom surface includes first to fourth portions 128A'-128D'. The second electrode pattern 128' includes a first portion 128A' covering a first (right side) of the base 112 and extends upward therefrom in the x-direction in the form of the second thin strip portion 128B' along a right or outer edge portion of the first tine 114, and terminates adjacent to the third portion 124C' of the first electrode pattern 124' formed on the terminal end portion of the first tine 114. In addition, the second electrode pattern 128' includes the third portion 128C' formed on the terminal end portion of the second tine 116, extends downward therefrom in the x-direction in the form of the fourth thin strip portion 128D' along a left or outer edge portion of the second tine 116, and terminates adjacent to the first portion 124A' of the first electrode pattern 124' formed on the second (left) side of the base 112 when viewed from the rear side 120.

Additionally, the first electrode pattern 124' formed on the bottom surface (not shown) includes the first portion 124A' covering a second (left side) of the base 112 and extends upward therefrom in the x-direction and forks or splits into the second thin strip portion 124B' formed and extending upward along a left or inner edge portion of the first tine 114, and a fourth thin strip portion 124D' formed along and extending upward along a right or inner edge portion of the second tine 116. The fourth thin strip portion 124D' terminates adjacent to the third portion 128C' of the second electrode pattern 128' formed on the terminal end of the second tine 116. The second thin strip portion 124B' extends to connect to the third portion 124C' of the first electrode pattern 124' formed on the terminal end portion of the first tine 114.

As described above, various portions of the first electrode pattern 124 on the first side 118 and the first electrode pattern 124' on the second side 120 are electrically connected to each other. Similarly, various portions of the second electrode pattern 128 on the first side 118 and the second electrode pattern 128' on the second side 120 are electrically connected to each other. The resulting relative positions of different portions of the first electrode patterns 124, 124' and the second electrode patterns 128, 128' in a cross-sectional view are illustrated in FIG. 1B. FIG. 1B schematically illustrates a cross-sectional view of the fork-shaped torsional mode quartz crystal device 100 through the section A-A illustrated in FIG. 1A. The cross-sectional view of the first tine 114 shows a first main surface on the first side 118 having the fourth strip portion 124D of the first electrode pattern 124 formed on the outer edge portion thereof, and the fourth strip portion 128D of the second electrode pattern 128 formed on the inner edge portion thereof. On the other hand, a second main surface on the second side 120 has the second strip portion 124B' of the first electrode pattern 124' formed on the inner edge portion of the first tine 114, and the second strip portion 128B' of the second electrode pattern 128' formed on the outer edge portion of the first tine 114. The section A-A additionally illustrates a cross-sectional view of the second tine 116 showing a first main surface of the first side 118 having the second strip portion 124B of the first electrode pattern 124 formed on the outer edge portion thereof, and the second strip portion 128D of the second electrode pattern 128 formed on the inner edge portion thereof. On the other hand, the second main surface of the second side 120 has the fourth strip portion 124D' of the first electrode pattern 124' formed on the inner edge portion of the second tine 116, and the fourth strip portion 128D' of the second electrode pattern 128' formed on the outer edge portion of the second tine 116.

In operation, electrical pulses having a first (e.g., one of negative or positive) polarity may be applied to the first electrode patterns 124, 124' (including the second and fourth strip portions 124B, 124D on the front main surfaces of the second and first tines 116, 114, respectively, and the second and fourth strip portions 124B', 124D' on the back main surfaces of the first and second tines 116, 114, respectively, as illustrated in FIG. 1B). On the other hand, electrical pulses having a second (e.g., the other of negative or positive) polarity may be applied to the second electrode patterns 128, 128' (including the second and fourth strip portions 128B, 128D on the front main surfaces of the second and first tines 116, 114, respectively, and to the second and fourth strip portions 128B', 128D' on the back main surfaces of the first and second tines 114, 116, respectively, as illustrated in FIG. 1B). It will be appreciated that, as disclosed herein and throughout the specification, positive and negative polarities may describe relative polarities, such that voltages that have the same sign but different magnitudes may be described as having positive and negative polarities. While embodiments are not so limited, pulses having the first and second polarities may be applied to the quartz crystal device 100 simultaneously.

Still referring to FIG. 1B. when the first and second electrode patterns 124/124', 128/128' are biased as described herein, the resulting electric field generally follows, e.g., on average, the curvilinear paths indicated by the arrows, from the second strip portion 128B on the front surface of the second tine 116, the fourth strip portion 128D on the front surface of the first tine 114, the second strip portion 128B' on the back surface of the first tine 114 and the fourth strip portion 128D' on the back surface of the second tine 116, to the second strip portion 124B on the front surface of the second tine 116, the fourth strip portion 124D on the front surface of the first tine 114, the second strip portion 124B' on the back surface of the first tine 114 and the fourth strip portion 124D' on the back surface of the second tine 116, respectively.

Figure 2A:
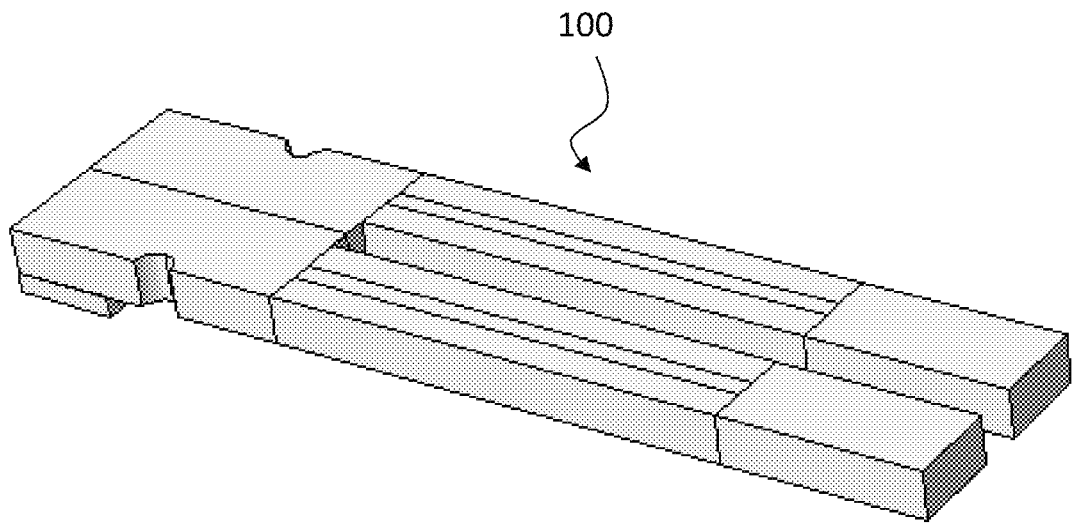
FIG. 2A schematically illustrates a perspective view of the fork-shaped torsional mode quartz crystal device illustrated in FIGS. 1A and 1B.
Figure 2B:
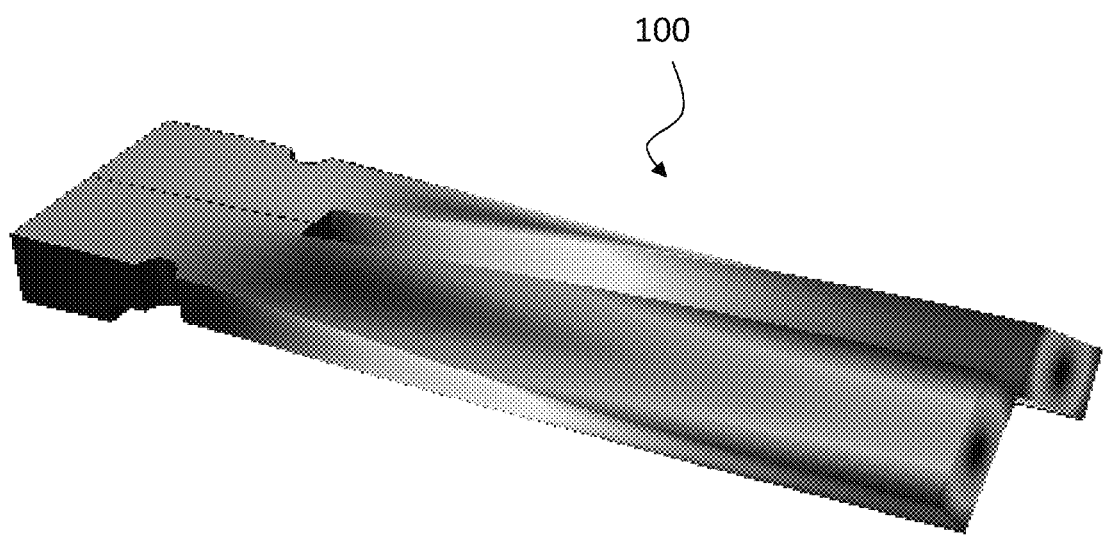
FIG. 2B schematically illustrates a perspective view of the fork-shaped torsional mode quartz crystal device illustrated in FIG. 2A, in which the tines are twisted and displaced in operation under a bias.

FIGS. 2A and 2B schematically illustrate perspective views of the fork-shaped torsional mode quartz crystal device 100 described above with respect to FIGS. 1A and 1B. FIG. 2A illustrates the quartz crystal device 100 in a rest state, while FIG. 2B illustrates a fork-shaped torsional mode quartz crystal device 100 under a bias. When the first and second electrode patterns 124, 128 are subjected to negative and positive relative voltages, respectively, as described above, such that the electric field lines are directed from various portions of the second electrode patterns 128, 128' to corresponding portions of the first electrode patterns 124, 124' in a manner as described above, the first and second tines 114, 116 twist about the X-axis (FIG. 1A) extending in the lengthwise direction, as illustrated in FIG. 2B. When the first and second electrode patterns 124, 128 are subjected to pulsed negative and positive voltages, the quartz crystal device 100 can toggle between the rest state illustrated in FIG. 2A and the deformed state illustrated in FIG. 2B.

Figure 3:
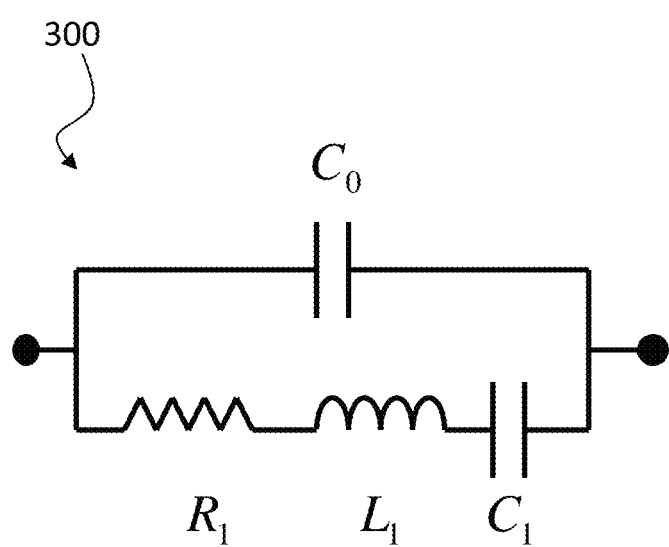
FIG. 3 illustrates a circuit representation of a quartz crystal device.

FIG. 3 illustrates an equivalent circuit representation of quartz crystal oscillators. The equivalent circuit representation illustrated in FIG. 3 is sometimes referred to as Butterworth Van Dyke (BVD) equivalent circuit. Without being bound to any theory, the electrical behavior of a piezoelectric bulk oscillator, such as a quartz crystal device near the vicinity of its frequencies of resonance can be represented by the equivalent circuit 300. The equivalent circuit 300 includes two parallel paths between terminal nodes. The first path includes a static capacitance ($C_0$) which can represent an electrode capacitance of the quartz crystal device. The second path includes a motional inductor ($L_1$), a motional capacitor ($C_1$) and a motional resistor ($R_1$), and may sometimes be referred to as the motional arm. The $L_1$, $C_1$ and $R_1$ and can be associated with the inertia, stiffness and internal losses of the mechanical vibrating system, respectively.

A quality factor (Q) can be used to benchmark quartz crystal resonance. The Q factor can represent a ratio of energy stored versus energy dissipated in a vibration cycle. Higher Q factors are generally associated with higher frequency stability and accuracy of a quartz crystal device. The magnitude of the Q factor can be associated with the qualitative behavior of a quartz crystal device. Without loss of generality, for example, a system with a very low Q factor can be an overdamped system. Below a certain value of the Q factor, an overdamped system may not oscillate at all.

Without being bound to any theory, the Q factor of a quartz crystal device can sometimes be expressed by the following expression:

$$Q = \frac{1}{2\pi f_s R_1 C_1} \quad [1]$$

In equation [1], $f_s$ is the series resonance frequency, and the product of $R_1$ and $C_1$ is sometimes referred to as a motional time constant τ, which can vary, among other things, with the angle of cut and the mode of vibration. According to Eq. [1], a larger $R_1$ results in a lower Q. Thus, a relatively large value of $C_1$ may be desired for the operating resonance of a piezoelectric device.

Without being bound to any theory, a quartz crystal device such as the quartz crystal device 100 described above with respect to FIGS. 1A-1B and 2A-2B vibrating in a torsional vibrational mode can have a quartz crystal frequency f that can be approximated by the following equation:

$$f \approx k\frac{t}{lw} \quad [2]$$

In equation [2], k is a constant for a given geometry and cut angle of the quartz crystal, l or L represents the tine length, w or W represents the tine width and t represents the tine thickness.

Various applications increasingly demand quartz crystal devices to be miniaturized. To fit a quartz crystal device into a miniature package, the size of the quartz crystal device may be correspondingly scaled. As indicated by Eq. [2] above, for a constant width (W), to keep the frequency a constant, the tine length (L) and crystal thickness (t) may be scaled simultaneously.

Figure 4:
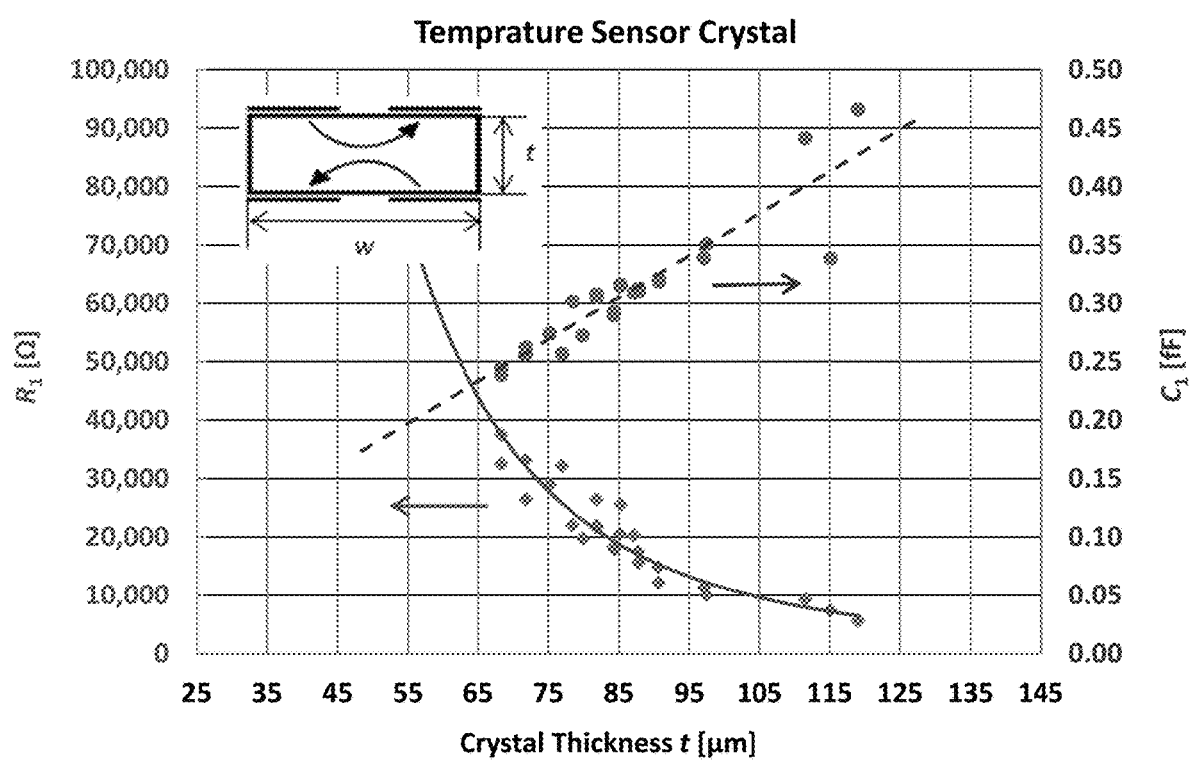
FIG. 4 is a graph illustrating motional resistance and motional capacitance as a function of a crystal thickness for the fork-shaped torsional mode quartz crystal device illustrated in FIGS. 1A and 1B.

FIG. 4 illustrates a graph plotting experimental crystal parameters ($R_1$ and $C_1$) obtained as function of crystal thickness (t), from a quartz crystal device such as the fork-shaped torsional mode quartz crystal device 100 described above with respect to FIGS. 1A-1B and 2A-2B. The graph of FIG. 4 was obtained from a quartz crystal device vibrating in a torsional mode crystal packaged in 5.0 mm×1.8 mm ceramic package. As illustrated, the motional capacitance ($C_1$) increases substantially linearly with increasing crystal thickness (t). On the other hand, the motional resistance ($R_1$) decreases super-linearly with increasing crystal thickness (t). For example, as illustrated, $R_1$ can increase from about 30 kΩ to about 100 kΩ when the thickness is reduced from about 75 μm to about 50 μm. When the $R_1$ is too high, the quartz crystal device can display unstable frequency and can even stop oscillation. According to various embodiments described herein, quartz crystal devices having structures with reduced $R_1$ are adapted for miniaturization of packaged quartz crystal devices.

To address these and other needs, according to various embodiments, a fork-shaped torsional mode quartz crystal device configured for temperature sensing comprises a fork-shaped quartz crystal comprising a base and a pair of elongate tines laterally extending from the base in a lengthwise direction, where each of the tines has formed on one or both of opposing sides thereof a mesa structure. The mesa structure includes a line structure laterally elongated in the lengthwise direction. The line structure vertically protrudes above adjacent recessed surfaces and has sidewalls abutting the recessed surfaces. The quartz crystal additionally comprises a first electrode and a second electrode formed on the one or both of the opposing sides of each of the tines and configured such that the fork-shaped quartz crystal vibrates in a torsional mode. In particular, each of the first and second electrodes have surfaces facing each other in a widthwise direction of the fork-shaped quartz crystal and configured such that, when a bias is applied between the first and second electrodes, the fork-shaped quartz crystal vibrates in a torsional mode in which each of the tines twists about an axis extending in the lengthwise direction.

Torsional Mode Quartz Crystal Device Having a Mesa Structure

Figures 5A, 5B:
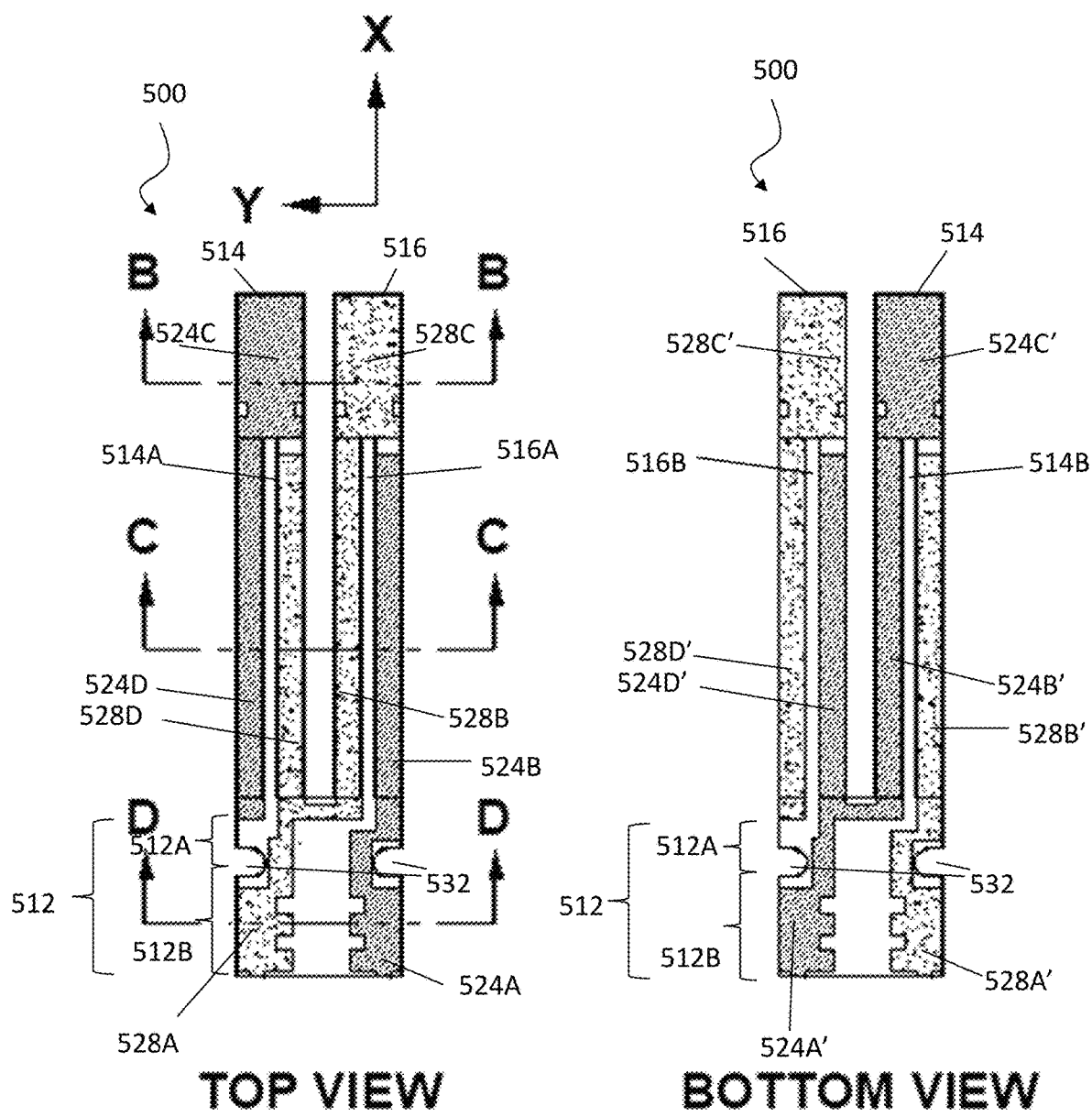
FIG. 5A schematically illustrates a plan view of a first main (top) surface of a fork-shaped torsional mode quartz crystal device comprising a mesa structure, according to embodiments.
FIG. 5B schematically illustrates a plan view of a second main (bottom) surface of the fork-shaped torsional mode quartz crystal device illustrated in FIG. 5A.
Figure 5C:
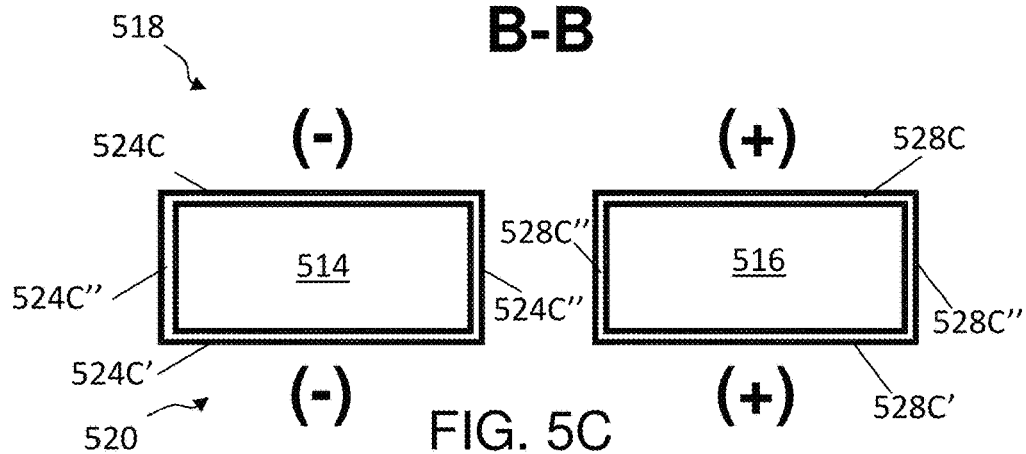
FIG. 5C schematically illustrates a cross-sectional view of the fork-shaped torsional mode quartz crystal device illustrated in FIGS. 5A and 5B at tip regions of the tines.
Figure 5D:
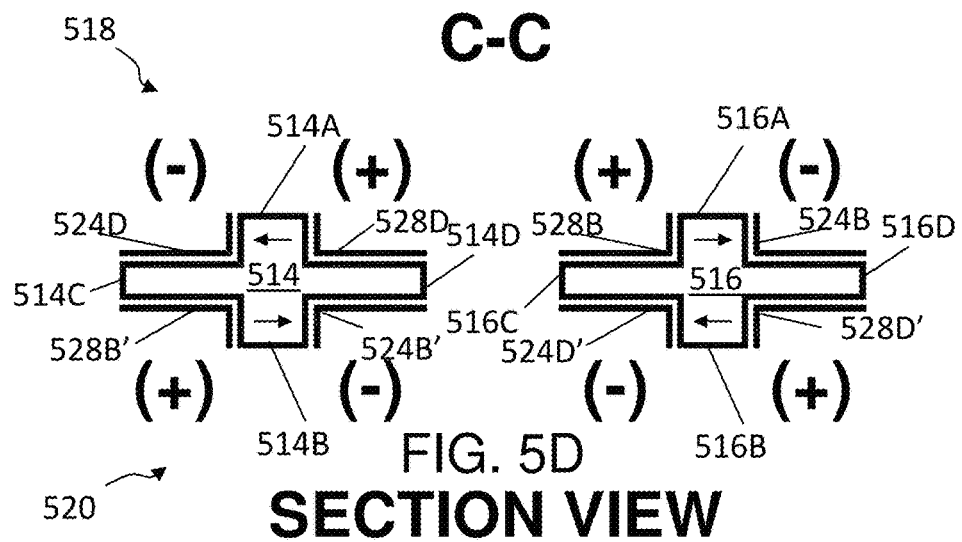
FIG. 5D schematically illustrates a cross-sectional view of the fork-shaped torsional mode quartz crystal device illustrated in FIGS. 5A and 5B at midsections of the tines.
Figure 5E:
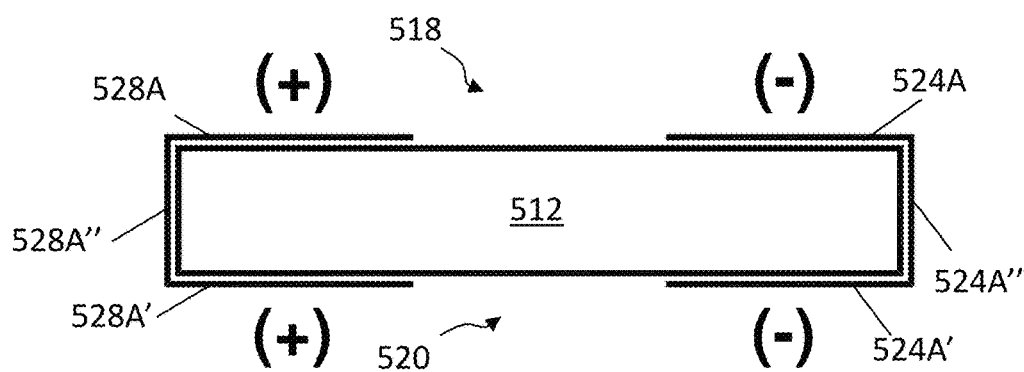
FIG. 5E schematically illustrates a cross-sectional view of the fork-shaped torsional mode quartz crystal device illustrated in FIGS. 5A and 5B at a base region.

FIGS. 5A-5E schematically illustrate various views of a fork-shaped torsional mode quartz crystal device 500 comprising a mesa structure, according to embodiments. The quartz crystal device 500 has on a first or front side 518 (FIGS. 5A, 5C-E) having a first or front main surface, and a second or rear side 520 (FIGS. 5B, 5C-5E) opposite the first or front side having a second or rear main surface. FIGS. 5A and 5B illustrate a first or front side and a second side or bottom side of the fork-shaped quartz crystal device 500, respectively. FIGS. 5C, 5D and 5E illustrate cross-sectional views of the quartz crystal device 500 taken at cross-sections B-B, C-C, and D-D, respectively, as illustrated in FIG. 5A. Some features of the fork-shaped quartz crystal device 500 comprising a mesa structure are similar to corresponding features of the fork-shaped quartz crystal device 100 without a mesa structure described above with respect to FIGS. 1A-1B, and a detailed description of some of the similarities may not be repeated herein for brevity.

In a similar manner as described above with respect to FIGS. 1A and 1B, the fork-shaped quartz crystal device 500 comprises a fork-shaped quartz crystal comprising a base 512, a first tine 514 projecting from the base 512 and extending generally along a lengthwise direction, e.g., X-axis, and a second tine 516 projecting from the base 512 and extending generally along the same lengthwise direction. The tines can also be referred as arms or prongs. The first tine 514 and the second tine 516 can be generally parallel to one another. In the illustrated configuration, either or both of the first and second tines 514, 516 have a substantially uniform width along respective lengths. However, embodiments are not limited and in other configurations, one or both of the first and second tines 514, 516 can have uneven or non-uniform widths along the respective lengths. For example, without limitation, either or both of the first and second tines 514, 516 can be configured such that some portions of the first and/or second tines 514, 516 are wider than some other portions thereof, or such that some portions define a linear, curved, or other suitable shaped tapering width along the respective lengths. In various configurations, the centerlines of the first and second tines 514, 516 can be generally parallel to each another or generally follow parallel paths. While in the illustrated configuration, the quartz crystal device 500 has a pair of tines 514, 516, embodiments are not so limited and in some other configurations, any of the quartz crystal devices disclosed herein can have a fewer or greater number of tines projecting from the base 512. For example, in some configurations, without limitations, any of the quartz crystal devices disclosed herein can have four or more tines projecting from the base, where any number of the tines are configured to vibrate at least in a torsional mode.

Still referring to FIGS. 5A and 5B, the base 512 supporting the first and second tines 514, 516 can include multiple portions or regions. For example, in the illustrated example, the base 512 comprises a first base portion 512A from which the first and second tines 514, 516 directly extend, and a second base portion 512B that forms an end portion of the fork-shaped quartz crystal device 500. In the illustrated embodiment, the first and second base portions 512A, 512B have the same or similar widths. However, embodiments are not so limited, and in some other embodiments, the first and second base portions 512A, 512B can be defined by different widths. The second base portion 512B can be configured such that the quartz crystal device 500 can be mounted to a ceramic package or other support structures.

In the illustrated embodiment, a pair of notches, slots or indentations 532 recessed inward from opposing side surfaces of the quartz crystal device 500. According to embodiments, when present, the notches 532 can reduce the amount of vibration leakage from the first and second tines 514, 516 to the base 512, thereby increasing the efficiency of the fork-shaped quartz crystal device 500. In the illustrated embodiment, the notches 532 are formed at an adjoining region between the first and second base portions 512A, 512B. However, embodiments are not so limited and in other embodiments, the notches 532 can be positioned vertically anywhere between the connected ends of the first and second tines 514, 516 and the terminal edge of the base 512. The notches 532 can have any suitable shape including any polygonal (e.g., rectangular, triangular) or curved (e.g., semicircular, elliptical) shapes.

Referring to FIGS. 5A/5B and 5C, the B-B cross-section illustrates that each of the first and second tines 514, 516 comprises a tip portion that generally forms a rectangular shape, in a similar manner as the quartz crystal device 100 described above with respect to FIGS. 1A and 1B. As illustrated in FIG. 5C, the first and second main surfaces on first and second sides 518, 520, respectively, of the fork-shaped quartz crystal device 500 at the tip portions of the first and second tines 514, 516 can be generally parallel, opposing planar surfaces that are connected by side surfaces thereof.

Referring to FIGS. 5A/5B and 5D, the C-C cross-section illustrates that, unlike the quartz crystal device 100 described above with respect to FIGS. 1A and 1B, each of the first and second tines 514, 516 of the quartz crystal device 500 comprises a mid-section portion in which each of the first and second tines 514, 516 comprises a mesa structure formed on or as part of one or both of opposing main surfaces on the first and second sides 518, 520. In the mid-section, the first tine 514 comprises a first side on which a vertically protruding first line structure 514A is formed as part of a first mesa structure, and a second side opposite the first side on which a vertically protruding second line structure 514B is formed as part of a second mesa structure. The first and second line structures 514A, 514B extend in the lengthwise direction of the first and second tines 514, 516, e.g., the x-direction. On one end, the first and second line structures 514A, 514B terminate adjacent to respective terminal end portions of the first and second tines 514, 516, On the other end, the first and second line structures 514A, 514B terminate adjacent to connected end portions of the first and second tines 514, 516, or to the base 512, The first and second line structures 514A, 514B laterally divide the first and second (left and right) sides of the first tine 514 into first and second recessed portions 514C, 514D separated in a widthwise direction, e.g., the y-direction. In a similar manner, the second tine 516 comprises a first side on which a vertically protruding first line structure 516A is formed and a second side opposite the first side on which a vertically protruding second line structure 516B is formed. The first and second line structures 516A, 516B extend in the lengthwise direction of the first and second tines 514, 516, e.g., the x-direction, and laterally divide the first and second (left and right) sides of the second tine 516 into first and second recessed portions 516C, 516D separated in a widthwise direction, e.g., the y-direction.

In the illustrated embodiment, the top surfaces of the line structures 514A, 514B, 516A, 516B are coplanar with adjacent base 512 (FIG. 5E) and the tip portions of the respective tines (FIG. 5C). However, embodiments are not so limited and in other implementations, the top surfaces of the line structures 514A, 514B, 516A, 516B may be higher or lower relative to the adjacent base 512 and the tip portions of the respective tines.

In the illustrated embodiment, each of the first and second line structures 514A, 516B of the first tine 514 and the first and second line structures 516A, 516B of the second tine 516 forms a mesa structure having sidewalls that are generally perpendicular with respective abutting recessed portions. However, embodiments are not so limited, and in some other embodiments, the one or both sidewalls may form angles greater or less than 90°. For example, the one or both sidewalls may form 40-50°, 50-60°, 60-70°, 70-80°, 80-90° or an angle in a range formed by any of these values. In addition, when the sidewalls are tapered, the line structures 514A, 514B, 516A, 516B may or may not have a top surface. Accordingly, in some embodiments, the line structures have a trapezoidal or triangular cross sectional shapes.

Referring to FIGS. 5A/5B and 5E, the base 512 of the quartz crystal device 500 generally has a rectangular shape in a cross sectional view. As illustrated in FIG. 5E, the main surfaces of the base 512 on first and second sides 518, 520 of the quartz crystal device 500 can be generally parallel and opposing planar surfaces that are connected by side surfaces of the base 512.

Various portions of the quartz crystal device 500 have surfaces having formed thereon electrode patterns that are collectively configured to vibrate the tines of the fork-shaped quartz crystal device 500 in a torsional mode. The electrode patterns include a first electrode pattern 524 of a first polarity, e.g., one of a negative or positive electrode pattern, and a second electrode pattern 528 of a second polarity, e.g., the other of the negative or positive electrode pattern.

Referring to the first main (top) surface of the fork-shaped quartz crystal device 500 illustrated in FIG. 5A, the first (e.g., negative) electrode pattern 524 formed on the top surface includes first to fourth portions 524A-524D, and the second (e.g., positive) electrode pattern 528 formed on the top surface includes first to fourth portions 528A-528D. The first electrode pattern 524 includes a first portion 524A covering a first (right) side of the base 512 and extends upward therefrom in the x-direction in the form of the second thin strip portion 524B. The second thin strip portion 524B extends along a right or outer edge portion of the second tine 516, and terminates adjacent to the third portion 528C of the second electrode pattern 528 formed on the terminal end portion of the second tine 516. The first electrode pattern 524 additionally includes the third portion 524C formed on the terminal end portion of the first tine 514, extends downward therefrom in the x-direction in the form of the fourth thin strip portion 524D along a left or outer edge portion of the first tine 514, and terminates adjacent to the first portion 528A of the second electrode pattern 528 formed on the second (left) side of the base 512.

Still referring to the plan view illustrated in FIG. 5A, the second electrode pattern 528 formed on the top surface includes the first portion 528A covering a second (left side) of the base 512 and extending upward therefrom in the x-direction and forking or splitting into the second thin strip portion 528B formed and extending upward along a left or inner edge portion of the second tine 516, and a fourth thin strip portion 528D formed along and extending upward along a right or inner edge portion of the first tine 514. The fourth thin strip portion 528D terminates adjacent to the third portion 524C of the first electrode pattern 524 formed on the terminal end of the first tine 514. The second thin strip portion 528B extends to connect to the third portion 528C of the second electrode pattern 528 formed on the terminal end portion of the second tine 516.

Referring to the second main (bottom) surface of the quartz crystal device 500 illustrated in FIG. 5B, the quartz crystal device 500 has formed thereon various portions of a first electrode pattern 524' of the first polarity and the second electrode pattern 528' of the second polarity formed thereon. The combined pattern of the first and second electrode patterns 524', 528' formed on the bottom side 520 may generally be shaped similarly as the combined pattern of the first and second electrode patterns 524, 528 formed on the front side 518 as described above, except that their polarities are interchanged. The first (e.g., negative) electrode pattern 524' formed on the bottom surface includes first to fourth portions 524A'-524D', and the second (e.g., positive) electrode pattern 528' formed on the bottom surface includes first to fourth portions 528A'-528D'. The second electrode pattern 528' includes the first portion 528A' covering a first (right side) of the base 512 portion and extends upward therefrom in the x-direction in the form of the second thin strip portion 528B' along a right or outer edge portion of the first tine 514, and terminates adjacent to the third portion 524C' of the first electrode pattern 524' formed on the terminal end portion of the first tine 514. The second electrode pattern 528' additionally includes the third portion 528C' formed on the terminal end portion of the second tine 516, extends downward therefrom in the x-direction in the form of the fourth thin strip portion 528D' along a left or outer edge portion of the second tine 516, and terminates adjacent to the first portion 524A' of the first electrode pattern 524' formed on the second (left) side of the base 512 portion when viewing the rear side 520.

Additionally referring to the rear side 520, the first electrode pattern 524' formed on the bottom surface includes the first portion 524A' covering a second (left side) of the base 512 portion and extends upward therefrom in the x-direction and forks or splits into the second thin strip portion 524B' formed and extending upward along a left or inner edge portion of the first tine 514, and a fourth thin strip portion 524D' formed along and extending upward along a right or inner edge portion of the second tine 516. The fourth thin strip portion 524D' terminates adjacent to the third portion 528C' of the second electrode pattern 528' formed on the terminal end of the second tine 516. The second thin strip portion 524B' extends to connect to the third portion 524C' of the first electrode pattern 524' formed on the terminal end portion of the first tine 514.

As described above, the fork-shaped torsional mode quartz crystal device 500 includes various portions of the first electrode pattern 524 on the first side 518 and the first electrode pattern 524' on the second side 520 that are connected to each other. Similarly, various portions of the second electrode pattern 528 on the first side 518 and the second electrode pattern 528' on the second side 520 are connected to each other. The resulting relative positions of different portions of the first electrode patterns 524, 524' and the second electrode patterns 528, 528' are further described below with respect to FIGS. 5C-5E.

FIG. 5C illustrates a cross-sectional view of the fork-shaped quartz crystal device 500 including a mesa structure, though the section B-B or through terminal end portions of the first and second tines 514, 516. As described above with respect to FIGS. 5A and 5B, the terminal portion of the first tine 514 has formed on the first and second sides 518, 520 the third portion 524C of the first electrode pattern 524 and the third portion 524C' of the first electrode pattern 524', respectively. The third portions 524C and 524C' are connected by side portions 524C" formed on left and right side surfaces of the first tine 514. In addition, the terminal portion of the second tine 516 has formed on the first and second sides 518, 520 the third portion 528C of the second electrode pattern 528 and the third portion 528C' of the second electrode pattern 528', respectively. The third portions 528C and 528C' are connected by side portions 528C" formed on left and right side surfaces of the second tine 514. Thus configured, the terminal end of portion the first tine 514 is wrapped or surrounded by the first electrode pattern having the first polarity on top, bottom and side surfaces thereof, and the terminal end portion of the second tine 516 is surrounded by the second electrode pattern having the second polarity on top bottom and side surfaces thereof.

FIG. 5D illustrates a cross-sectional view of the fork-shaped quartz crystal device 500 comprising a mesa structure through the section C-C (FIG. 5A) at midsections the first and second tines 514, 516. As described above, each of the first and second tines 514, 516 comprises a mesa structure formed on one or both of the first and second sides 518, 520. Accordingly, the quartz crystal device 500 comprises electrode patterns that are formed synergistically with respect to the mesa structures, including the first and second line structures 514A, 514B formed on the first and second sides 518, 520 of the first tine 514 and the first and second line structures 516A, 516B formed on the first and second sides 518, 520 of the second tine 516.

Referring to FIG. 5D, the first tine 514 has a first main surface on the first side 518 having formed thereon the fourth strip portion 524D of the first electrode pattern 524 on the outer edge portion thereof, and the fourth strip portion 528D of the second electrode pattern 528 on the inner edge portion thereof. The first tine 514 additionally has a second main surface on the second side 520 having formed thereon the second strip portion 524B' of the first electrode pattern 524' on the inner edge portion thereof, and the second strip portion 528B' of the second electrode pattern 528' formed on the outer edge portion thereof. Thus configured, the first and second main surfaces of the first tine 514 comprises a mesa structure including the first and second line structures 514A, 514B, respectively, which defines the topography of the electrode patterns formed thereon. For example, the fourth strip portion 524D of the first electrode pattern 524 comprises a portion, e.g., a vertical portion, that covers at least a portion of a first (left) sidewall of the first line structure 514A and a portion, e.g., a horizontal portion, that extends to cover at least a portion of a first (upper) recessed surface of the first recessed portion 514C abutting the first sidewall of the first line structure 514A. Similarly, the fourth strip portion 528D of the second electrode pattern 528 comprises a portion, e.g., a vertical portion, that covers at least a portion of a second (right) sidewall of the first line structure 514A and a portion, e.g., a horizontal portion, that extends to cover at least a portion of a first (upper) recessed surface of the second recessed portion 514D abutting the second sidewall of the first line structure 514A. In a similar manner as the first side 518, the second side of the first tine 514 has formed thereon the fourth strip portion 528B' of the second electrode pattern 528' comprising a portion, e.g., a vertical portion, that covers at least a portion of a first (left) sidewall of the second line structure 514B and a portion, e.g., a horizontal portion, that extends to cover at least a portion of a second (lower) recessed surface of the first recessed portion 514C abutting the first sidewall of the second line structure 514B. Similarly, the second strip portion 524B' of the first electrode pattern 524' comprises a portion, e.g., a vertical portion, that covers at least a portion of a second (right) sidewall of the second line structure 514B and a portion, e.g., a horizontal portion, that extends to cover at least a portion of a second (lower) recessed surface of the second recessed portion 514D abutting the second sidewall of the second line structure 514B. Thus formed, each of the first electrode portions 524D, 524B' and second electrode portions 528B', 528D have surfaces facing each other in a widthwise direction (y-direction) and configured such that, when a bias is applied between the first and second electrodes 524/524', 528/528', the fork-shaped quartz crystal device 500 vibrates in a torsional mode in which each of the tines 514, 516 twists about the X-axis.

Still referring to FIG. 5D, the cross-sectional view through the section C-C shows the second tine 516 having an analogous structure as the first tine 514, where the first line structure 516A, the second line structure 516B, the first recessed structure 516C and the second recessed structure 516D are formed in an analogous manner as the corresponding topography including the first line structure 514A, the second line structure 514B, the first recessed structure 514C and the second recessed structure 514D of the first tine 514, respectively. In addition, the second strip portion 528B of the second electrode pattern 528, the second strip portion 524B of the first electrode pattern 524, the fourth strip portion 524D' of the first electrode pattern 524' and the fourth strip portion 528D' of the second electrode pattern 528' are formed in an analogous manner relative the underlying topography as the fourth strip portion 524D of the first electrode pattern 524, the fourth strip portion 528D of the second electrode pattern 528, the second strip portion 528B' of the second electrode pattern 528' and the second strip portion 524B' of the first electrode pattern 524', respectively, that are formed on the first tine 514.

FIG. 5E illustrates a cross-sectional view of the quartz crystal device 500 though the section D-D (FIG. 5A) at the terminal end portion of the base 512. As described above with respect to FIGS. 5A and 5B, the terminal end portion of the base 512 has formed on the first side 518 the first portion 524A of the first electrode pattern 524 on the right side and the first portion 528A of the second electrode pattern 528 on the left side. The terminal portion of the base 512 additionally has formed on the second side 520 the first portion 524A' of the first electrode pattern 524' on the right side and the first portion 528A' of the second electrode pattern 528' on the left side. The first portions 524A and 524A' of the first electrode patterns 524 and 524', respectively, are connected by a side portion 524A" formed on right side of the base 512. The first portions 528A and 528A' of the second electrode patterns 528 and 528', respectively, are connected by a side portion 528A" formed on left side of the base 512. As configured, the first (e.g., negative) electrode pattern 524/524' partly surrounds the base 512 at the right side, and the second (e.g., positive) electrode pattern 528/528' partly surrounds the base 512 at the left side.

In operation, electrical pulses having a first (e.g., one of negative or positive) polarity may be applied to the first electrode patterns 524, 524' (including the second and fourth strip portions 524B, 524D on the front side 518 of the second and first tines 516, 514, respectively, and the second and fourth strip portions 524B', 524D' on the back side 520 of the first and second tines 514, 516, respectively, as illustrated in FIG. 5D). On the other hand, electrical pulses having a second (e.g., the other of negative or positive) polarity may be applied to the second electrode patterns 528, 528' (including the second and fourth strip portions 528B, 528D on the front side 518 of the second and first tines 516, 514, respectively, and to the second and fourth strip portions 528B', 528D' on the back side 520 of the first and second tines 514, 516, respectively, as illustrated in FIG. 5D). While embodiments are not so limited, the portions of the first electrode patterns 524, 524' may be at the same potential, and the portions of the second electrode patterns 528, 528' may be at the same potential. In addition, pulses having the first and second polarities may be applied to the quartz crystal device 500 simultaneously.

When the first and second electrode patterns 524/524', 528/528' are biased as described herein, the resulting electric field generally follows, e.g., on average, the paths indicated by the arrows in FIG. 5D. Advantageously, compared to the curvilinear electric field paths followed by the respective electrodes illustrated for the quartz crystal device 100 described above with respect to FIGS. 1A and 1B, the electric field paths include direct horizontal paths between the vertical portions of adjacently disposed electrodes of opposite polarities. For example, the electric field paths include a horizontal path from the vertical portions of the second strip portion 528B on the left sidewall of the first line structure 516A of the second tine 516, the fourth strip portion 528D on the right sidewall of the first line structure 514A of the first tine 514, the second strip portion 528B' on the left sidewall of the second line structure 514B of the first tine 514 and the fourth strip portion 528D' on right sidewall of the second line structure 516B of the second tine 516, to facing vertical portions of the second strip portion 524B on the right sidewall of the first line structure 516A of the second tine 516, the fourth strip portion 524D on the left sidewall of the first line structure 514A of the first tine 514, the second strip portion 524B' on the right sidewall of the second line structure 514B of the first tine 514 and the fourth strip portion 524D' on the left sidewall of the second line structure 516B of the second tine 516, respectively. It will be appreciated that the electric field paths indicated by the arrows between the vertical electrode portions are generally horizontal and in directions that are orthogonal to the electrode surfaces, In addition, the distance traversed by the electric field paths, e.g., the thicknesses of the first and second line structures 514A, 514B of the first tine 514 and the first and second line structures 516A, 516B of the second tine 516, are substantially smaller than the corresponding paths traversed by the corresponding electric field lines described above with respect to FIG. 1B.

Advantageously, the resulting electric field strength is relatively stronger for a given voltage and/or about the same for a lower voltage, thereby enabling more efficient vibration by twisting the first and second tines 514, 516, or torsionally vibrating the fork-shaped quartz crystal device 500. Thus, relatively lower power may be dissipated in torsionally vibrating the quartz crystal device 500 compared to quartz crystal devices that are configured differently, e.g., the quartz crystal devices that do not have the line structures protruding on one or both sides of the tines. In addition, because relatively smaller volume of the quartz substrate is twisted in operation, the inventors have recognized that the mesa structures can substantially reduce the motional resistance ($R_1$), thereby further reducing the energy consumed in operation and increasing the quality factor (Q). As configured, the configuration of the quartz crystal device 500 can be particularly adapted for lower power and higher precision applications.

Figure 6A:
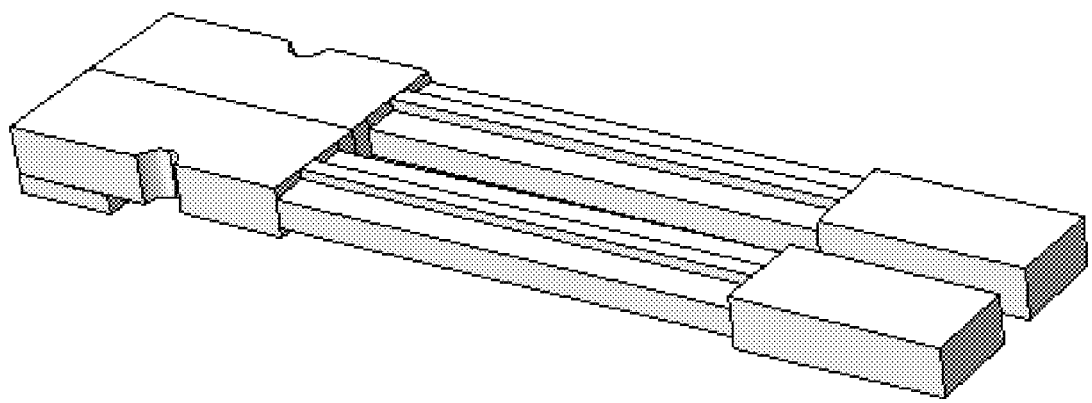
FIG. 6A schematically illustrates a perspective view of the fork-shaped torsional mode quartz crystal device illustrated in FIGS. 5A-5E.
Figure 6B:
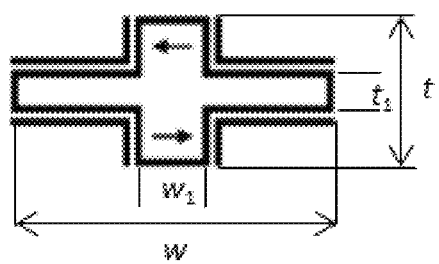
FIG. 6B schematically illustrates a cross-sectional view of the fork-shaped torsional mode quartz crystal device illustrated in FIG. 6A.
Figure 6C:
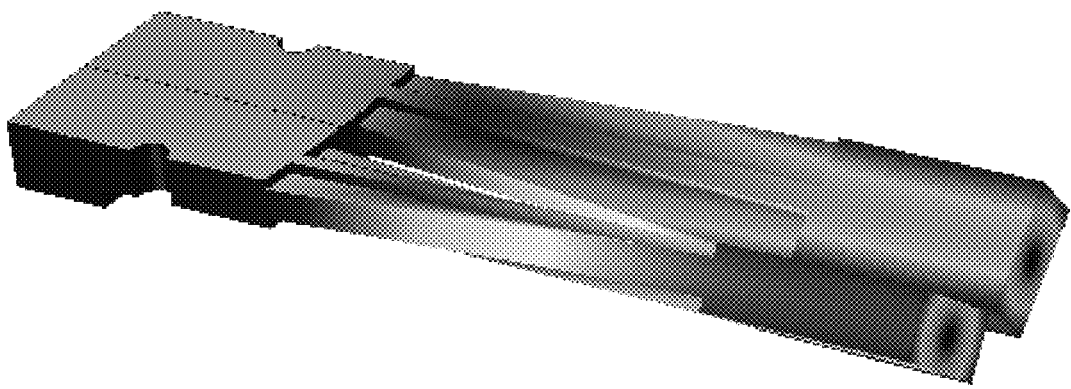
FIG. 6C schematically illustrates a perspective view of the fork-shaped torsional mode quartz crystal device illustrated in FIGS. 6A-6B, in which the tines are twisted in operation under a bias.

FIGS. 6A-6C schematically illustrate perspective views of the fork-shaped torsional mode quartz crystal device 500 described above with respect to FIGS. 5A-5E. FIG. 6A illustrates the fork-shaped quartz crystal device 500 in a rest state, while FIG. 6C illustrates the quartz crystal device 500 under a simulated bias conditions in which the tines are torsionally twisted. FIG. 6B schematically illustrates a cross-sectional view of the tines including the electrodes. When the first electrode patterns 524, 524' and the second electrode patterns 528, 528' are subjected to negative and positive voltages, respectively, as described above, such that the electric field limes comprise relatively strong horizontal vector components between vertical portions of the second electrode patterns 528, 528' and the corresponding vertical portions of the first electrode patterns 524, 524', the first and second tines 514, 516 twist about the X-axis extending in the lengthwise direction with increased efficiency, as illustrated in FIG. 6C. When the first and second electrode patterns 524/524', 528/528' are subjected to pulsed negative and positive voltages, the fork-shaped quartz crystal device 500 can toggle between the rest state illustrated in FIG. 6A and the deformed or twisted state illustrated in FIG. 6C.

Figure 7:
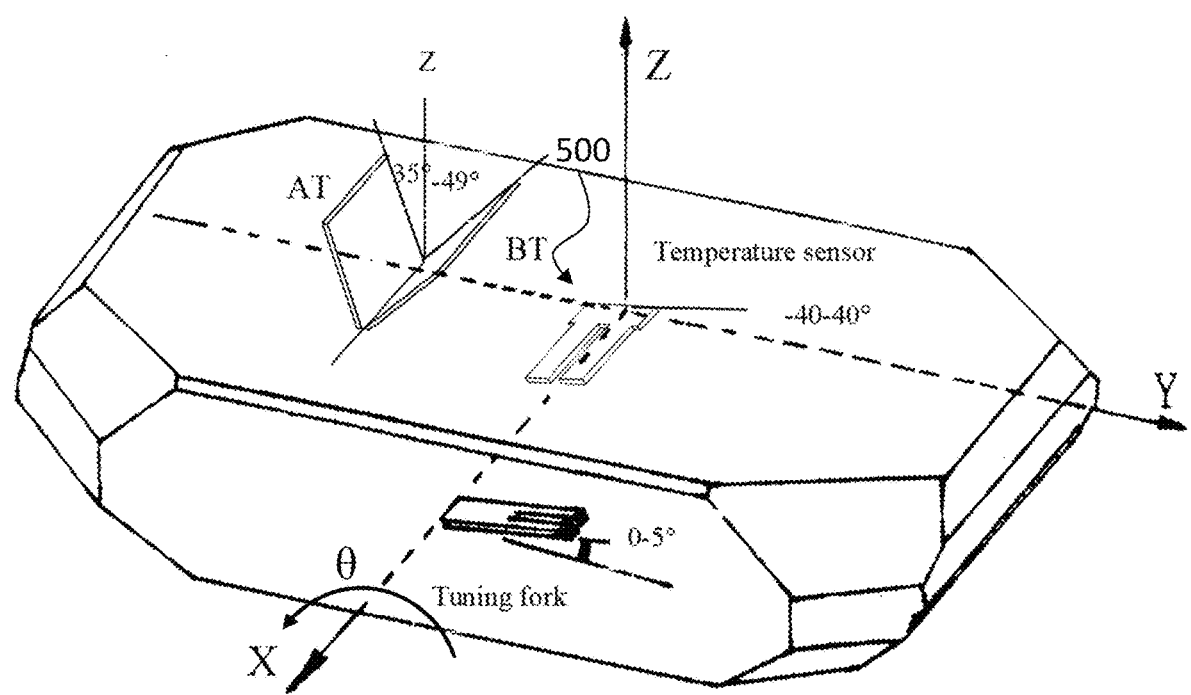
FIG. 7 schematically illustrates different crystal cuts and orientations for different types of quartz crystal devices including a fork-shaped torsional mode quartz crystal device, according to embodiments.

The piezo-electrical effect in quartz can be utilized in different vibrational modes based the way the crystal wafers or blanks are cut out of the raw bulk crystal in regards of their orientation to the atomic lattice. Some commonly used vibrational modes include, e.g., flexural, extensional, face shear and thickness shear modes, to name a few. In order to utilize the desired vibration mode, the quartz crystals are cut in a certain angle with respect to the quartz lattice. FIG. 7 schematically illustrates different crystal orientations for different types of quartz crystal devices including a fork-shaped torsional mode quartz crystal device, according to embodiments. Commonly used cuts of quartz crystal include, e.g., X-cut, Z-cut, NT-cut, AT-cut, BT-cut and SC-cut, to name a few. Referring to FIG. 7, according to various embodiments disclosed herein, the fork-shaped quartz crystal devices configured for torsional vibration are fabricated from a Z-cut quartz. The quartz crystals for torsional vibration have surface normal directions of main surfaces that are rotated at a tilt angle θ of about −50 degrees to +50 degrees, about −40 degrees to +40 degrees, or about −30 degrees to +30 degrees relative to the X-axis, which is sometimes referred to as the electrical axis. In addition, the lengths of the tines of the quartz crystal devices extend in the X-axis of the quartz crystal. This is notably in contrast with tuning fork quartz crystal devices configured for flexural vibrations, in which the lengths of the tines extend in the Y-axis of a quartz crystal from which the devices are fabricated. For example, referring back to FIGS. 5A-5E, the top surfaces of the first and second line structures 514A, 514B of the first tine 514 the top surfaces of the first and second line structures 516A, 516B of the second tine 516 are rotated at the θ relative to the X-axis.

In the following, various physical characteristics of the fork-shaped quartz crystal devices according to embodiments are described.

Figure 8A:
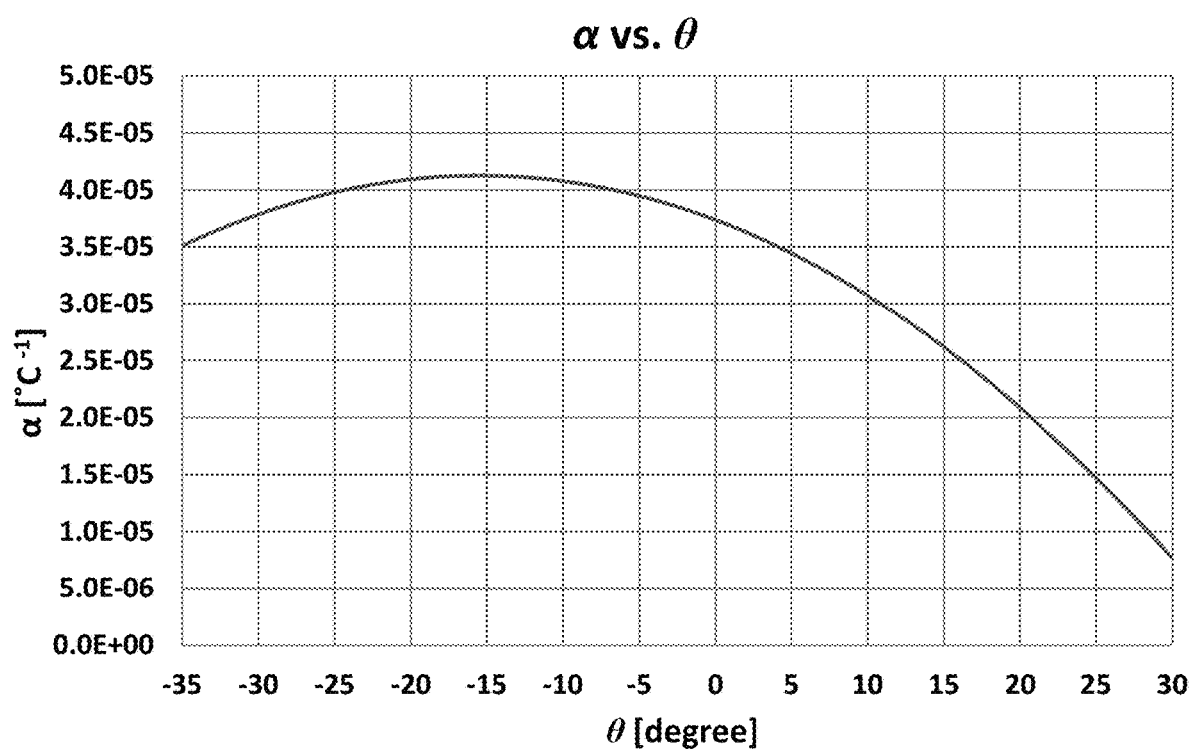
FIG. 8A illustrates a simulation of a linear temperature coefficient of a fork-shaped torsional mode quartz crystal device as a function of an angle of tilt θ relative to the X-axis of a quartz crystal, according to embodiments.

One application for quartz crystal devices described herein is a temperature sensor. The quartz crystal devices are particularly suitable for a temperature sensor application because the frequency of the quartz crystal devices described herein have a substantially linear relationship with temperature. The relationship between the frequency of oscillation of a quartz crystal device and temperature may be represented by the following approximate polynomial expression:

$$(f(T)-f(T_0))/f(T_0)=\alpha(T-T_0)+\beta(T-T_0)^2+\gamma(T-T_0)^3 \quad [3]$$

where $T_0$ is a reference temperature, e.g., 25° C., $f(T_0)$ is the frequency at the $T_0$, f(T) is the frequency of the crystal subjected to the temperature T, and α, β and γ are coefficients that are independent of temperature. For temperature sensor applications, it is desirable that the temperature dependence of the f(T) be as linear as possible because it allows for direct and accurate conversion between temperature and frequency in a numerical or quasi-numerical manner. Thus, by measuring the f(T), which can be performed with a high degree of resolution, a correspondingly accurate temperature can be calculated based on the linear relationship. For a high degree of linearity of the f(T), the non-linear coefficients β and γ should be as small as possible relative to the linear coefficient α. FIG. 8A illustrates a linear temperature coefficient α as a function of an angle θ for a fork-shaped torsional mode quartz crystal device, according to embodiments. According to various embodiments, a can have a value of about $1\times10^{-6}$-$1\times10^{-5}$ °C.$^{-1}$, $1\times10^{-5}$-$2\times10^{-5}$ °C.$^{-1}$, $2\times10^{-5}$-$3\times10^{-5}$ °C.$^{-1}$, $3\times10^{-5}$-$4\times10^{-5}$ °C.$^{-1}$, $4\times10^{-5}$-$5\times10^{-5}$ °C.$^{-1}$, or a value in a range defined by any of these values, for instance $1\times10^{-5}$-$3\times10^{-5}$ °C.$^{-1}$, when the quartz crystal device is configured according to any of configurations descried herein. Typical experimental and finite element analysis (FEA)-simulated α, β and γ values for one example configuration of the fork-shaped quartz crystal device similar to that described in FIGS. 5A-5E are shown in TABLE 1 below.

TABLE 1

|  | Experimental Data | FEA Simulation |
|---|---|---|
| $α,/° C.$ | 3.44E−05 | 3.61E−05 |
| $β,/° C.^2$ | 1.93E−08 | 2.29E−08 |
| $γ,/° C.^3$ | 2.69E−11 | 5.14E−11 |

According to various embodiments described herein, the quartz crystal devices can be operated at a frequency in a range between about 100 kHz and 500 kHz. Example frequencies that can be used to operate the quartz crystal device include, e.g., 172.0 kHz, 190.5 kHz, 262.144 kHz, 300.0 kHz, 325.0 kHz, and 350.0 kHz, to name a few.

Figure 8B:
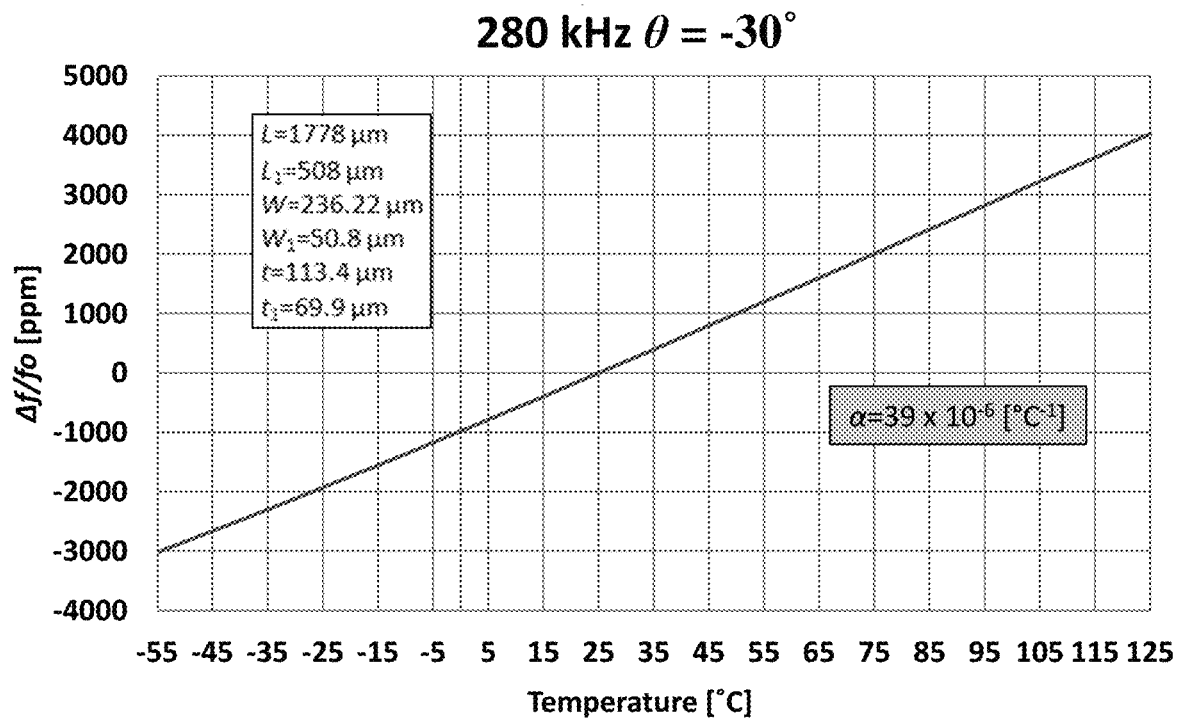
FIG. 8B illustrates a simulated frequency versus temperature curve of a fork-shaped torsional mode quartz crystal device at an angle of tilt of −30° relative to the X-axis of a quartz crystal, according to embodiments.
Figure 8C:
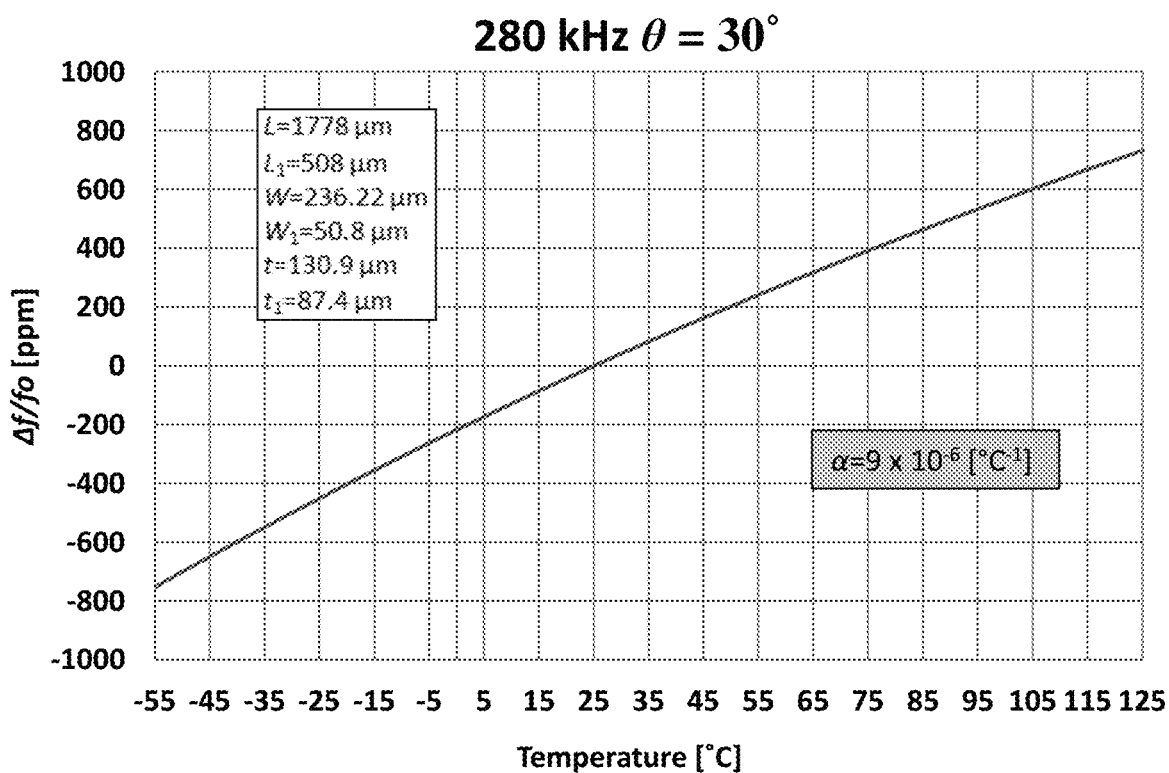
FIG. 8C illustrates a simulated frequency versus temperature curve of a fork-shaped torsional mode quartz crystal device at an angle of tilt of 30° relative to the X-axis of a quartz crystal, according to embodiments.

FIGS. 8B and 8C illustrates the linearity of the f(T) for example fork-shaped quartz crystal devices according to embodiments. FIG. 8B illustrates a frequency versus temperature curve at an angle of tilt of −30° relative to the X-axis of a quartz crystal for a fork-shaped torsional mode quartz crystal device having a mesa structure according to embodiments. FIG. 8C illustrates a frequency versus temperature curve at an angle of tilt of 30° relative to the X-axis of a quartz crystal for a fork-shaped torsional mode quartz crystal device having a mesa structure according to embodiments. The linearity coefficient α for the examples illustrated in FIGS. 8B and 8C were $3.9×10^{−5°} C.^{−1}$ and $9×10^{−6°} C.^{−1}$ respectively.

Figure 9:
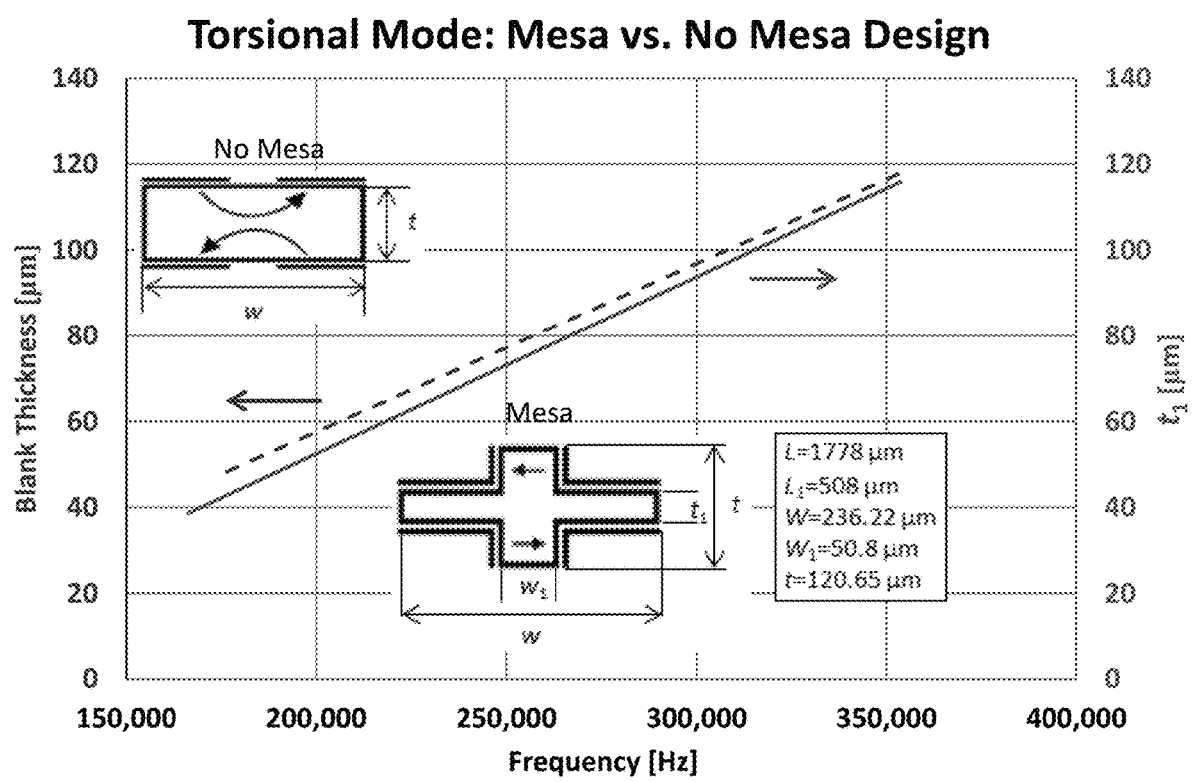
FIG. 9 illustrates simulated frequency versus thickness for fork-shaped torsional mode quartz crystal devices with and without a mesa structure.

FIG. 9 illustrates a frequency versus thickness curves for fork-shaped torsional mode quartz crystal devices with and without a mesa structure. Both structures demonstrate a substantially linear relationship between the thickness t or $t_1$ and the resonance frequency. In addition, fork-shaped torsional mode quartz crystal devices with a mesa structure demonstrate a substantially linear relationship between the thickness $t_1$ of the recessed regions of the tines and the resonance frequency.

Figure 10A:
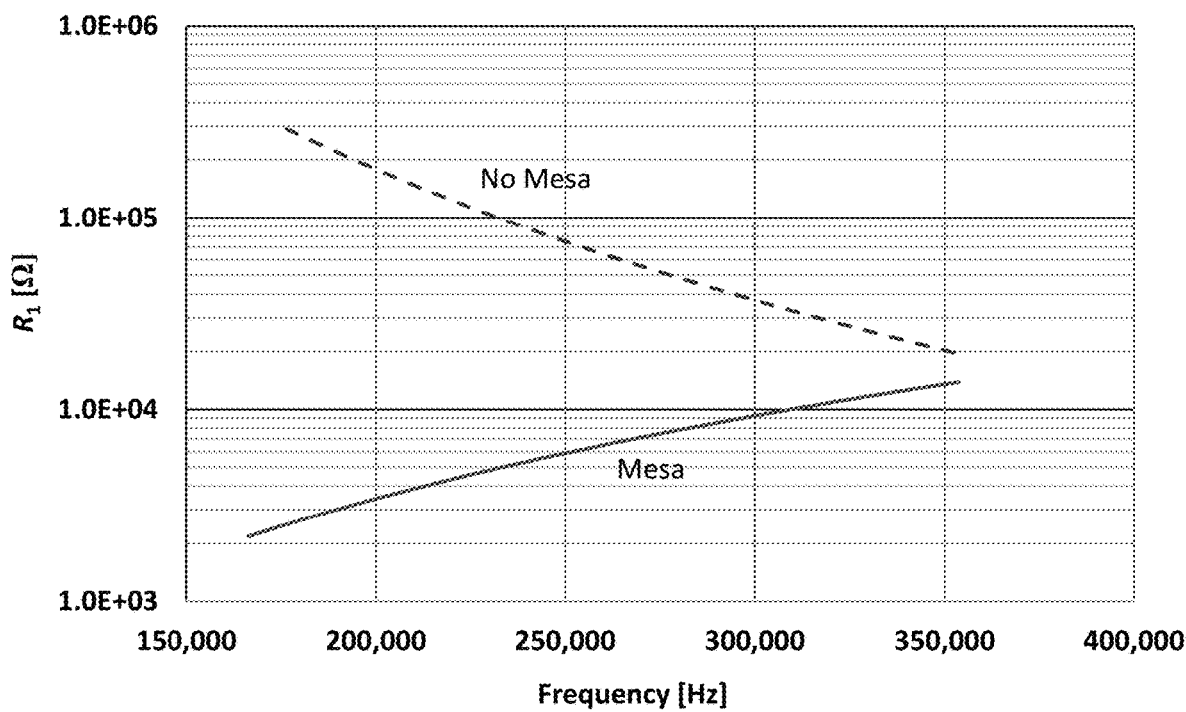
FIG. 10A is a graph illustrating simulated motional resistance as a function of frequency for fork-shaped torsional mode quartz crystal devices with and without a mesa structure.
Figure 10B:
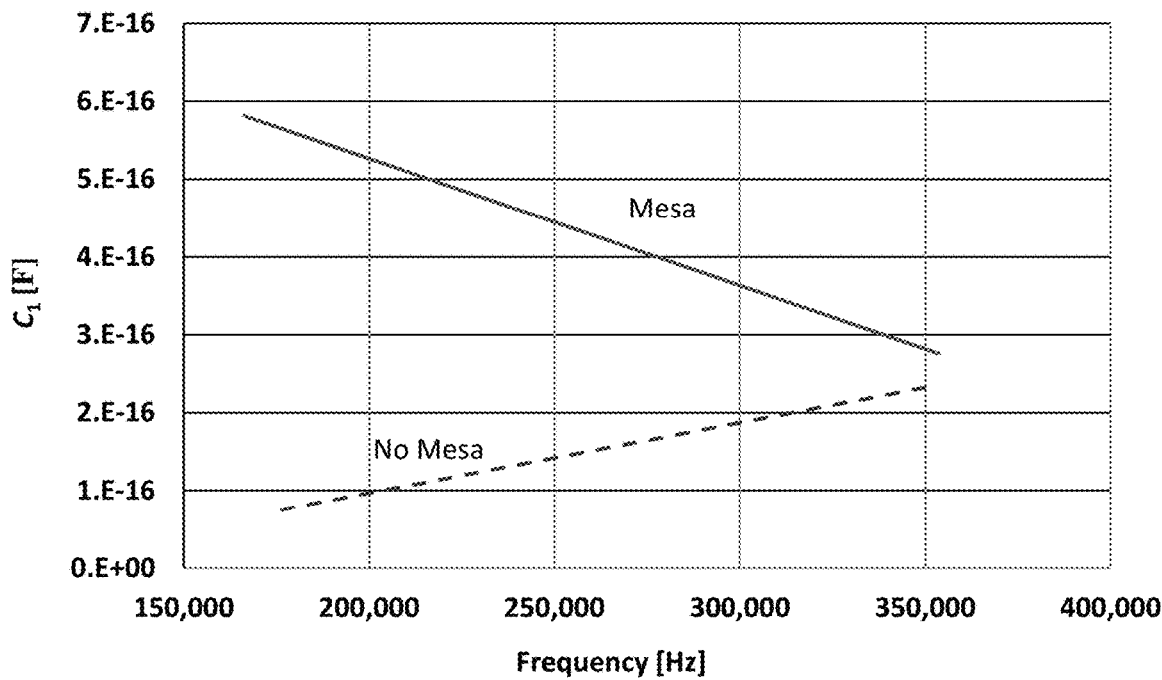
FIG. 10B is a graph illustrating simulated motional capacitance as a function of frequency for fork-shaped torsional mode quartz crystal devices with and without a mesa structure.
Figure 10C:
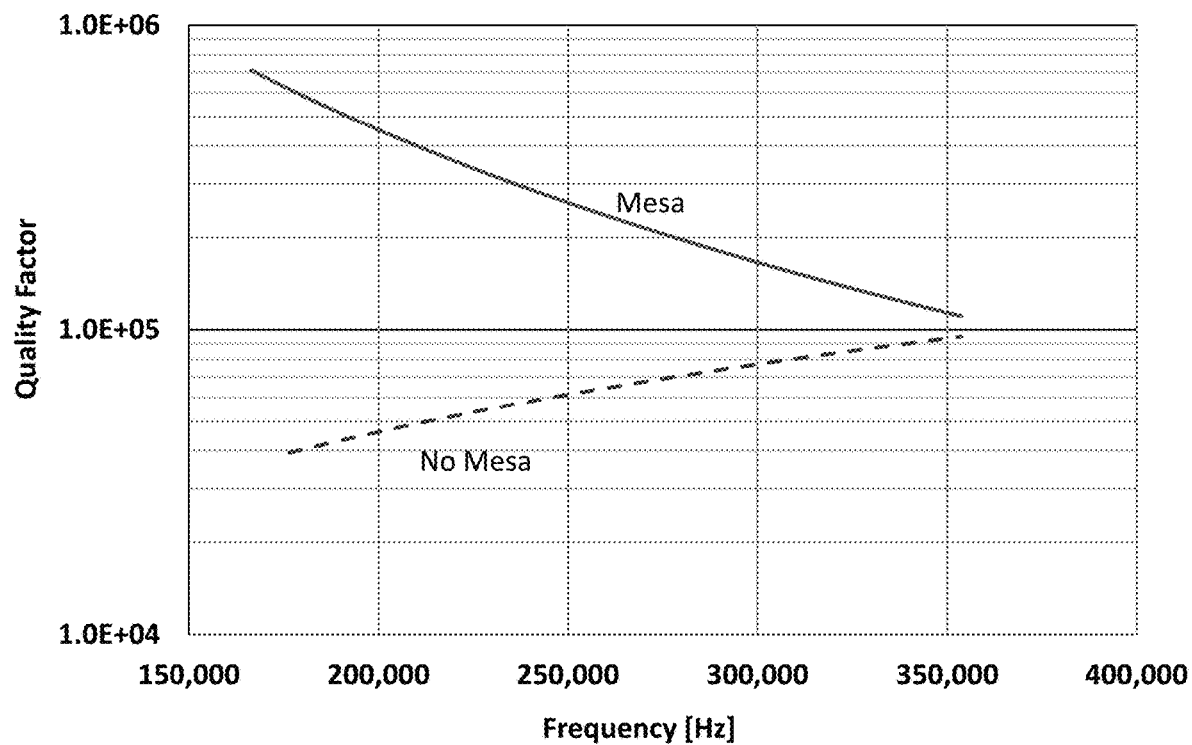
FIG. 10C is a graph illustrating a simulated quality factor as a function of frequency for fork-shaped torsional mode quartz crystal devices with and without a mesa structure.

As described above with respect to Eq. [1], the motional resistance ($R_1$), the motional capacitance ($C_1$) and the quality factor (Q) are figures of merit for quartz crystal devices. The inventors have discovered that, by forming the mesa structures on the tines of the fork-shaped torsional quartz crystal devices as described herein, the $R_1$, $C_1$ and Q can be advantageously engineered for improved torsional vibration compared to fork-shaped torsional quartz crystal devices that do not have the mesa structures formed on the tines. FIGS. 10A-10C illustrate qualitatively different frequency or thickness dependencies of the $R_1$, $C_1$ and Q between the quartz crystal devices configured for torsional vibration without (e.g., FIGS. 1A and 1B) and with (FIGS. 5A-5E) line or mesa structures formed on the tines of the fork-shaped quartz crystal devices.

FIG. 10A is a graph illustrating the $R_1$ as a function of frequency for fork-shaped torsional mode quartz crystal devices with and without a mesa structure. As illustrated, without the line or mesa structures formed on the tines, the $R_1$ of the fork-shaped torsional quartz crystal device generally decreases with increasing frequency at least within the illustrated frequency range. In contrast, the $R_1$ of the fork-shaped torsional quartz crystal device having the line or mesa structures formed on the tines generally increases with increasing frequency at least within the illustrated frequency range.

FIG. 10B is a graph illustrating the $C_1$ as a function of frequency for fork-shaped torsional mode quartz crystal devices with and without a mesa structure. As illustrated, without the line or mesa structures formed on the tines, the $C_1$ of the fork-shaped torsional quartz crystal device generally increases with increasing frequency at least within the illustrated frequency range. In contrast, the $C_1$ of the fork-shaped torsional quartz crystal device having the line or mesa structures formed on the tines generally decreases with increasing frequency at least within the illustrated frequency range.

FIG. 10C is a graph illustrating quality factor (Q) as a function of frequency for fork-shaped torsional mode quartz crystal devices with and without a mesa structure. From FIGS. 10A and 10B, it will be appreciated that, while the $R_1$ is generally lower and the $C_1$ is generally higher for fork-shaped torsional quart crystal devices with line or mesa structures on the tines compared to those without the line or mesa structures on the tines, the decrease in magnitude of the $R_1$ is greater than the increase in magnitude of the $C_1$. In sum, as illustrated, the fork-shaped torsional quartz crystal devices with line or mesa structures advantageously have significantly higher value of the Q at least within the illustrated frequency range.

According to various embodiments, fork-shaped torsional quartz crystal devices with line or mesa structures have an $R_1$ of 1-10 kΩ, 10-20 kΩ, 20-30 kΩ, 30-40 kΩ or a value in a range defined by any of these values, a $C_1$ of 0.1-0.2 fF, 0.2-0.3 fF, 0.3-0.4 fF, 0.4-0.5 fF, 0.5-0.6 fF, 0.6-0.7 fF, 0.7-0.8 fF, 0.8-0.9 fF, 0.9-1.0 fF, 1.0-1.1 fF, 1.1-1.2 fF, 1.2-1.3 fF or a value in a range defined by any of these values or greater, and a Q of 10,000-20,000, 20,000-50,000, 50,000-200,000, 200,000-400,000, 400,000-600,000, 600,000-800,000, 800,000-1,000,000, or a value in a range defined by any of these values, for a frequency range including at least 172.0 kHz to 350.0 kHz, according to embodiments.

Advantageously, the shape of the fork-shaped torsional mode quartz crystal devices having mesa or line structures formed on the tines offer a greater number of physical parameters that can be optimized for the desired performance. For example, the physical parameters that can be optimized include the overall thickness of the quartz crystal device, the height of the line or mesa structure, the width of the line or mesa structure and the length of the line or mesa structure, to name a few. The technical effects of optimizing these parameters are described below.

Figure 11:
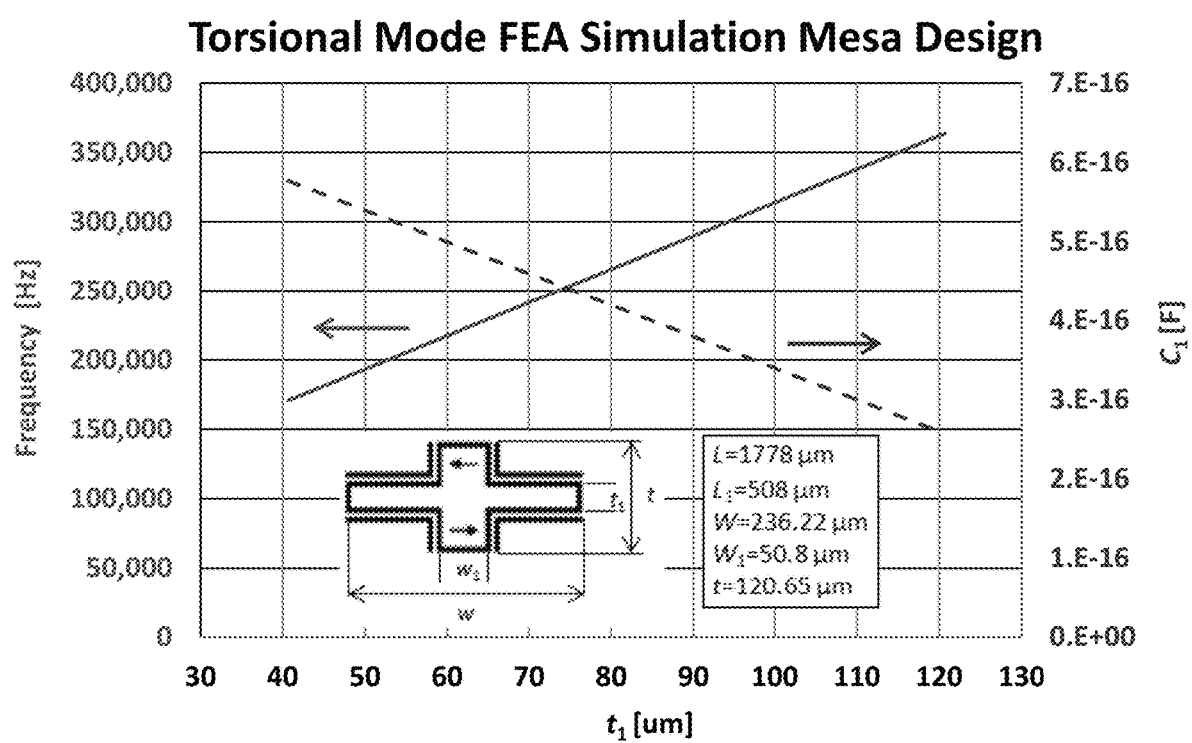
FIG. 11 is a graph illustrating simulated frequency and motional capacitance as a function of mesa thickness for a fork-shaped torsional mode quartz crystal device, according to embodiments.
Figure 12A:
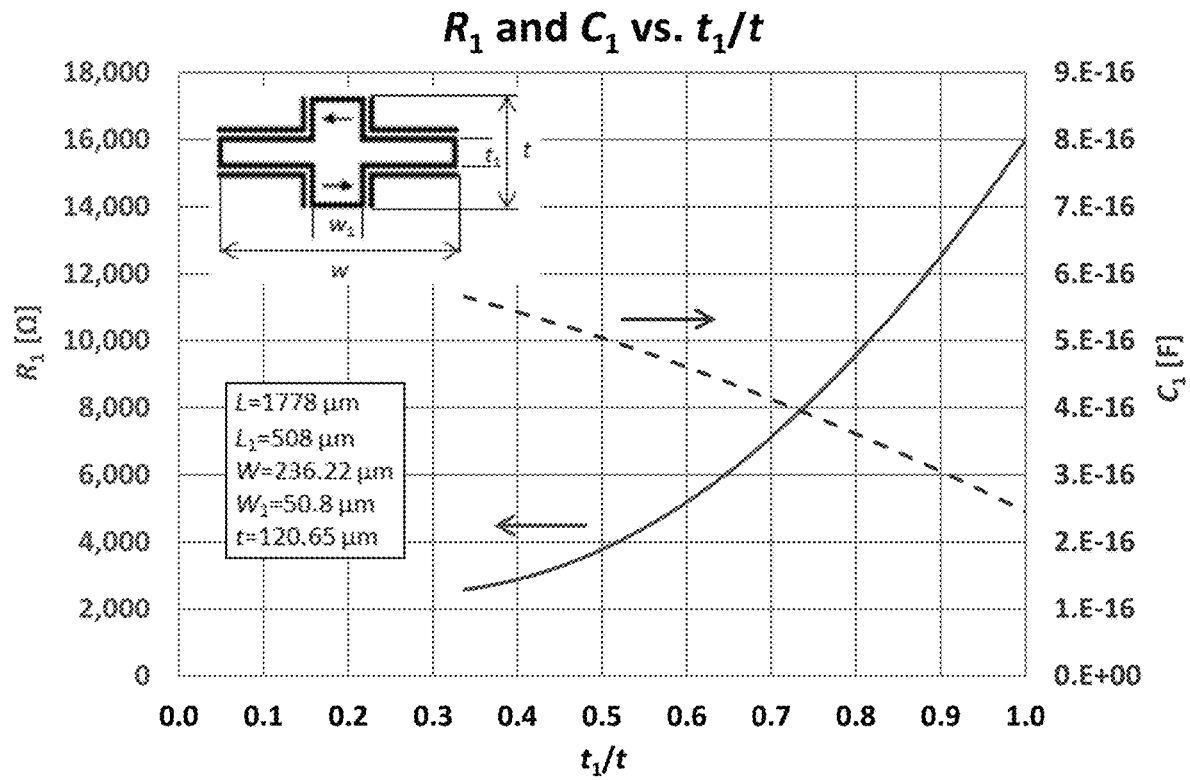
FIG. 12A is a graph illustrating simulated motional resistance and motional capacitance as a function of a ratio of thicknesses between a line region and a recessed region of a tine for a fork-shaped torsional mode quartz crystal device comprising a mesa structure, according to embodiments.
Figure 12B:
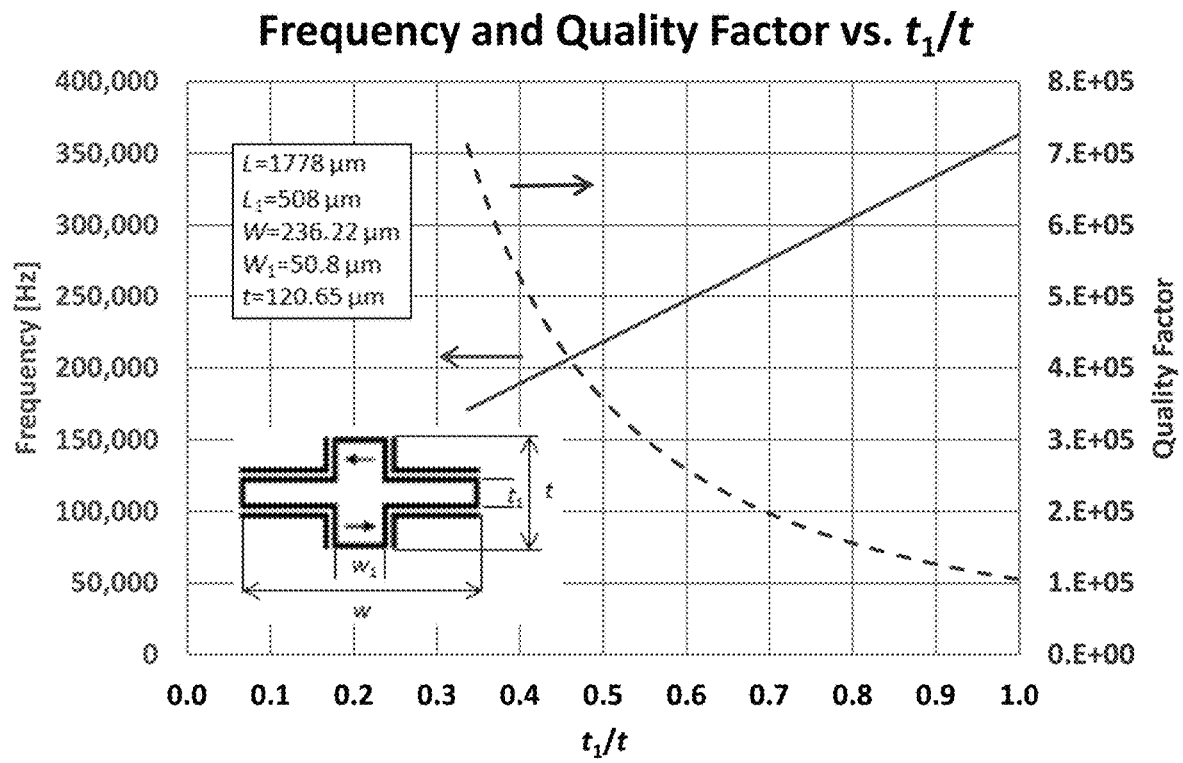
FIG. 12B is a graph illustrating simulated frequency and quality factor as a function of a ratio of thicknesses between a line region and a recessed region of a tine for a fork-shaped quartz crystal device comprising a mesa structure, according to embodiments.

FIG. 11 is a graph illustrating the frequency and the motional capacitance ($C_1$) as a function of the height of the line structure or the mesa thickness for fork-shaped torsional mode quartz crystal devices comprising a mesa structure, according to embodiments. As illustrated, the frequency and the $C_1$ can vary inversely as a function of the height of the line structure or the mesa thickness FIG. 12A is a graph illustrating the motional resistance ($R_1$) and the motional capacitance ($C_1$) as a function of a ratio ($t_1/t$) between a thickness ($t_1$) of the recessed region of a tine and a thickness (t) of the line region of the tine of the fork-shaped torsional mode quartz crystal devices, according to embodiments. FIG. 12B is a graph illustrating the frequency and the quality factor (Q) as a function of the $t_1/t$ for the fork-shaped torsional mode quartz crystal devices. As illustrated, the $R_1$ can be lowered at a faster rate compared to the rate of increase of the $C_1$ by decreasing the $t_1/t$, such that the Q can advantageously be significantly increased. According to various embodiments, the $t_1/t$ can be about 0.01-0.2, 0.2-0.4, 0.4-0.6, 0.6-0.8, 0.8-0.99, or have a value in a range defined by any of these values.

Figure 13A:
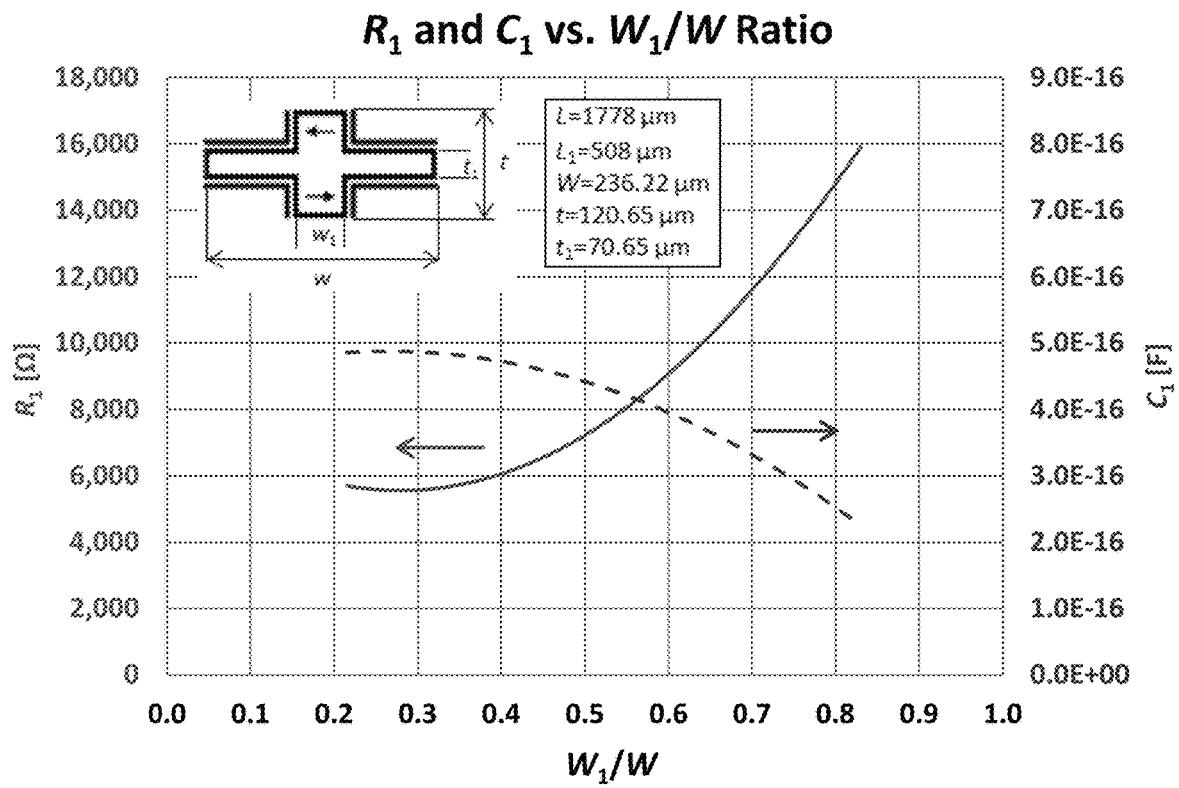
FIG. 13A is a graph illustrating simulated motional resistance and motional capacitance as a function of a ratio between a width of a line region and a tine width for a fork-shaped quartz crystal device comprising a mesa structure, according to embodiments.
Figure 13B:
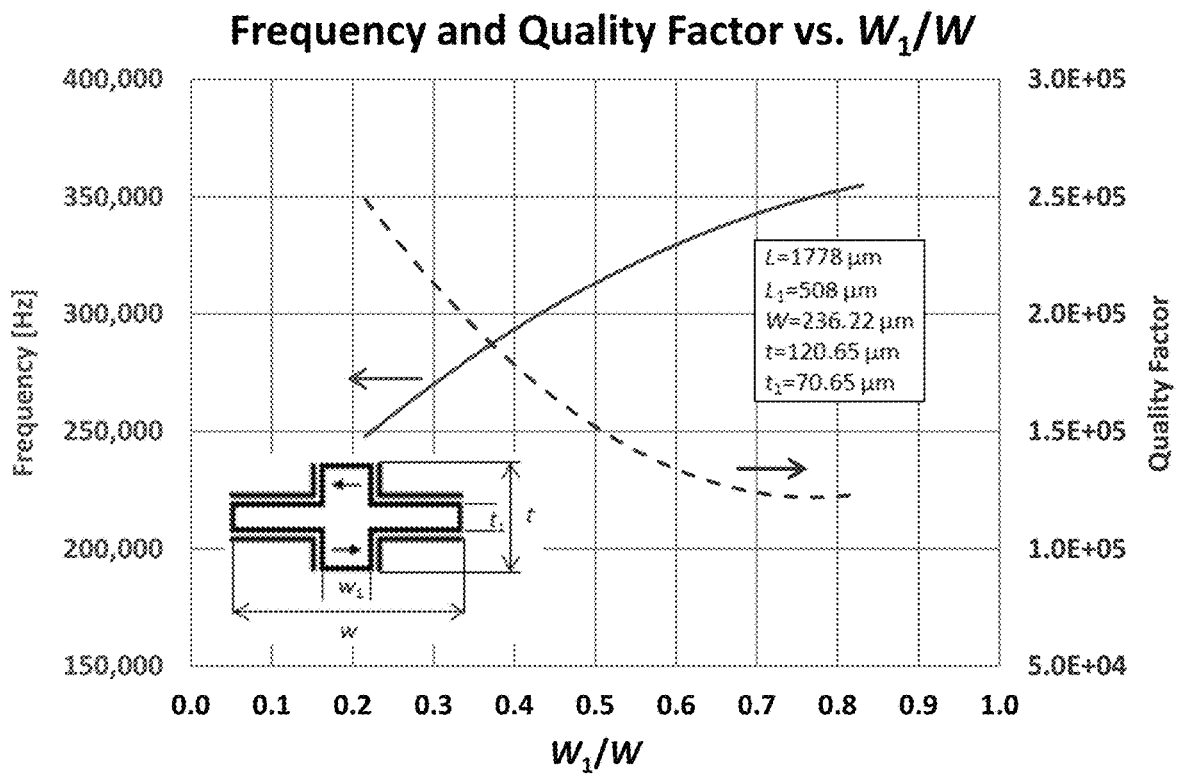
FIG. 13B is a graph illustrating simulated frequency and quality factor as a function of a ratio of between a width of a line region and a tine width for fork-shaped torsional mode quartz crystal device comprising a mesa structure, according to embodiments.

FIG. 13A is a graph illustrating the motional resistance ($R_1$) and the motional capacitance ($C_1$) as a function of a ratio ($W_1$/W) between a width ($W_1$) of a line region and an overall width (W) of the tines of fork-shaped torsional mode quartz crystal devices comprising a mesa structure, according to embodiments. FIG. 13B is a graph illustrating the frequency and the quality factor (Q) as a function of the $W_1$/W for the fork-shaped torsional mode quartz crystal devices comprising a mesa structure. As illustrated, the $R_1$ can be lowered at a faster rate compared to the rate of increase of the $C_1$ by decreasing the $W_1$/W, such that the Q can advantageously be significantly increased. According to various embodiments, the $W_1$/W can be about 0.01-0.2, 0.2-0.4, 0.4-0.6, 0.6-0.8, 0.8-0.99, or have a value in a range defined by any of these values.

Figure 14A:
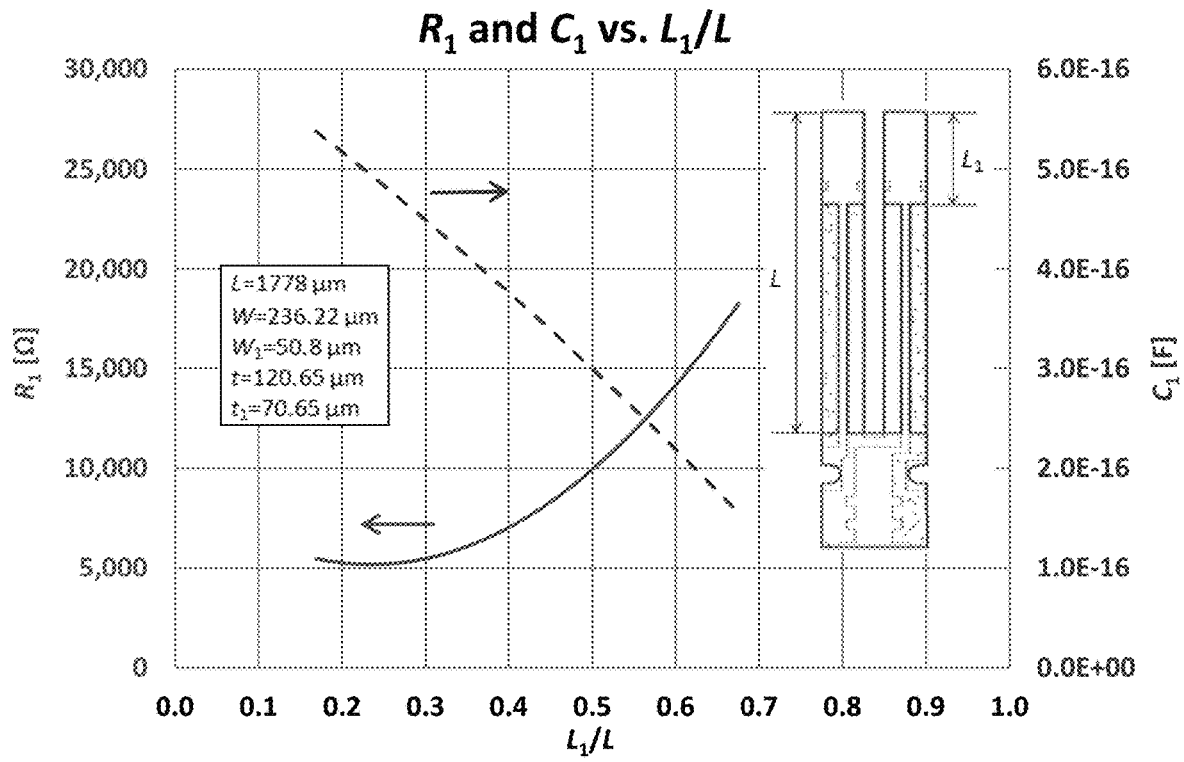
FIG. 14A is a graph illustrating simulated motional resistance and motional capacitance as a function of a ratio between a length of a tip region of a tine excluding the line region a length of the tine including the line region for a fork-shaped torsional mode quartz crystal device comprising a mesa structure, according to embodiments.
Figure 14B:
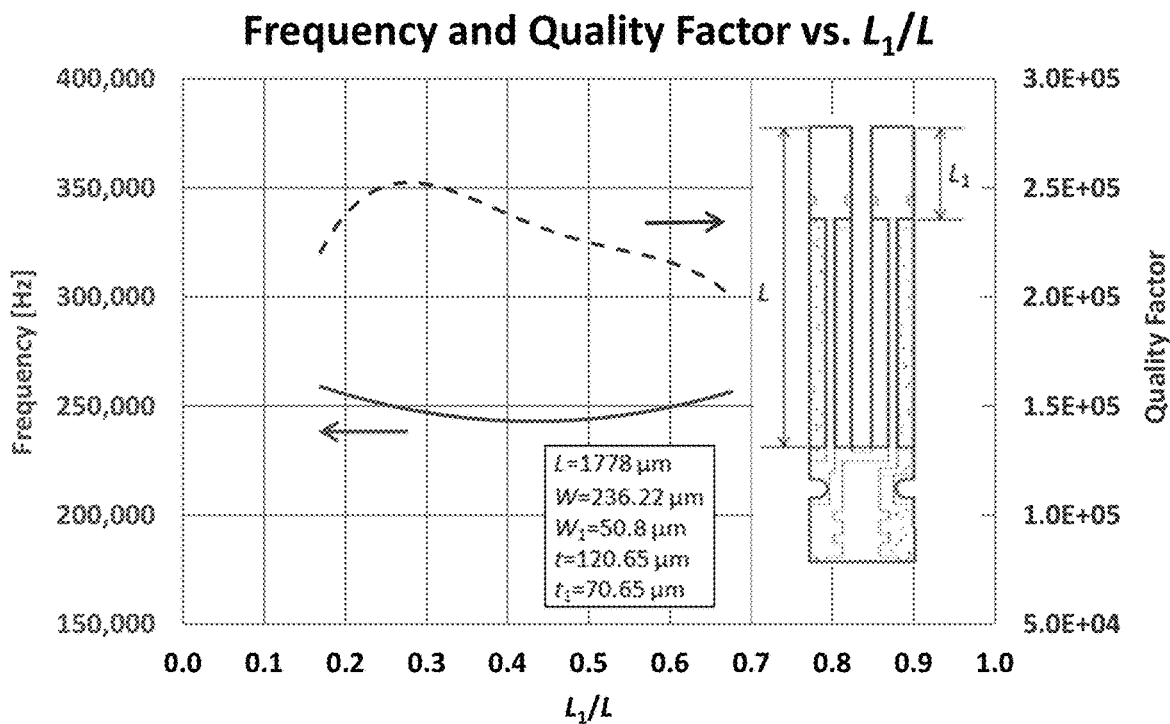
FIG. 14B is a graph illustrating simulated frequency and quality factor as a function of a ratio between a length of a tip region of a tine excluding the line region a length of the tine including the line region for a fork-shaped torsional mode quartz crystal device comprising a mesa structure, according to embodiments.

FIG. 14A is a graph illustrating the motional resistance ($R_1$) and the motional capacitance ($C_1$) as a function of a ratio ($L_1$/L) between a length ($L_1$) of the tip regions of the tines excluding the line regions and a length (L) of the tines including the tip regions and the line regions for fork-shaped torsional mode quartz crystal devices comprising a mesa structure, according to embodiments. FIG. 14B is a graph illustrating the frequency and the quality factor (Q) as a function of the $L_1$/L for the fork-shaped torsional mode quartz crystal devices. As illustrated, the $R_1$ can be lowered at a faster rate compared to the rate of increase of the $C_1$ by decreasing the $L_1$/L down to about 0.3, such that the Q can advantageously be increased. According to various embodiments, the $L_1$/L can be about 0.01-0.2, 0.2-0.4, 0.4-0.6, 0.6-0.8, or have a value in a range defined by any of these values.

According to some embodiments, a length (L) of the tines of the fork-shaped torsional mode quartz crystal devices can be about 500-1000 μm, 1000-1500 μm, 1500-2000 μm, 2000-2500 μm, 2500-3000 μm, or any value in a range defined by these values, for instance 1778 μm.

According to some embodiments, a length ($L_1$) of the tip regions of the tines of the fork-shaped torsional mode quartz crystal devices can be about 100-300 μm, 300-500 μm, 500-700 μm, 700-900 μm, or any value in a range defined by these values, for instance 508 μm. The $L_1$ can also be defined by any of the $L_1$/L values described above.

According to some embodiments, a length ($L_m$) of the base (e.g., 512, FIG. 5A) of the fork-shaped torsional mode quartz crystal devices can be about 100-300 μm, 300-500 μm, 500-700 μm, 700-1000 μm, or any value in a range defined by these values, for instance 635 μm.

According to some embodiments, a width (W) of a tine of the fork-shaped torsional mode quartz crystal devices can be about 100-200 μm, 200-300 μm, 300-400 μm, 400-500 μm, or any value in a range defined by these values, for instance 236 μm.

According to some embodiments, a width ($W_1$) of a line or mesa structure formed on a tine of the fork-shaped torsional mode quartz crystal devices can be about 1-20 μm, 20-40 μm, 40-60 μm, 60-80 μm, 80-100 μm or any value in a range defined by these values, for instance 50 μm.

According to some embodiments, a thickness ($t_1$) of a recessed region of a tine of the fork-shaped torsional mode quartz crystal devices can be about 40-60 μm, 60-80 μm, 80-100 μm, 100-120 μm, or any value in a range defined by these values, for instance 85 μm.

According to some embodiments, a thickness (t) of the fork-shaped torsional mode quartz crystal devices can be about 60-90 μm, 90-120 μm, 120-150 μm, 150-180 μm, or any value in a range defined by these values, for instance 120 μm.

Figure 15A:
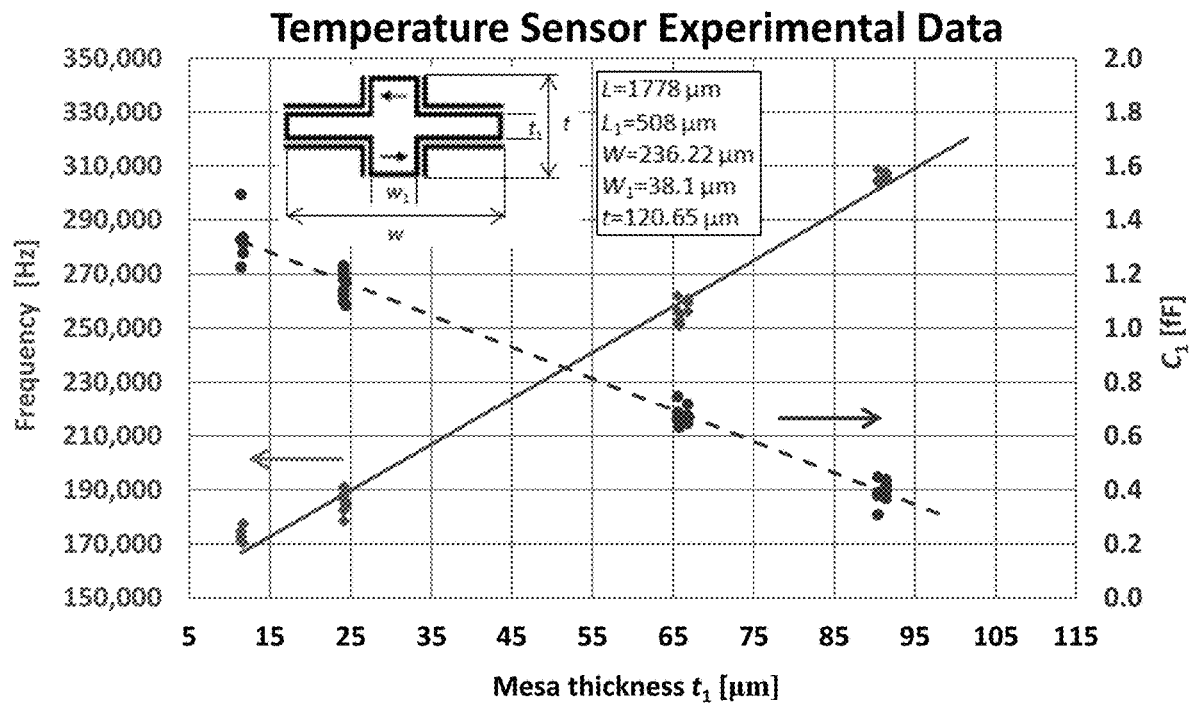
FIG. 15A illustrates experimentally measured frequency and motional capacitance versus mesa thickness for a fork-shaped torsional mode quartz crystal device comprising a mesa structure, according to embodiments.
Figure 15B:
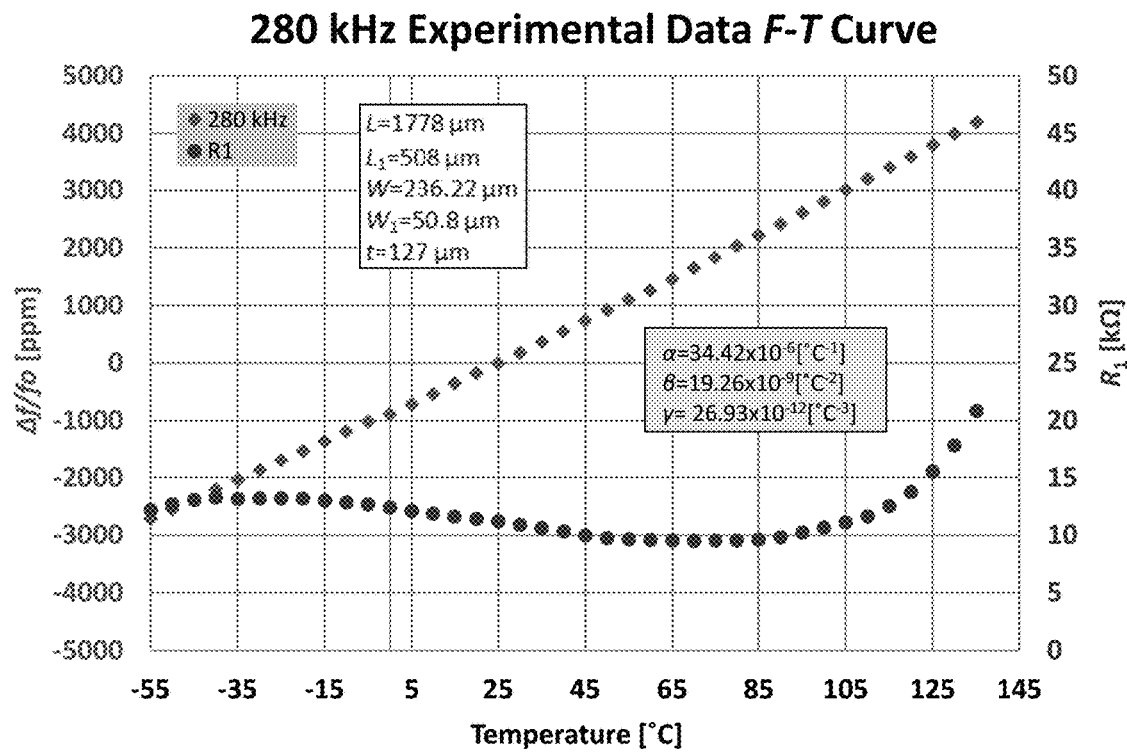
FIG. 15B illustrates an experimentally measured frequency versus temperature curve for a fork-shaped torsional mode quartz crystal device comprising a mesa structure, according to embodiments.

FIG. 15A illustrates experimentally measured frequency and motional capacitance ($C_1$) versus mesa thickness for a fork-shaped torsional mode quartz crystal device comprising a mesa structure, according to embodiments. FIG. 15B illustrates experimentally measured linearity of the f(T) and the $R_1$ of fork-shaped torsional mode quartz crystal devices, according to embodiments. The simulated and measured linearity coefficients α are in reasonably good agreement, at $3.61 \times 10^{-5}$ $C.^{-1}$ and $3.44 \times 10^{-5}$ $C.^{-1}$, respectively.

Figure 16A:
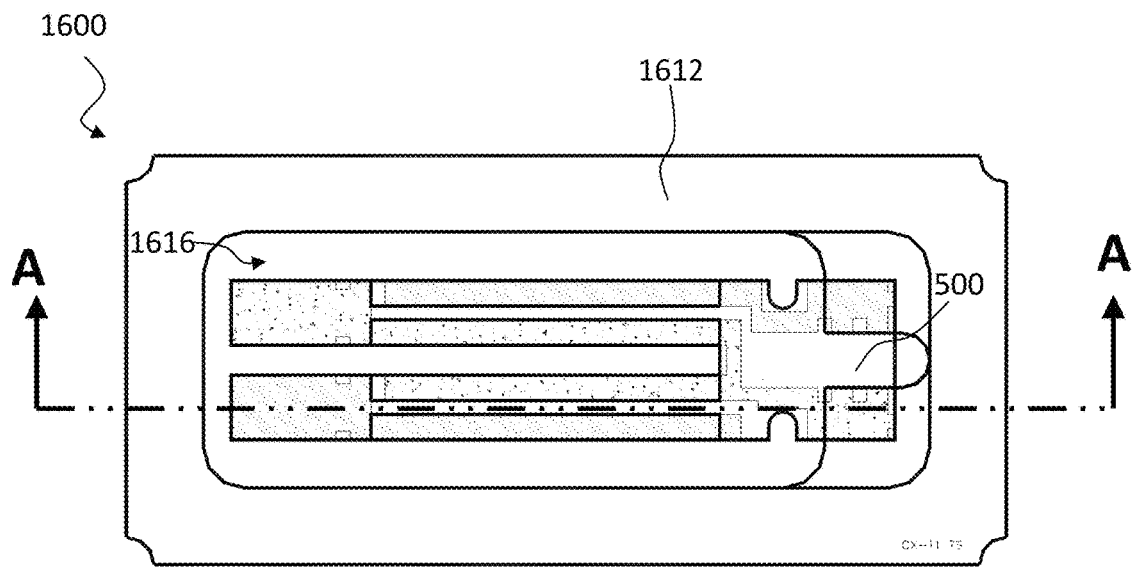
FIG. 16A illustrates a plan-view of a fork-shaped quartz crystal device comprising a mesa structure packaged in a ceramic package substrate, according to embodiments.
Figure 16B:
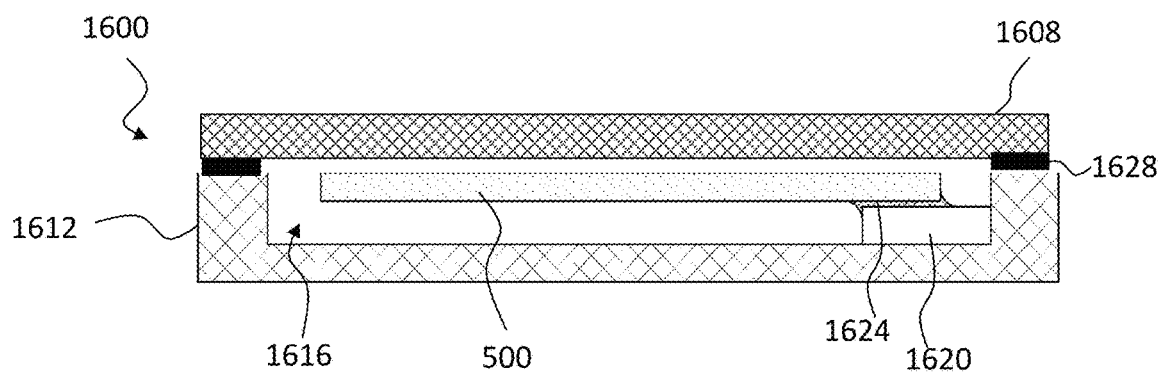
FIG. 16B illustrates a cross-sectional view of the packaged fork-shaped quartz crystal device illustrated in FIG. 16A.

FIG. 16A illustrates a plan-view of a packaged fork-shaped torsional mode quartz crystal device 1600 packaged in a ceramic package, according to some embodiments. FIG. 16B illustrates a cross-sectional view of the packaged fork-shaped torsional mode quartz crystal device 1600 illustrated in FIG. 16A, which includes the fork-shaped torsional mode quartz crystal device 500 enclosed, e.g., hermetically sealed, in the ceramic package illustrated in FIG. 16A. The fork-shaped torsional mode quartz crystal device 500 may be, e.g., any one of the fork-shaped torsional quartz crystal devices described herein. The ceramic package includes a ceramic package substrate 1612 and a lid 1608 for housing the fork-shaped torsional mode quartz crystal device 500 according to various embodiments described above.

The ceramic package substrate 1612 comprises a ceramic frame having a plurality walls that form a cavity 1616 configured to house the fork-shaped torsional mode quartz crystal device 500. The ceramic package substrate 1612 is configured to provide thermal and electrical communication between the fork-shaped torsional mode quartz crystal device 500 and the outside world, e.g., a PCB (not shown), through one or more metallization structures (not shown). One or more mounting pedestals 1620 (FIG. 16B) may be formed inside the cavity 1616 of the ceramic package substrate 1620 that are configured for mounting the fork-shaped torsional mode quartz crystal device 500. While not shown, the mounting pedestals 1620 may have formed thereon an inner metallization pad that is electrically connected to an outer metallization pad for providing electrical and thermal communication between the fork-shaped torsional mode quartz crystal device 500 and the outside world. In the illustrated embodiment, the fork-shaped torsional mode quartz crystal device 500 is bonded at two points on each of the pedestals 1620. However, embodiments are not so limited and in other embodiments, the fork-shaped torsional mode quartz crystal device 500 may be bonded at one or three or more points.

The fork-shaped torsional mode quartz crystal device 500 may be bonded to the ceramic package substrate 1612 using one or more bonding layers 1624 (FIG. 16B), e.g., a conductive paste layer such as a silver epoxy layer or a conductive silicon-based bonding layer. As described above, the fork-shaped torsional mode quartz crystal device 500 has formed thereon one or more electrode patterns, e.g., first electrode patterns 524, 524' (FIGS. 5A-5E) and second electrode patterns 528, 528' (FIGS. 5A-5E). The bonding of the fork-shaped torsional mode quartz crystal device 500 on the ceramic package substrate 1612, e.g., on the mounting pedestals 1620 may be performed by bonding the electrode pattern formed thereon, mechanically and/or electrically, to a metallization structure formed on the ceramic package substrate 1612, e.g., on the mounting pedestals 1620. For example, the metallization structure of the ceramic package substrate 1612 and the electrode pattern on the quartz crystal device 500 may comprise gold, such that a bonding layer 1624 formed therebetween contacts gold on both sides. Referring to FIG. 16B, the fork-shaped torsional mode quartz crystal device 500 may be hermetically sealed by bonding the lid 1608 on rims of the ceramic package substrate 1612 using a substrate bonding layer 1628.

Figure 17A:
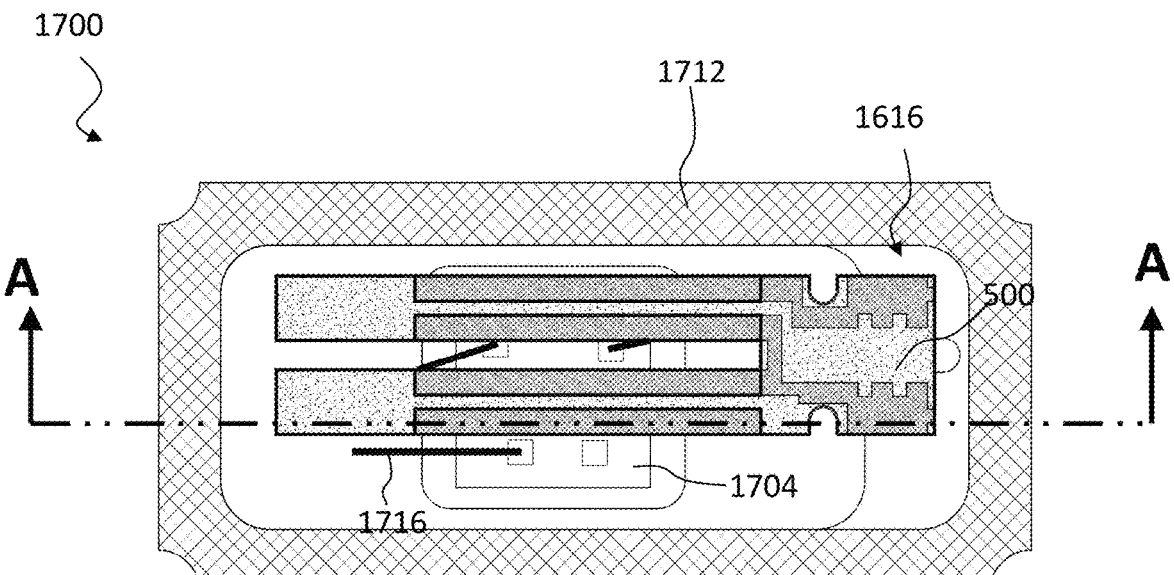
FIG. 17A illustrates a plan-view of a quartz crystal oscillator device comprising a fork-shaped quartz crystal device packaged in a ceramic package substrate, according to embodiments.
Figure 17B:
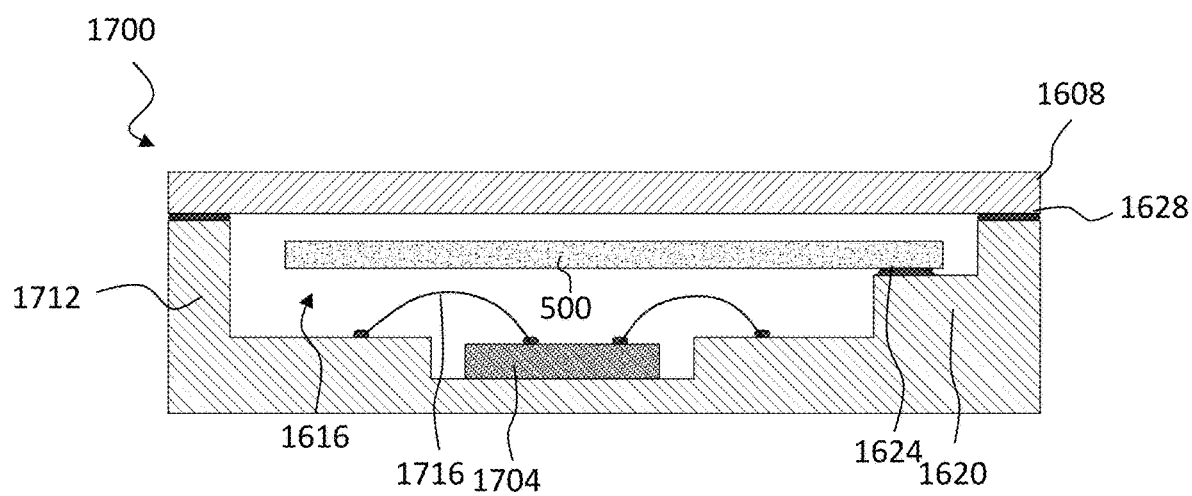
FIG. 17B illustrates a cross-sectional view of the packaged quartz crystal oscillator device illustrated in FIG. 17A.

FIG. 17A illustrates a plan-view of a packaged quartz crystal oscillator device 1700 comprising a fork-shaped quartz crystal device 500 packaged in a ceramic package, according to some embodiments. FIG. 17B illustrates a cross-sectional view of the packaged quartz crystal oscillator device 1700 illustrated in FIG. 17A, which includes the fork-shaped quartz crystal device 500 enclosed, e.g., hermetically sealed, in the ceramic package illustrated in FIG. 17A, in a similar manner as described above with respect to FIGS. 16A and 16B. The ceramic package includes a ceramic package substrate 1712 and a lid 1608 for housing the quartz crystal device 500 according to various embodiments described above. The fork-shaped quartz crystal device 500 may be packaged using a two-point bonding method similar to the packaged quartz crystal device described above with respect to FIGS. 16A-16B, e.g., using a bonding layer 1624 formed of conductive paste, in a similar manner as described above with respect to FIGS. 16A and 16B. In addition, in the illustrated embodiment, an integrated circuit (IC) die 1704 comprising control circuitry for controlling, e.g., providing oscillation signals to, the quartz crystal device 500, is additionally bonded to the ceramic substrate 1712 using a bonding layer 1624. The IC 1704 may be electrically connected to the metallization structures formed in the ceramic package substrate 1712 through one or more wires 1716 bonded therebetween. The metallization structures may in turn be electrically connected the fork-shaped quartz crystal device 500 through one or more metallization structures formed in the ceramic package substrate 1712. The metallization structures formed in the ceramic package substrate 1712 may in turn provide thermal and electrical communication between the quartz crystal device 500 and the IC 1704 and the outside world, e.g., a PCB (not shown).

In some embodiments, the IC die 1704 is disposed at a different vertical level from the fork-shaped quartz crystal device 500. For example, in the illustrated embodiment, the IC die 1704 is disposed below the fork-shaped quartz crystal device 500 and laterally overlaps the IC die 1704 for compact packaging. However, embodiments are not so limited. For example, in other implementations, the fork-shaped quartz crystal device 500 may be formed below the IC die 1704. In yet other implementations, the fork-shaped quartz crystal device 500 and the IC die 1704 may be laterally adjacently disposed to each other at similar vertical levels. Advantageously, the fork-shaped quartz crystal device 500 and the integrated circuit die 1704 can be processed simultaneously, including co-sintering the bonding layers for bonding the fork-shaped quartz crystal device 500 and the IC die 1704.

Figure 18A:
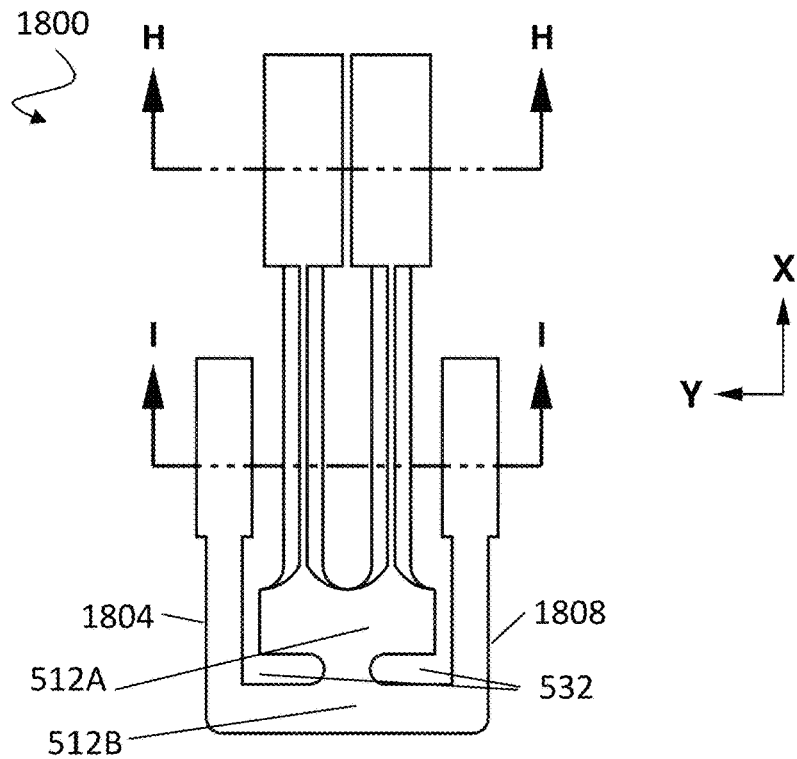
FIG. 18A schematically illustrates a plan view of a main (top) surface of a fork-shaped torsional mode quartz crystal device comprising a mesa structure and vibration isolation arms, according to embodiments.
Figure 18B:
FIG. 18B schematically illustrates a cross-sectional view of the fork-shaped torsional mode quartz crystal device illustrated in FIG. 18A at tip regions of the tines.
Figure 18C:
FIG. 18C schematically illustrates a cross-sectional view of the fork-shaped torsional mode quartz crystal device illustrated in FIG. 18A at a midsection of the tines and tip regions of the vibration isolation arms.

FIGS. 18A-18C schematically illustrate various views of a fork-shaped torsional mode quartz crystal device 1800, according to embodiments. The quartz crystal device 1800 has a front side 518 having a first main surface, e.g., a front surface, and a rear side 520 (FIGS. 18B, 18C) opposite the first side having a second main surface, e.g., a rear surface. FIG. 18A illustrates the first side (e.g., a top side) of the fork-shaped quartz crystal device 1800. FIGS. 18B, 18C illustrate cross-sectional views of the fork-shaped quartz crystal device 1800 taken at cross-sections H-H and I-I, respectively, as illustrated in FIG. 18A. The fork-shaped quartz crystal device 1800 includes features that are similar to corresponding features of the fork-shaped quartz crystal device 500 described above with respect to FIGS. 5A-5E, except for the presence of one or more vibration isolation arms 1804 and 1808, and a detailed description of the similarities may not be repeated herein for brevity. Referring to FIGS. 18A-18C, unlike the fork-shaped quartz crystal device 500 described above with respect to FIGS. 5A-5E in which the first and second base portions 512A, 512B of the base 512 are coextensive in the width (y) direction, in the illustrated embodiment, the second base portion 512B below the notches 532 further extend in both horizontal (x) directions to form a pair of vibration isolation arms 1804, 1808. When present, the vibration isolation arms 1804, 1808 can reduce the amount of vibration leakage from the first and second tines 514, 516 to the base 512, such that the quartz crystal device 1800 vibrates with increased efficiency and/or with higher quality factor. Each of the vibration isolation arms 1804, 1808 comprises a horizontal portion extending in a first direction, e.g., the y-direction, from the second base portion 512B and a vertical portion that forms a right angle with the horizontal portion and extends in a second direction different from the first direction, e.g., the x-direction. In the illustrated embodiment, the distal end of the vertical portion is connected to a tip region that may be wider than the vertical portion. Other suitable shapes and configurations of the vibration isolation arms 1804, 1808 are possible. For example, the vibration isolation arms 1804, 1808 may have horizontal portions but not the vertical portions. In addition, the angle between the horizontal and vertical portions can be any suitable angle. In addition, the tip region can have shapes other than the rectangular shape in plan-view as illustrated in FIG. 18A. For example, the tip region can have any polygonal and curved shapes. In addition, referring to FIG. 18C, while in the illustrated embodiment, the vibration isolation arms 1804, 1808 generally have similar thickness as the first and tines 514, 516, embodiments are not so limited, and the vibration isolation arms 1804, 1808 can be thicker or thinner than the first and second tines. In addition, while in the illustrated embodiment, the vibration isolation arms 1804, 1808 generally have a rectangular similar thickness as the first and tines 514, 516, embodiments are not so limited, and the vibration isolation arms 1804, 1808 can be thicker or thinner than the first and second tines. In addition, the tip region can have shapes other than the rectangular shape in cross-sectional view as illustrated in FIG. 18C. For example, the tip region can have any polygonal and curved shapes.

Figure 19A:
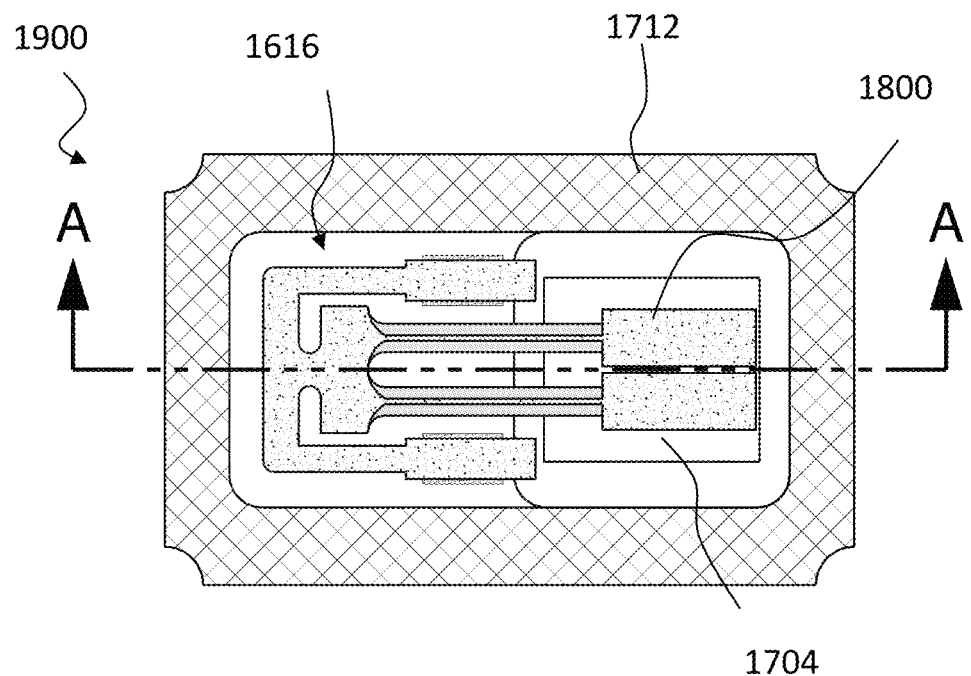
FIG. 19A illustrates a plan-view of a quartz crystal oscillator device comprising a fork-shaped quartz crystal device packaged in a ceramic package substrate, according to embodiments.
Figure 19B:
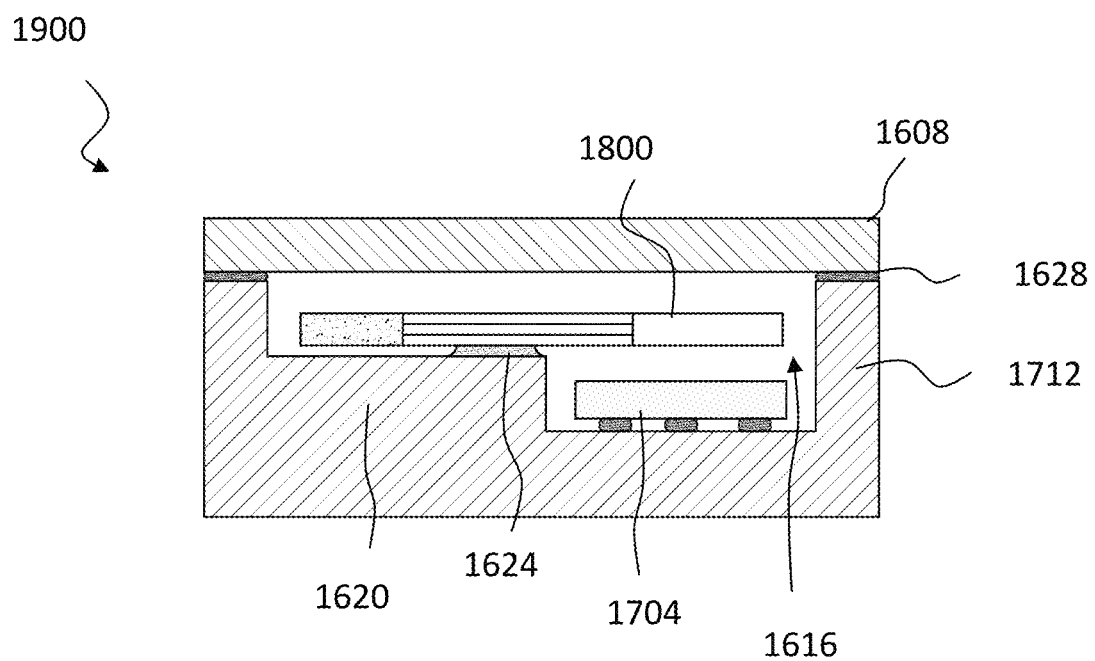
FIG. 19B illustrates a cross-sectional view of the packaged quartz crystal oscillator device illustrated in FIG. 19A.

FIG. 19A illustrates a plan-view of a fork-shaped quartz crystal oscillator device 1900 packaged in a ceramic package substrate, according to some embodiments. FIG. 19B illustrates a cross-sectional view of the packaged quartz crystal oscillator device 1900 illustrated in FIG. 19A, which includes the fork-shaped quartz crystal device 1900 enclosed, e.g., hermetically sealed, in the ceramic package illustrated in FIG. 19A, in a similar manner as described above with respect to FIGS. 16A and 16B. The packaged quartz crystal oscillator device 1900 is similar to the packaged quartz crystal oscillator device described above with respect to FIGS. 17A-17B, and the similarities may not be repeated herein for brevity. Unlike the device described above with respect to FIGS. 17A-17B, the fork-shaped quartz crystal device packaged in the ceramic package is the fork-shaped torsional mode quartz crystal device 1800 described above with respect to FIGS. 18A-18C having one or more vibration isolation arms. The fork-shaped quartz crystal device 1800 the integrated circuit (IC) die 1704 may be bonded to the ceramic substrate 1712 and interconnected to each other and connected to the outside world in a similar manner as described above with respect to FIGS. 17A-17B.

Torsional Mode Quartz Crystal Device Having a Groove Structure

According to various embodiments described above, a fork-shaped torsional mode quartz crystal can have a mesa structure for improved torsional mode vibration. In the following, an alternative design of the torsional mode quartz crystal is described, with similar advantages. In the alternative design, a fork-shaped quartz crystal comprises a pair of elongate tines laterally extending from a base region in a horizontal lengthwise direction of the fork-shaped quartz crystal. Each of the tines has formed on one or both of opposing sides thereof a pair of vertically recessed groove structures laterally elongated in the horizontal lengthwise direction. The pair of groove structures are separated in a horizontal widthwise direction by a line structure. In a similar manner as the quartz crystal having a mesa structure, a first electrode and a second electrode are formed on the one or both of the opposing sides of each of the tines and configured such that, when an electrical bias is applied between the first and second electrodes, the fork-shaped quartz crystal vibrates in a torsional mode in which each of the tines twists about a respective axis extending in the horizontal lengthwise direction.

In the following, features illustrated with the same reference numerals as those described above in reference to the quartz crystal having a mesa structure can have the same or corresponding structural features, unless otherwise stated.

Figures 20A, 20B:
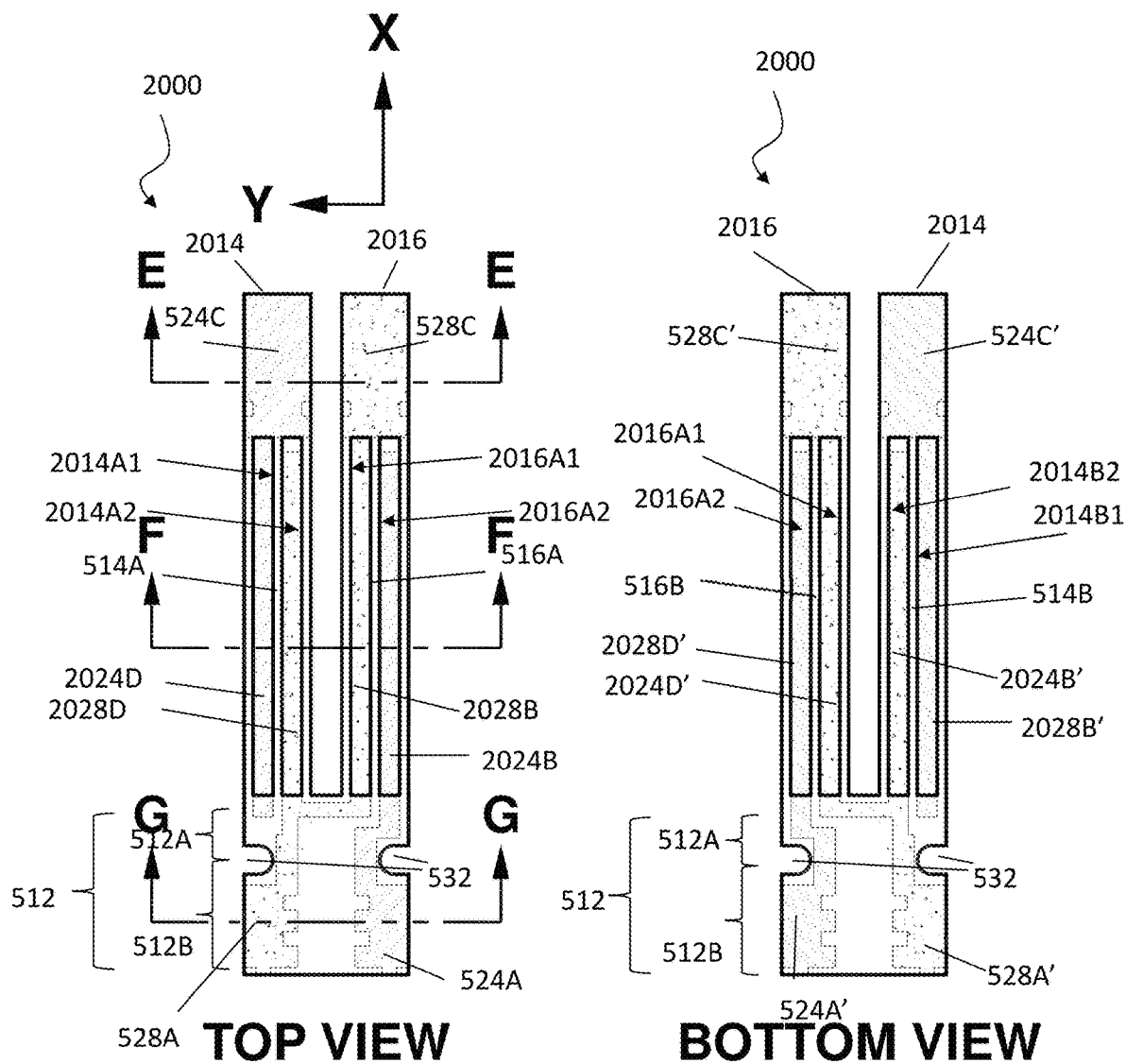
FIG. 20A schematically illustrates a plan view of a first main (top) surface of a fork-shaped torsional mode quartz crystal device comprising a groove structure, according to embodiments.
FIG. 20B schematically illustrates a plan view of a second main (bottom) surface of the fork-shaped torsional mode quartz crystal device illustrated in FIG. 20A.
Figure 20C:
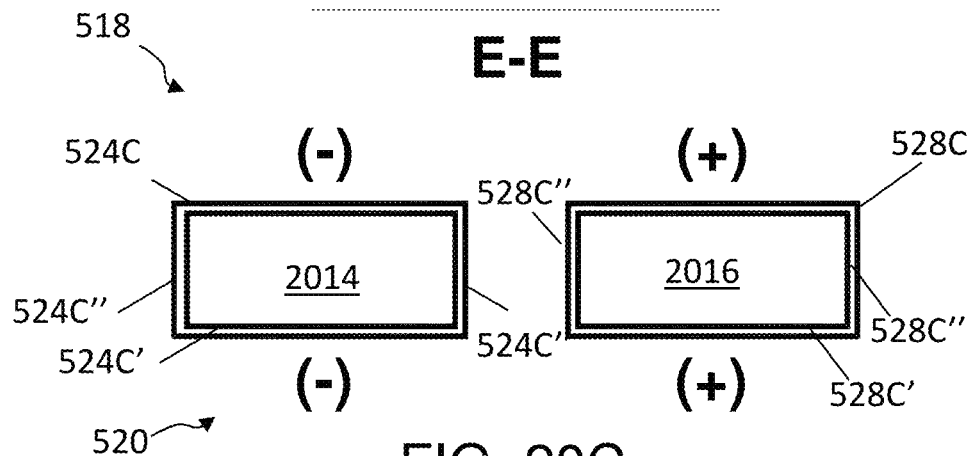
FIG. 20C schematically illustrates a cross-sectional view of the fork-shaped torsional mode quartz crystal device illustrated in FIGS. 20A and 20B at tip regions of the tines.
Figure 20D:
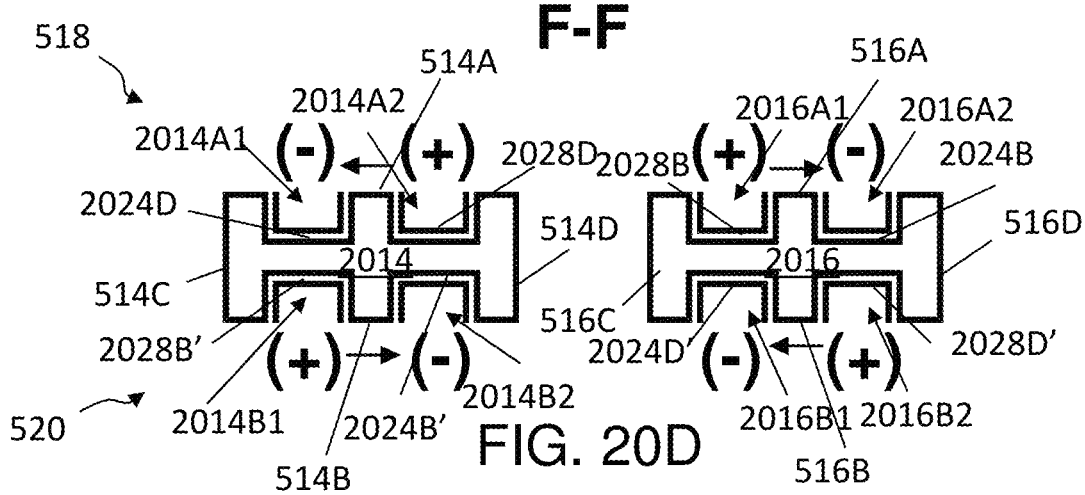
FIG. 20D schematically illustrates a cross-sectional view of the fork-shaped torsional mode quartz crystal device illustrated in FIGS. 20A and 20B at midsections of the tines.
Figure 20E:
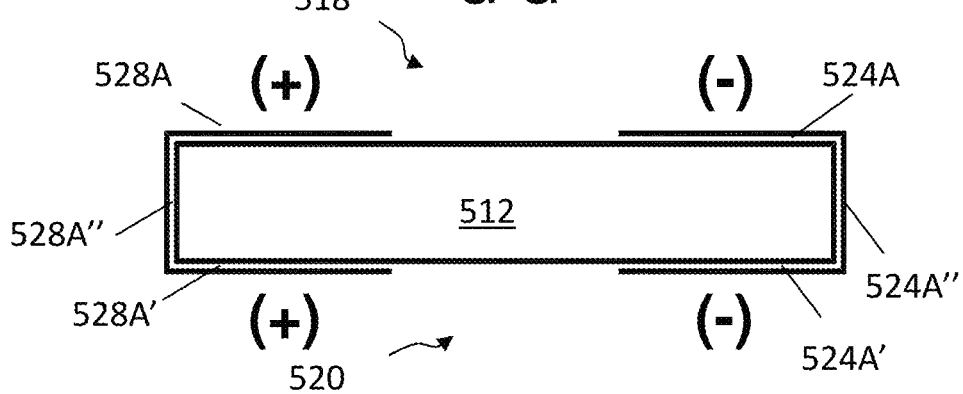
FIG. 20E schematically illustrates a cross-sectional view of the fork-shaped torsional mode quartz crystal device illustrated in FIGS. 20A and 20B at a base region.

FIGS. 20A-20E schematically illustrate various views of a fork-shaped torsional mode quartz crystal device 2000 comprising a groove structure, according to embodiments. The quartz crystal device 2000 has a first or front side 518 (FIGS. 20A, 20C-20E) having a first or front main surface, and a second or rear side 520 (FIGS. 20B, 20C-20E) opposite the first or front side having a second or rear main surface. FIGS. 20A and 20B illustrate a first or front side and a second side or bottom side of the fork-shaped quartz crystal device 2000, respectively. FIGS. 20C, 20D and 20E illustrate cross-sectional views of the quartz crystal device 2000 taken at cross-sections E-E, F-F, and G-G, respectively, as illustrated in FIG. 20A. Some features of the fork-shaped quartz crystal device 2000 comprising a groove structure are similar or correspond to analogous features of the fork-shaped quartz crystal device 500 having a mesa structure described above with respect to FIGS. 5A-5E, and a detailed description of some of the similarities may not be repeated herein for brevity.

In a similar manner as described above with respect to FIGS. 5A-5E, the fork-shaped quartz crystal device 2000 comprises a base 512, a first tine 2014 projecting from the base 512 and extending generally along a lengthwise direction, e.g., X-axis, and a second tine 2016 projecting from the base 512 and extending generally along the same lengthwise direction. Referring to the G-G cross section of FIGS. 20A and 20E, the base 512 of the device 2000 is configured to be substantially similar or to the corresponding base 512 of the device 500 (FIGS. 5A, 5E). The first tine 2014 and the second tine 2016 can be generally parallel to one another. In the illustrated configuration, one or both of the first and second tines 2014, 2016 have a substantially uniform width along respective lengths. However, embodiments are not limited and in other configurations, one or both of the first and second tines 2014, 2016 can have uneven or non-uniform widths along the respective lengths. For example, without limitation, one or both of the first and second tines 2014, 2016 can be configured such that some portions of the first and/or second tines 2014, 2016 are wider than some other portions thereof, or such that some portions define a linear, curved, or other suitable shaped tapering width along the respective lengths. In various configurations, the centerlines of the first and second tines 2014, 2016 each extending in the x-direction can be generally parallel to each another or generally follow parallel paths. While in the illustrated configuration, the quartz crystal device 2000 has a pair of tines 2014, 2016, embodiments are not so limited and in some other configurations, any of the quartz crystal devices disclosed herein can have a fewer or greater number of tines projecting from the base 512. For example, in some configurations, without limitations, any of the quartz crystal devices disclosed herein can have four or more tines projecting from the base, where any number of the tines are configured to vibrate at least in a torsional mode.

Referring to FIGS. 20A/20B and 20C, the E-E cross-section illustrates that the tip portions of each of the first and second tines 2014, 2016 are configured to be similar to the corresponding top portions of the device 500 (FIGS. 5A, 5C)

Referring to FIGS. 20A/20B and 20D, the F-F cross-section illustrates that, unlike the device 500 (FIGS. 5A-5E), each of the first and second tines 2014, 2016 of the quartz crystal device 2000 comprises a mid-section portion in which each of the first and second tines 2014, 2016 comprises a pair of groove structures formed on or as part of one or both of opposing main surfaces on the first and second sides 518, 520. In the mid-section, the first tine 2014 comprises a first side on which a first pair of vertically recessed grooves 2014A1, 2014A2 is formed as part of a first pair of groove structures. As described herein, a groove may alternatively referred to as a recess or a trench. The first tine 2014 additionally comprises, on a second side opposite the first side, a second pair of vertically recessed grooves 2014B1, 2014B2 formed as part of a second pair of groove structures. The first pair of grooves 2014A1, 2014A2 and the second pair of grooves 2014B1, 2014B2 extend in the lengthwise direction of the first and second tines 2014, 2016, e.g., the x-direction. On one end, the first grooves 2014A1, 2014A2 and the second grooves 2014B1, 2014B2 terminate adjacent to respective terminal end portions of the first and second tines 2014, 2016, respectively. On the other end, the first grooves 2014A1, 2014A2 and second grooves 2014B1, 2014B2 terminate adjacent to connected end portions of the first and second tines 2014, 2016, or to the base 512. Each pair of groove structures are separated in a horizontal widthwise direction (y-direction) by a line structure. It will be appreciated that the line structure can be analogous to the line structure that forms a mesa structure as described above with respect to FIGS. 5A-5E. On the first side 518, the first grooves 2014A1, 2014A2 are separated by a first line structure 514A, which can configured similar to the corresponding structure in the device 500 (FIGS. 5A-5E). Similarly, on the second side 520, the second grooves 2014B1, 2014B2 are separated by a second line structure 514B, which can configured similar to the corresponding structure in the device 500 (FIGS. 5A-5E). Each of the pair of groove structures is formed by the line structure and another line structure separated from the line structure in the widthwise direction by the respective one of the groove structures. That is, on the first side 518, the first pair of grooves 2014A1, 2014A2 are formed by three line structures 514A, 514C, 514D that extend in a lengthwise direction, the x-direction, and are separated in a widthwise direction, e.g., the y-direction. The line structure 514A forms the middle one of the three line structures and laterally divides the first grooves 2014A1, 2014A2 in the widthwise direction. Similarly, on the second side 520, the second pair of grooves 2014B1 and 2014B2 are formed by three line structures 514A, 514B, 514D that extend in the lengthwise direction, and are separated in the widthwise direction. The line structure 514B forms the middle one of the three line structures and laterally divides the second grooves 2014B1, 2014B2 in the widthwise direction.

In an analogous manner, the second tine 2016 comprises a first side 518 on which a first pair of vertically recessed grooves 2016A1, 2016A2 is formed, and a second side 520 opposite the first side on which a second pair of vertically recessed grooves 2016B1, 2016B2 is formed. The arrangement of the first grooves 2016A1, 2016A2 and the second grooves 2016B1, 2016B2 of the second tine 2016 is analogous to those of the first grooves 2014A1, 2014A2 and the second grooves 2014B1, 2014B2 of the first tine 2014, and their detailed description is omitted herein for brevity.

In the illustrated embodiment, the top and bottom surfaces of the first and second tines 2014, 2016 shown in the sectional view F-F (FIG. 20D) are coplanar with corresponding top and bottom surfaces of the adjacent base 512 shown in the sectional view G-G (FIG. 20C) and top and bottom surfaces of the tip portions of the first and second tines 2014, 2016 shown in the sectional view E-E (FIG. 20C). However, embodiments are not so limited and in other implementations, the top surfaces of the sectional view F-F may be higher or lower relative to the top surfaces of the sectional views E-E and G-G.

Still referring to FIGS. 20A-20E, in the illustrated embodiment, each of the first and second pairs of grooves 2014A1/2014A2, 2014B1/2014B2 of the first tine 2014 and the first and second pairs of grooves 2016A1/2016A2, 2016B1/2016B2 of the second tine 2016 has sidewalls that may be generally parallel to each other and generally perpendicular to top and bottom surfaces of the tines as shown in the sectional view F-F (FIG. 20D). However, embodiments are not so limited, and in some other embodiments, one or both of the sidewalls may form angles greater or less than 90° with respect to the top and bottom surfaces of the tines. For example, the one or both sidewalls may form 40-50°, 50-60°, 60-70°, 70-80°, 80-90° or an angle in a range formed by any of these values. In addition, when the sidewalls are tapered, one or more of the grooves 2014A1, 2014A2, 2014B1, 2014B2, 2016A1, 2016A2, 2016B1 and 2016B2 may or may not have a bottom surface. Accordingly, in some embodiments, the recesses can have trapezoidal or triangular cross-sectional shapes. In addition, when present, the bottom surface of each of the grooves may or may not be parallel to and/or may be tapered with respect to top and/or bottom surfaces of the respective tine.

Various portions of the quartz crystal device 2000 have surfaces having formed thereon electrode patterns that are collectively configured to vibrate the tines of the fork-shaped quartz crystal device 2000 in a torsional mode. The electrode patterns include a first electrode pattern 2024 of a first polarity, e.g., one of a negative or positive electrode pattern, and a second electrode pattern 2028 of a second polarity, e.g., the other of the negative or positive electrode pattern.

Referring to the first main (top) surface of the fork-shaped quartz crystal device 2000 illustrated in FIG. 20A, the first (e.g., negative) electrode pattern 2024 formed on the top surface includes first to fourth portions 524A, 2024B, 524C, 2024D, respectively, and the second (e.g., positive) electrode pattern 2028 formed on the top surface includes first to fourth portions 528A, 2028B, 528C, 2028D. The first and third portions 524A, 524C of the first electrode pattern 2024 are arranged substantially similar to the corresponding portions of the first electrode pattern 524 of the device 500 (FIGS. 5A-5E), and the first and third portions 528A, 528C of the second electrode pattern 2028 are arranged substantially similar to the corresponding portions of the second electrode pattern 528 of the device 500 (FIGS. 5A-5E). Thus, for brevity, only substantially different arrangements with respect to the second and fourth portions 2024B, 2024D of the first electrode pattern 2024, and the second and fourth portions 2028B, 2028D of the second electrode pattern 2028 are described herein in detail.

Referring to FIG. 20A, the first electrode pattern 2024 comprises a thin strip portion 2024B that extends along a right or outer groove 2016A2 of the second tine 2016 and a thin strip portion 2024D that extends along a left or outer groove 2014A1 of the first tine 2014. Similarly, the second electrode pattern 2028 comprises a thin strip portion 2028B that extends along a left or inner groove 2016A1 of the second tine 2016 and a thin strip portion 2028D that extends along a right or inner groove 2014A2 of the first tine 2014.

The second and fourth portions 2024B, 2024D of the first electrode pattern 2024 connect to first and third portions 524A, 524C thereof in a similar manner as described above with respect to the device 500 (FIGS. 5A-5E), and the second and fourth portions 2028B, 2028D of the second electrode pattern 2028 connect to first and third portions 528A, 528C thereof in a similar manner as described above with respect to the device 500 (FIGS. 5A-5E).

Referring to the second main (bottom) surface of the quartz crystal device 2000 illustrated in FIG. 20B, the first (e.g., negative) electrode pattern 2024' formed on the bottom surface includes first to fourth portions 524A', 2024B', 524C', 2024D' and the second (e.g., positive) electrode pattern 2028' formed on the bottom surface includes first to fourth portions 528A', 2028B, 524C', 2028D'. The first and third portions 524A', 524C' of the first electrode pattern 2024' are arranged substantially similar to the corresponding portions of the first electrode pattern 524' of the device 500 (FIGS. 5A-5E), and the first and third portions 528A', 528C' of the second electrode pattern 2028' are arranged substantially similar to the corresponding portions of the second electrode pattern 528' of the device 500 (FIGS. 5A-5E). Thus, for brevity, only substantially different arrangements with respect to the second and fourth portions 2024B', 2024D' of the first electrode pattern 2024', and the second and fourth portions 2028B', 2028D' of the second electrode pattern 2028' are described herein in detail.

Referring to FIG. 20B, the first electrode pattern 2024' comprises a thin strip portion 2024D' that extends along a right or inner recess 2016A1 of the second tine 2016 and a thin strip portion 2024B' that extends along a left or inner recess 2014B2 of the first tine 2014. Similarly, the second electrode pattern 2024 comprises a thin strip portion 2028D' that extends along a left or outer recess 2016A1 of the second tine 2016 and a thin strip portion 2028B' that extends along a right or outer recess 2014B1 of the first tine 2014.

The second and fourth portions 2024B', 2024D' of the first electrode pattern 2024' connect to first and third portions 524A', 524C' thereof in a similar manner as described above with respect to the device 500 (FIGS. 5A-5E), and the second and fourth portions 2028B', 2028D' of the second electrode pattern 2028' connect to first and third portions 528A', 528C' thereof in a similar manner as described above with respect to the device 500 (FIGS. 5A-5E).

As described above, the fork-shaped torsional mode quartz crystal device 2000 includes various portions of the first electrode pattern 2024 on the first side 518 and the first electrode pattern 2024' on the second side 520 that are connected to each other. Similarly, various portions of the second electrode pattern 2028 on the first side 518 and the second electrode pattern 2028' on the second side 520 are connected to each other. The resulting relative positions of different portions of the first electrode patterns 2024, 2024' and the second electrode patterns 2028, 2028' are further described below with respect to cross-sectional views illustrated in FIGS. 20C-20E.

FIG. 20C illustrates a cross-sectional view of the fork-shaped quartz crystal device 2000, though the section E-E (FIG. 20A) or through terminal end portions of the first and second tines 514, 516. The illustrated features correspond substantially to those illustrated with respect to FIG. 5C, and a corresponding description is omitted for brevity.

FIG. 20E illustrates a cross-sectional view of the quartz crystal device 2000 though the section G-G (FIG. 20A) at the terminal end portion of the base 512. The illustrated features correspond substantially to those illustrated with respect to FIG. 5E, and a corresponding description is omitted for brevity FIG. 20D illustrates a cross-sectional view of the fork-shaped quartz crystal device 2000 comprising a groove structure through the section F-F (FIG. 20A) at midsections the first and second tines 2014, 2016. The first tine 2014 has a first main surface on the first side 518 having formed thereon the fourth strip portion 2024D of the first electrode pattern 2024 on inner surfaces of the outer groove 2014A1 and the fourth strip portion 2028D of the second electrode pattern 2028 on the inner surfaces of the inner groove 2014A2. The first tine 2014 additionally has a second main surface on the second side 520 having formed thereon the second strip portion 2024B' of the first electrode pattern 2024' on the inner surfaces of the inner groove 2014B2, and the second strip portion 2028B' of the second electrode pattern 2028' formed on the inner surfaces of the outer groove 2014B1. Thus configured, the first and second main surfaces of the first tine 2014 comprise the pair of grooves 2014A1, 2014A2 and the pair of grooves 2014B1, 2014B2, respectively, which define the topography of the electrode patterns formed thereon. For example, each of the portions 2024D, 2024B' of the first electrode pattern 2024/2024' and each of the portions 2028D, 2028B' of the second electrode pattern 2028/2028' comprises portions, e.g., vertical portions, that cover at least portions, e.g., substantially all, of the sidewalls, and a horizontal portion that extends to cover at least a portion, e.g., substantially all, of a bottom surface of the of the respective one of the grooves 2014A1, 2014A2, 2014B1 and 2014B2. Similarly, the first and second main surfaces of the second tine 2016 comprise the pair of grooves 2016A1, 2014A2 and the pair of grooves 2016B1, 2016B2, respectively, which define the topography of the electrode patterns formed thereon. For example, each of the portions 2024B, 2024D' of the first electrode pattern 2024/2024' and each of the portions 2028B, 2028D' of the second electrode pattern 2028/2028' comprises portions, e.g., vertical portions, that cover at least portions, e.g., substantially all, of the sidewalls, and a horizontal portion that extends to cover at least a portion, e.g., substantially all, of a bottom surface of the of the respective one of the grooves 2016A1, 2016A2 and 2016B1, 2016B2.

Thus formed, the fourth strip portion 2024D of the first electrode pattern 2024 and the fourth strip portion 2028D of the second electrode pattern 2028 have corresponding vertical portions (e.g., on sidewalls of the first line portion 514A) that overlap and face away from each other in the widthwise horizontal (y) direction, and the second strip portion 2024B' of the first electrode pattern 2024' and the second strip portion 2028B' of the second electrode pattern 2028' have corresponding vertical portions (e.g., on sidewalls of the second line portion 514B) that overlap and face away each other in the horizontal direction, such that the electric field is exerted by the vertical portions in the directions shown by the arrows in a counterclockwise direction. Similarly, the second strip portion 2024B of the first electrode pattern 2024 and the second strip portion 2028B of the second electrode pattern 2028 have corresponding vertical portions (e.g., on sidewalls of the first line portion 516A) that overlap and face away each other in the horizontal (y) direction, and the fourth strip portion 2024D' of the first electrode pattern 2024' and the fourth strip portion 2028D' of the second electrode pattern 2028 have corresponding vertical portions (e.g., on sidewalls of the second line portion 516B) that overlap and face each other in the horizontal (y) direction, such that the electric field is exerted by the vertical portions in the directions shown by the arrows in a clockwise direction.

In addition, the fourth strip portion 2024D of the first electrode pattern 2024 and the second strip portion 2028B' of the second electrode pattern 2028' have corresponding horizontal bottom portions that overlap and face away from each other in the vertical (z) direction, and the second strip portion 2024B' of the first electrode pattern 2024' and the second electrode pattern 2028D of the second electrode pattern 2028 have corresponding horizontal bottom portions that overlap and face away each other in the vertical (z) direction. Similarly, the second strip portion 2024B of the first electrode pattern 2024 and the fourth strip portion 2028D' of the second electrode pattern 2028' have corresponding horizontal bottom portions that overlap and face away each other in the vertical direction, and the fourth strip portion 2024D' of the first electrode pattern 2024' and the second strip portion 2028B of the second electrode pattern 2028 have corresponding horizontal bottom portions that overlap and face away each other in the vertical direction.

Thus configured, when a bias is applied between the first and second electrode patterns 2024 (front side)/2024' (rear side), 2028 (front side)/2028' (rear side), the fork-shaped quartz crystal device 2000 vibrates in a torsional mode in which each of the tines 2014, 2016 twists about the X-axis, e.g., as described above with respect to FIG. 6C.

In operation, electrical pulses having a first (e.g., one of negative or positive) polarity may be applied to the first electrode patterns 2024, 2024' (including the second and fourth strip portions 2024B, 2024D on the front side 518 of the second and first tines 2016, 2014, respectively, and the second and fourth strip portions 2024B', 2024D' on the back side 520 of the first and second tines 2014, 2016, respectively, as illustrated in FIG. 20D). On the other hand, electrical pulses having a second (e.g., the other of negative or positive) polarity may be applied to the second electrode patterns 2028, 2028' (including the second and fourth strip portions 2028B, 2028D on the front side 518 of the second and first tines 2016, 2014, respectively, and to the second and fourth strip portions 2028B', 2028D' on the back side 520 of the first and second tines 2014, 2016, respectively, as illustrated in FIG. 20D). While embodiments are not so limited, the portions of the first electrode patterns 2024, 2024' may be at the same potential, and the portions of the second electrode patterns 2028, 2028' may be at the same potential. In addition, pulses having the first and second polarities may be applied to the quartz crystal device 2000 simultaneously.

When the first and second electrode patterns 2024/2024', 2028/2028' are biased as described herein, the resulting electric field generally follows, e.g., on average, the paths indicated by the arrows in FIG. 20D. Advantageously, compared to the curvilinear electric field paths followed by the respective electrodes illustrated for the quartz crystal device 100 described above with respect to FIGS. 1A and 1B, the electric field paths include direct horizontal paths between the vertical portions of adjacently disposed electrodes of opposite polarities as described above. It will be appreciated that the electric field paths indicated by the arrows between the vertical electrode portions are generally horizontal and in directions that are orthogonal to the electrode surfaces, In addition, the distance traversed by the electric field paths, e.g., the thicknesses of the line structures separating adjacent groove pairs 2014A1/2014A2 and 2014B1, 2014B2 of the first tine 514, and adjacent groove pairs 2016A1/2016A2 and 2016B1/2016B2 of the second tine 516, are substantially smaller than the corresponding paths traversed by the corresponding electric field lines described above with respect to FIG. 1B.

Advantageously, the resulting electric field strength is relatively stronger for a given voltage and/or about the same for a lower voltage, thereby enabling more efficient vibration by twisting the first and second tines 2014, 2016, or torsionally vibrating the fork-shaped quartz crystal device 2000. Thus, relatively lower power may be dissipated in torsionally vibrating the quartz crystal device 2000 compared to quartz crystal devices that are configured differently, e.g., the quartz crystal devices that do not have the groove structures on one or both sides of the tines. In addition, because relatively smaller volume of the quartz substrate is twisted in operation, the inventors have recognized that the mesa structures can substantially reduce the motional resistance ($R_1$), thereby further reducing the energy consumed in operation and increasing the quality factor (Q). As configured, the configuration of the quartz crystal device 2000 can be particularly adapted for lower power and higher precision applications.

Figure 21:
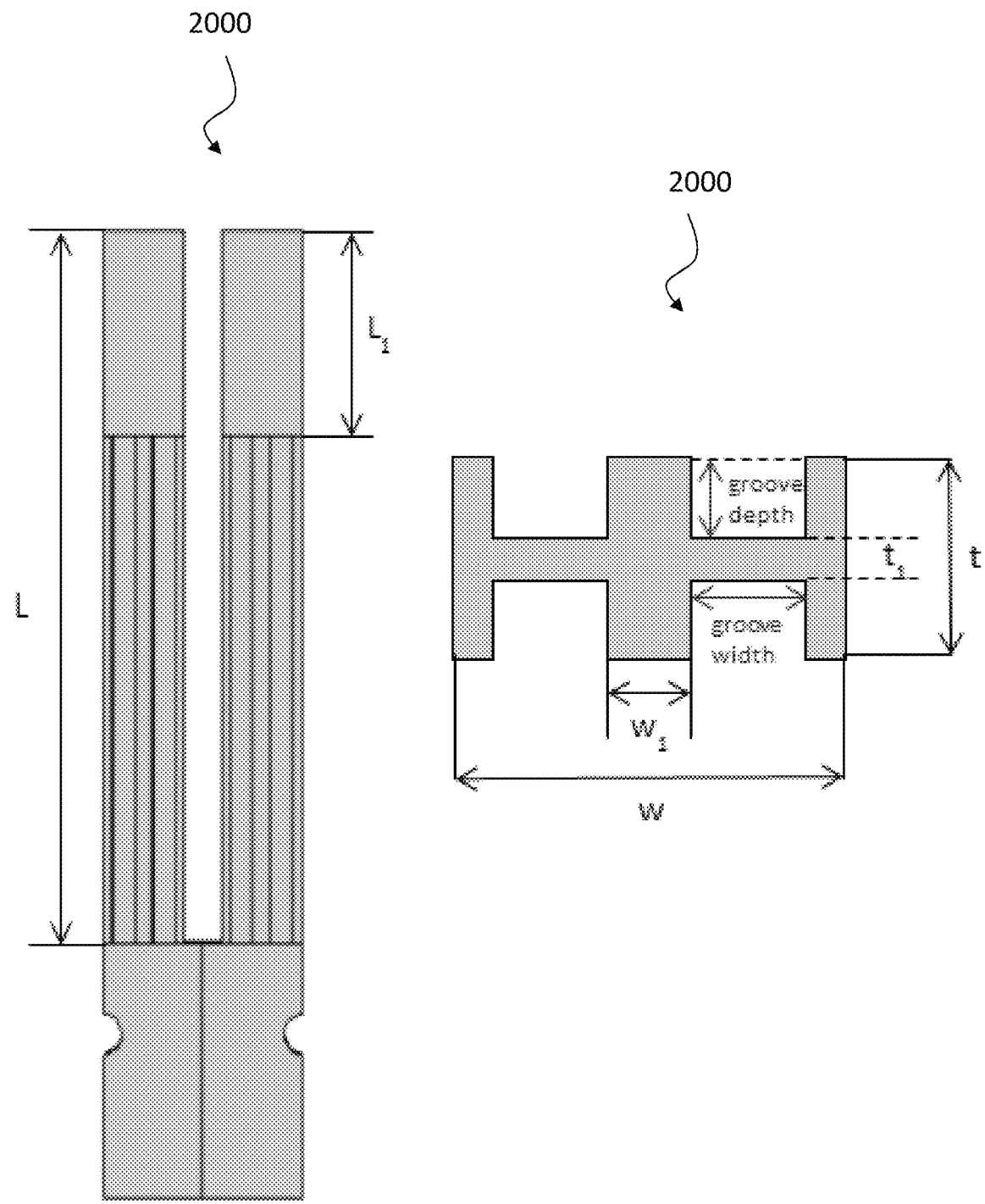
FIG. 21 illustrates a plan view of a main surface, and a cross-sectional view of a tine, of the of the fork-shaped torsional mode quartz crystal device illustrated in FIGS. 20A-20E, annotated with length and thickness parameters.

In the following, selected calculated device parameters are illustrated for fork-shaped torsional mode quartz crystal devices having grooves formed therein, according to embodiments. FIG. 21 illustrates some dimensional parameters of the devices that have been varied to obtain the illustrated results. As illustrated, a thickness ($t_1$) refers to the thickness quartz between vertically opposing grooves formed in a tine and a thickness (t) refers to the overall thickness of the tine. A width ($W_1$) refers to the width of the quartz line structure separating adjacent grooves formed in a tine, and a width (W) refers to the overall width of the tine. A length ($L_1$) refers to the length of the tip regions of the tines excluding the grooves and a length (L) refers to the overall length of a tine including the tip region and the grooves of fork-shaped torsional mode quartz crystal devices, for various embodiments described herein. Unless described otherwise, various parameters of devices having a groove structure including $t_1$, t, $W_1$, W, $L_1$, L and various ratios thereof, can have the same range of values as corresponding parameters of devices having a mesa structure.

Figure 22A:
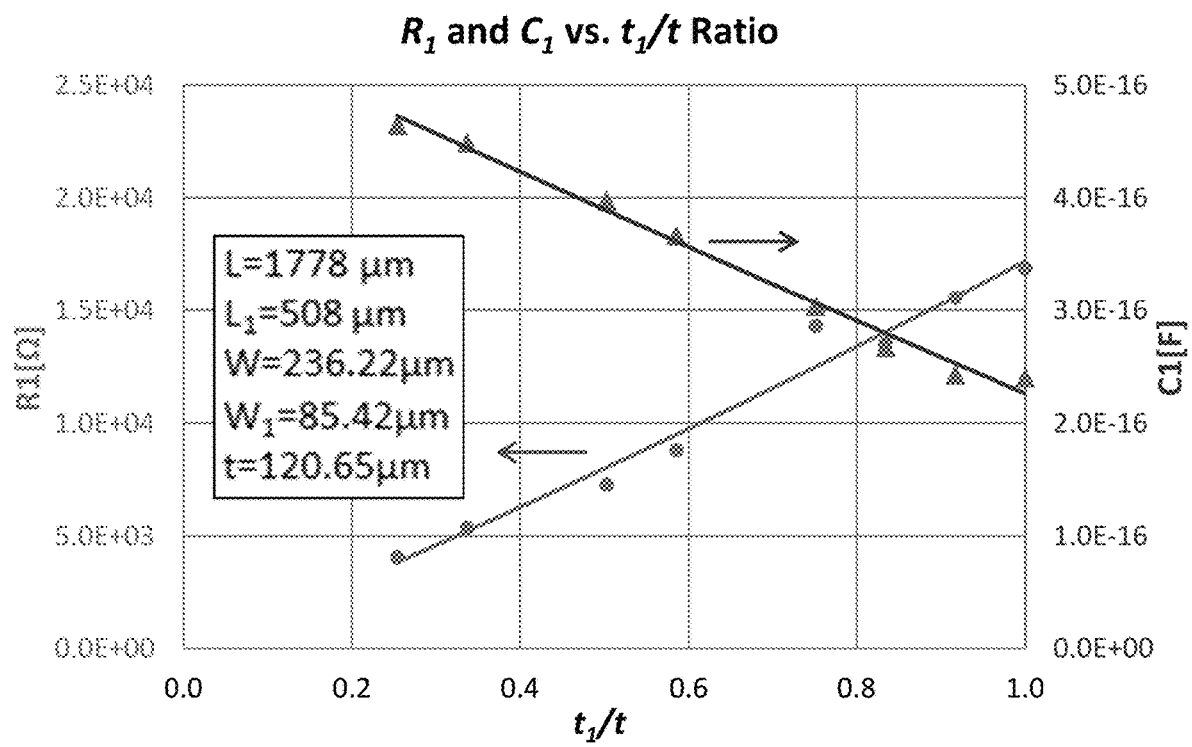
FIG. 22A is a graph illustrating simulated motional resistance and motional capacitance as a function of a ratio of thicknesses between a groove region and an overall thickness of a tine for a fork-shaped torsional mode quartz crystal device comprising a groove structure, according to embodiments.
Figure 22B:
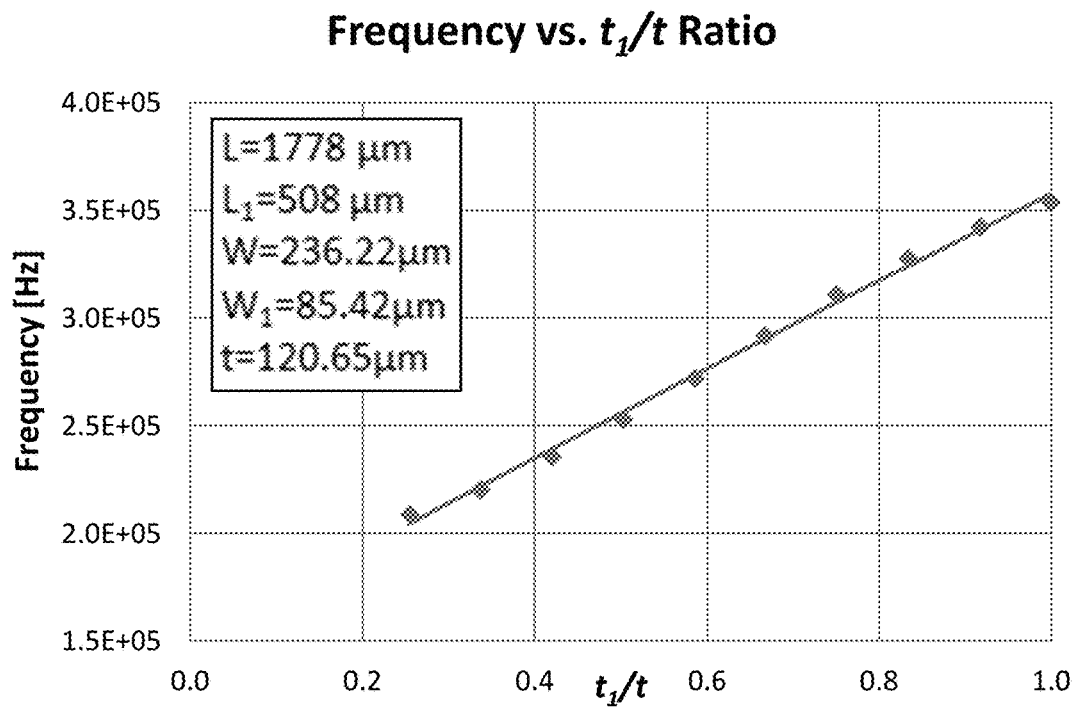
FIG. 22B is a graph illustrating simulated frequency as a function of a ratio of thicknesses between a groove region and an overall thickness of a tine for a fork-shaped torsional mode quartz crystal device comprising a groove structure, according to embodiment.

FIG. 22A is a graph illustrating the motional resistance ($R_1$) and the motional capacitance ($C_1$) as a function of a ratio ($t_1/t$) between a thickness ($t_1$) of the groove region of a tine and a thickness (t) of the overall thickness of the tine of the fork-shaped torsional mode quartz crystal devices, according to embodiments. FIG. 22B is a graph illustrating the frequency as a function of the $t_1/t$ for the fork-shaped torsional mode quartz crystal devices. As illustrated, the $R_1$ can be lowered at a faster rate compared to the rate of increase of the $C_1$ by decreasing the $t_1/t$. According to various embodiments, the $t_1/t$ can be about 0.01-0.2, 0.2-0.4, 0.4-0.6, 0.6-0.8, 0.8-0.99, or have a value in a range defined by any of these values.

Figure 23A:
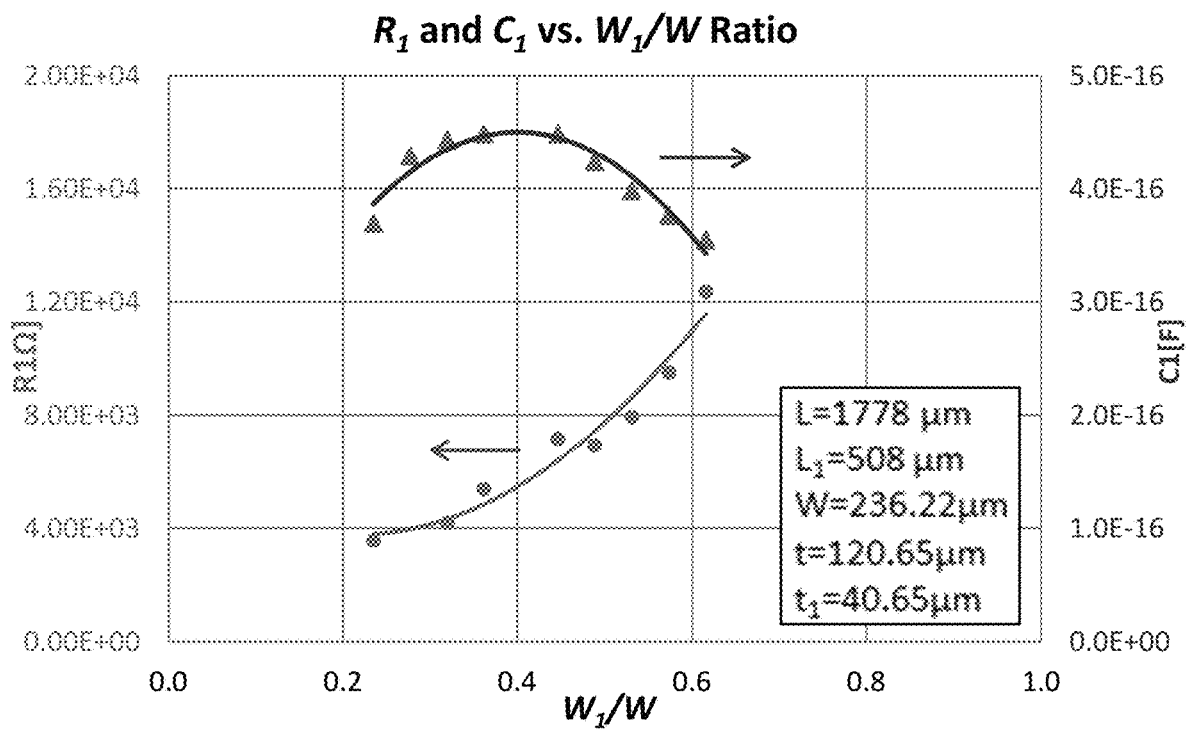
FIG. 23A is a graph illustrating simulated motional resistance and motional capacitance as a function of a ratio between a width of a line separating adjacent grooves and a tine width for a fork-shaped quartz crystal device comprising a groove structure, according to embodiments.
Figure 23B:
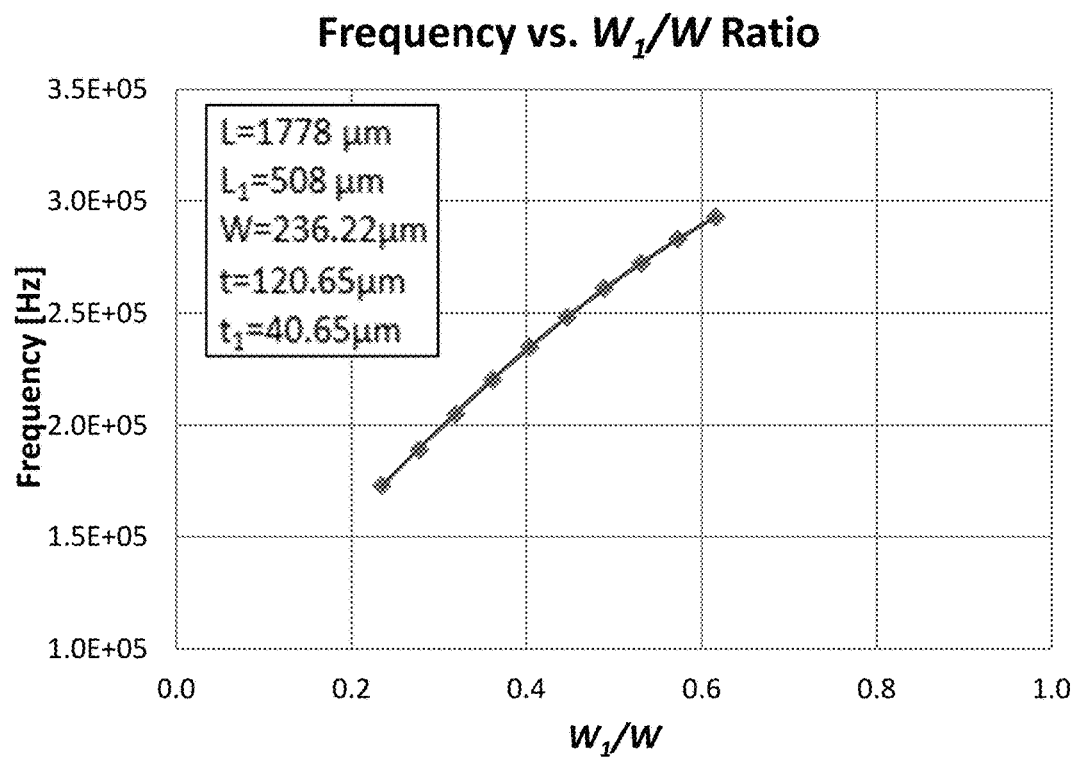
FIG. 23B is a graph illustrating simulated frequency as a function of a ratio of between a line separating adjacent grooves and a tine width for fork-shaped torsional mode quartz crystal device comprising a groove structure, according to embodiments.

FIG. 23A is a graph illustrating the motional resistance ($R_1$) and the motional capacitance ($C_1$) as a function of a ratio ($W_1/W$) between a width ($W_1$) of a line separating adjacent grooves and an overall width (W) of the tines of fork-shaped torsional mode quartz crystal devices comprising a groove structure, according to embodiments. FIG. 23B is a graph illustrating the frequency as a function of the $W_1/W$ for the fork-shaped torsional mode quartz crystal devices comprising a groove structure. As illustrated, the $R_1$ can be lowered at a faster rate compared to the rate of increase of the $C_1$ by decreasing the $W_1/W$. According to various embodiments, the $W_1/W$ can be about 0.01-0.2, 0.2-0.4, 0.4-0.6, 0.6-0.8, 0.8-0.99, or have a value in a range defined by any of these values.

Figure 24A:
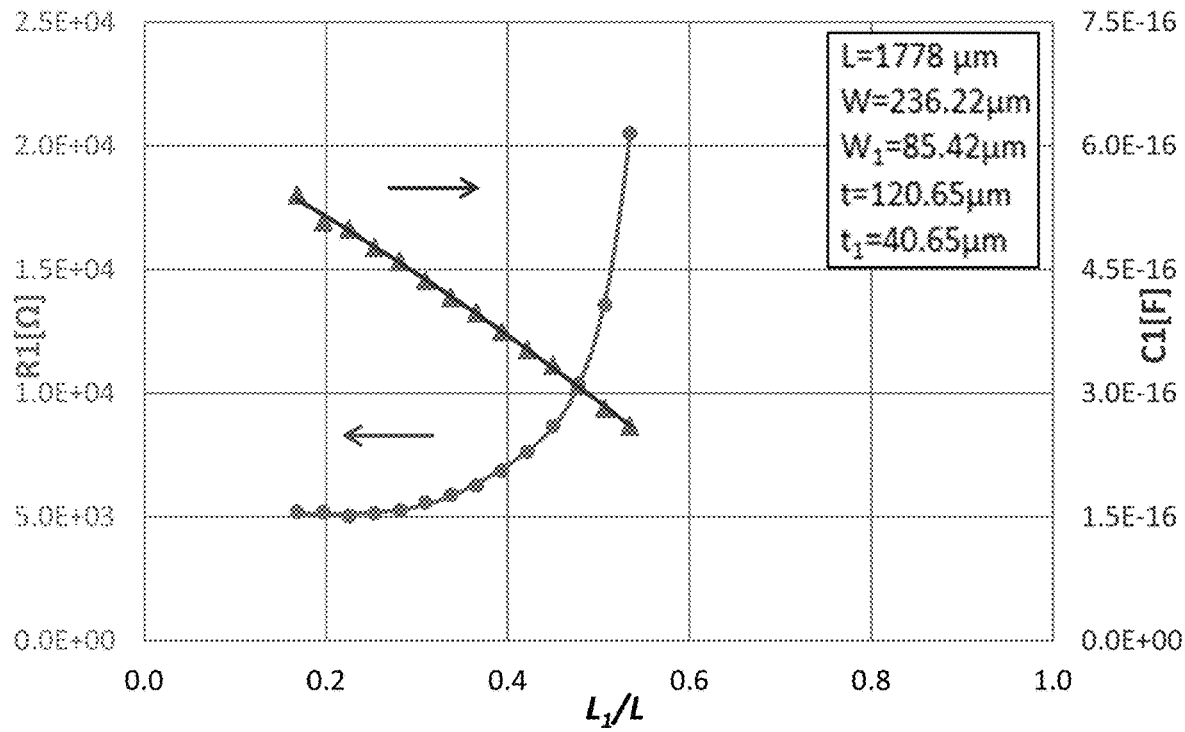
FIG. 24A is a graph illustrating simulated motional resistance and motional capacitance as a function of a ratio between a length of a tip region of a tine excluding the line region a length of the tine including the line region for a fork-shaped torsional mode quartz crystal device comprising a groove structure, according to embodiments.
Figure 24B:
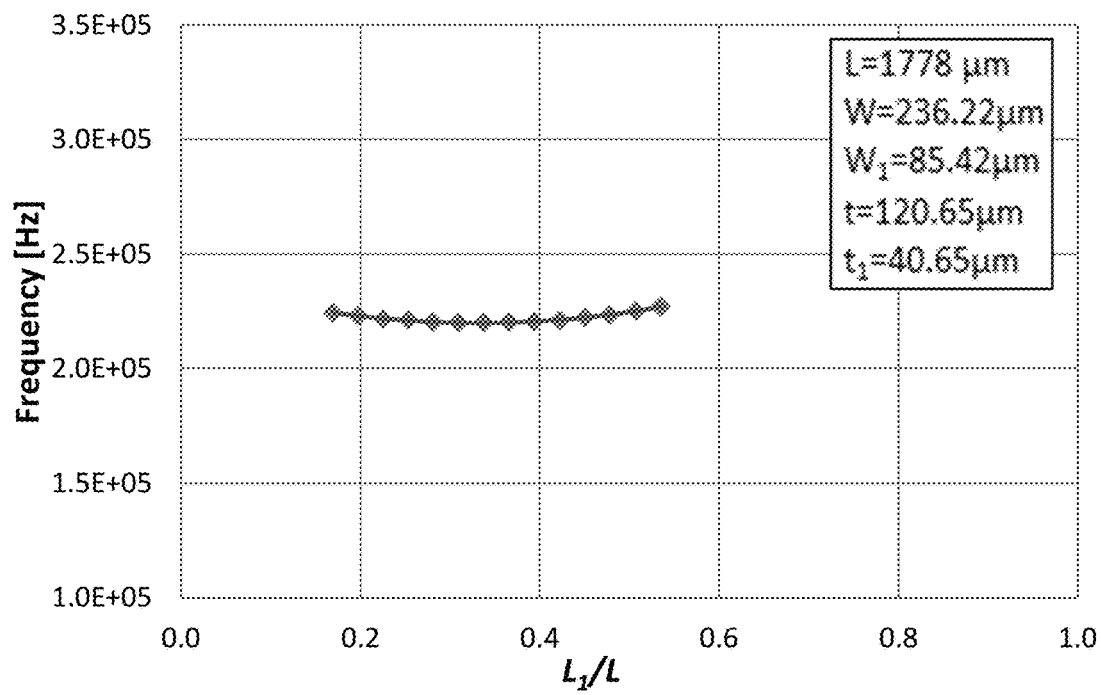
FIG. 24B is a graph illustrating simulated frequency as a function of a ratio between a length of a tip region of a tine excluding the line region a length of the tine including the line region for a fork-shaped torsional mode quartz crystal device comprising a groove structure, according to embodiments.

FIG. 24A is a graph illustrating the motional resistance ($R_1$) and the motional capacitance ($C_1$) as a function of a ratio ($L_1/L$) between a length ($L_1$) of the tip regions of the tines excluding the groove regions and a length (L) of the tines including the tip regions and the line regions for fork-shaped torsional mode quartz crystal devices comprising a groove structure, according to embodiments. FIG. 24B is a graph illustrating the frequency as a function of the $L_1/L$ for the fork-shaped torsional mode quartz crystal devices. As illustrated, the $R_1$ can be lowered at a faster rate compared to the rate of increase of the $C_1$ by decreasing the $L_1/L$ down to about 0.3. According to various embodiments, the $L_1/L$ can be about 0.01-0.2, 0.2-0.4, 0.4-0.6, 0.6-0.8, or have a value in a range defined by any of these values.

Figure 25A:
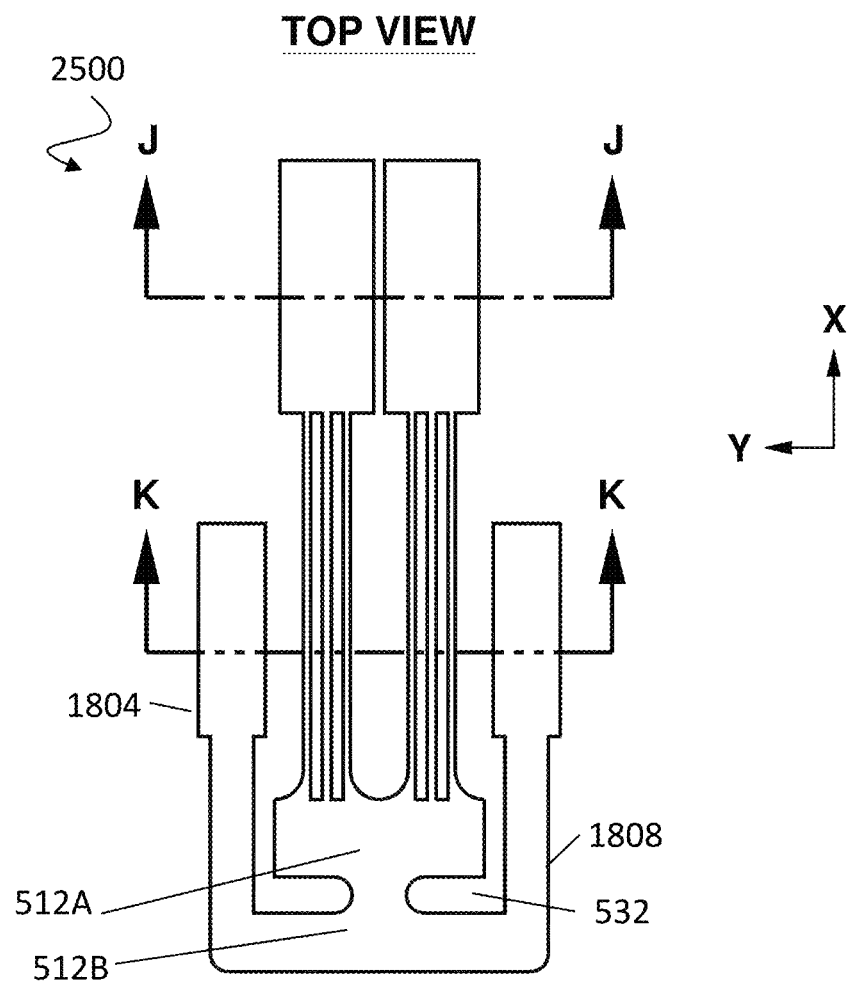
FIG. 25A schematically illustrates a plan view of a main (top) surface of a fork-shaped torsional mode quartz crystal device comprising a groove structure and vibration isolation arms, according to embodiments.
Figure 25B:
FIG. 25B schematically illustrates a cross-sectional view of the fork-shaped torsional mode quartz crystal device illustrated in FIG. 25A at tip regions of the tines.
Figure 25C:
FIG. 25C schematically illustrates a cross-sectional view of the fork-shaped torsional mode quartz crystal device illustrated in FIG. 25A at a midsection of the tines and tip regions of the vibration isolation arms.

FIGS. 25A-25C schematically illustrate various views of a fork-shaped torsional mode quartz crystal device 2500, according to embodiments. FIG. 25A illustrates a first side (e.g., a top side) of the fork-shaped quartz crystal device. FIGS. 25B, 25C illustrate cross-sectional views of the fork-shaped quartz crystal device 2500 illustrated in FIG. 25A, that are taken at cross-sections J-J and K-K, respectively. The fork-shaped quartz crystal device 2500 includes features that are similar to corresponding features of the fork-shaped quartz crystal device 1800 described above with respect to FIGS. 18A-18C. However, unlike the device 1800 (FIGS. 18A-18C), instead of a mesa structure, the first and second tines 2014 and 2016 include a groove structure, as described above with respect to FIGS. 20A-20E. Thus, a detailed description of the features having the same reference numerals are not be repeated herein for brevity.

It will be appreciated that, while a detailed description is not repeated herein for brevity, various packaged torsional mode quartz crystal devices and oscillators comprising a mesa structure described above with respect to FIGS. 16A, 16B, 17A, 17B, 19A, 19B can be similarly implemented with packaged torsional mode quartz crystal devices and oscillators comprising a groove structure as described above with respect to FIGS. 20A-20E and 25A-25C.

Etching Profiles of Torsional Mode Quartz Crystal Devices

In the above disclosure, example cross-sectional shapes of tines having mesa or groove structures for torsional mode quartz crystal devices and oscillators have been described.

Figure 26A:
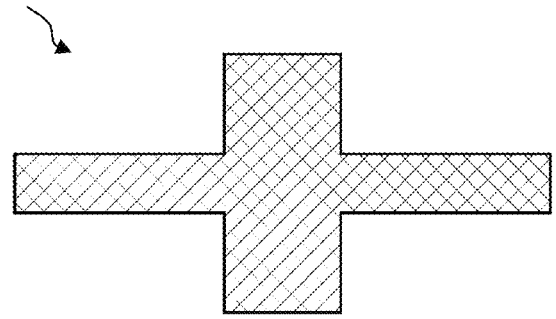
FIGS. 26A-26C schematically illustrate cross-sectional views of differently etched tines for a fork-shaped torsional mode quartz crystal device having a mesa structure, according to embodiments.
Figure 28A:
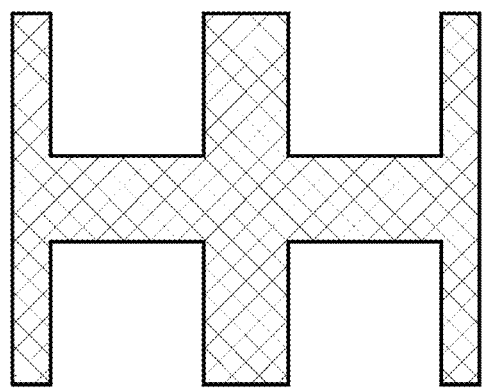
FIGS. 28A-28C schematically illustrate cross-sectional views of differently etched tines for a fork-shaped torsional mode quartz crystal device having a groove structure, according to embodiments.

For example, FIG. 26A illustrates a cross-sectional view of one of the first and second tines 514, 516 of a torsional mode quartz crystal device similar to that illustrated with respect to FIGS. 5A-5E, e.g., the view of C-C cross-section illustrated in FIG. 5D. Similarly, FIG. 28A illustrates a cross-sectional view of one of the first and second tines 2014, 2016 of a torsional mode quartz crystal device similar to that illustrated with respect to FIGS. 20A-20E, e.g., the view of F-F cross-section illustrated in FIG. 20D.

Such structures may be fabricated using a suitable patterning process including masking and etch processes. For example, the masking process may include a lithography process such as optical or imprint lithography processes. The etch process may include a dry or wet etch process. While a dry etch process may be used to fabricate structures such as the ones shown in FIGS. 26A and 28A, cost and throughput may be substantially unfavorable compared to a wet etch process. On the other hand, wet etch processes may generate mesa or groove structures that deviate from those shown in FIGS. 26A and 28A. This is because wet etching crystalline materials such as quartz can lead to etch profiles that are determined in part by different etch rates of different crystal planes of the crystalline material.

Figure 26B:
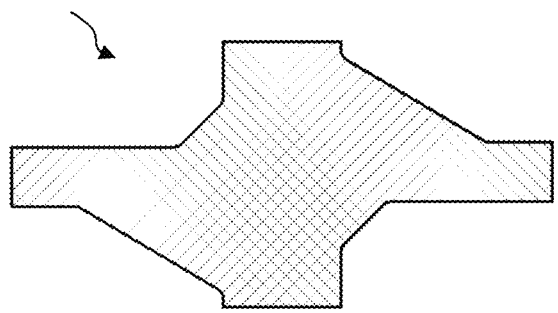
Figure 26C:
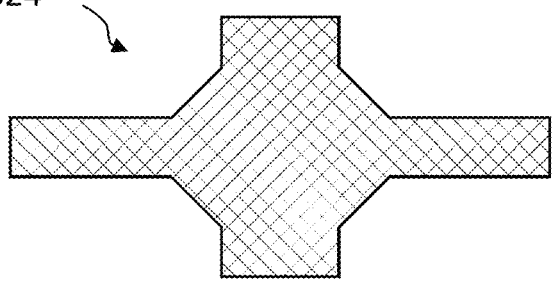
Figure 27:
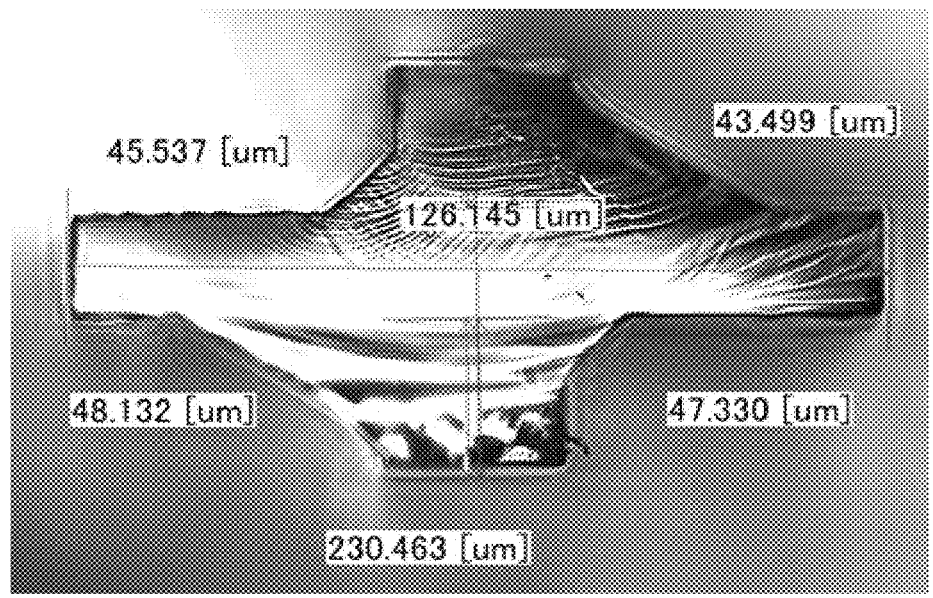
FIG. 27 shows a cross-sectional view of an experimentally fabricated tine for a fork-shaped torsional mode quartz crystal device, according to embodiments.

FIGS. 26B and 26C illustrate cross-sectional views of example tines 2614 and 2624, respectively, of a torsional mode quartz crystal device having a mesa structure. Unlike the etch profile illustrated with respect to FIG. 26A in which the corners formed by vertical and horizontal surfaces of the line structures are relatively sharp, the illustrated tines 2614 and 2624 include one or more corners that are faceted to include surfaces having an angle from horizontal or vertical surfaces. It will be appreciated that the angles and relative areas of the facets relative to vertical and horizontal surfaces can vary relatively widely depending on the dimensions and processes used. Example profiles can include, e.g., those provided in R. Rangsten et al., "Etch Rates of Crystallographic Planes in Z-cut Quartz—Experiments and Simulation," *J. Micromech. Microeng.* 8 (1998) pp. 1-6, which is incorporated by reference it its entirety. Different ones of the corners can have facets having the same or different angles and/or areas. FIG. 27 illustrates a cross-sectional view of an experimentally fabricated tine similar to that illustrated in FIG. 26B.

Figure 28B:
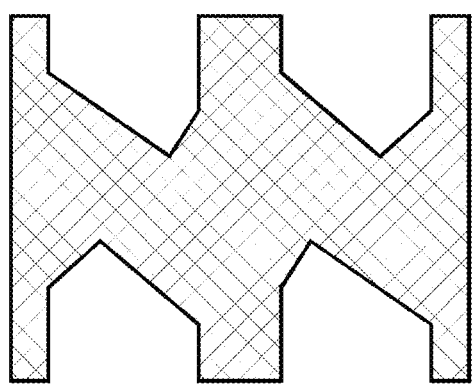
Figure 28C:
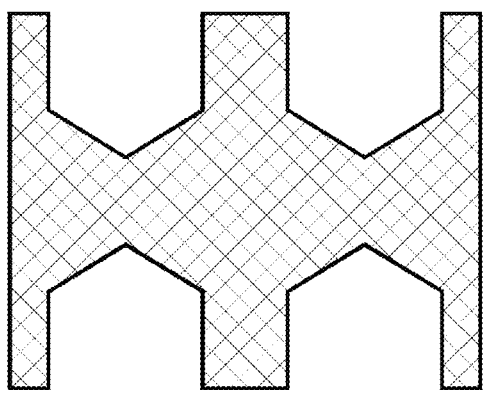

Similarly, FIGS. 28B and 28C illustrate cross-sectional views of example tines 2814 and 2824, respectively, of a torsional mode quartz crystal device having a groove structure. Unlike the etch profile illustrated with respect to FIG. 28A in which the corners formed by vertical and horizontal surfaces of the grooves are relatively sharp, the illustrated tines 2814, 2824 include one or more corners that are faceted to include surfaces having an angle from horizontal or vertical surfaces. Similar to the facet corners of mesa structures, the angles and relative areas of the facets relative to vertical and horizontal surfaces can vary relatively widely depending on the dimensions and processes used.

Figure 29:
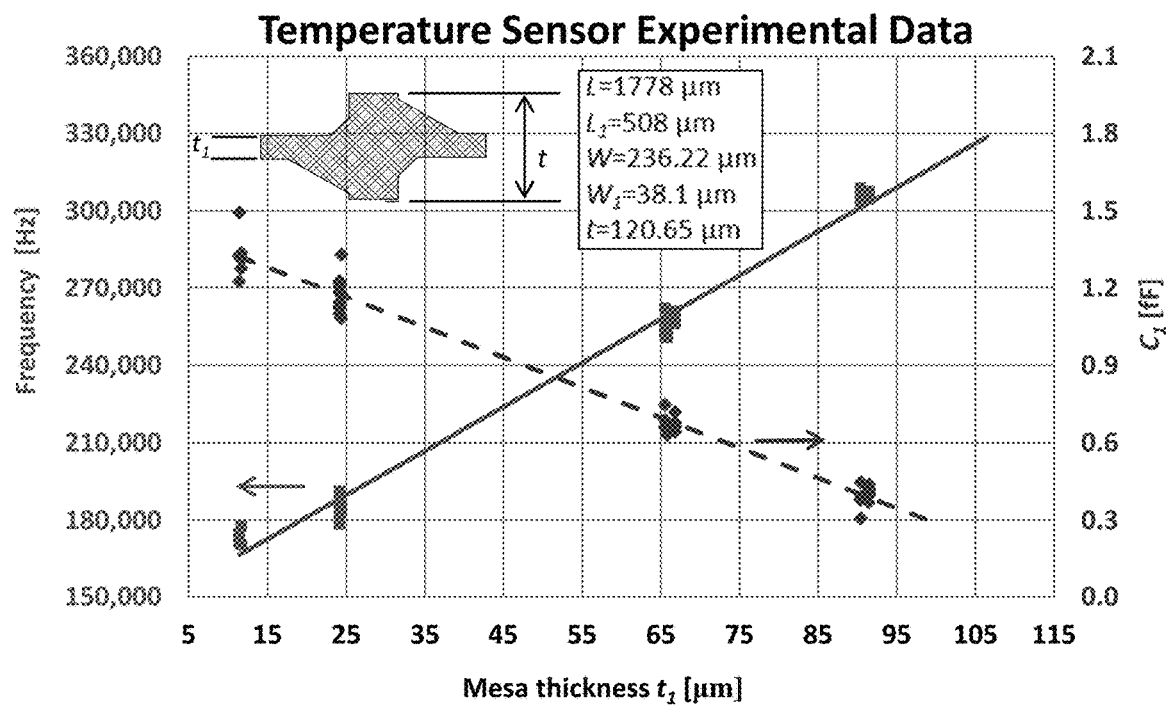
FIG. 29 is a graph illustrating the frequency and the motional capacitance ($C_1$) as a function of thickness parameters for a fork-shaped torsional mode quartz crystal devices comprising a mesa structure with faceted corners, according to embodiments.
Figure 30:
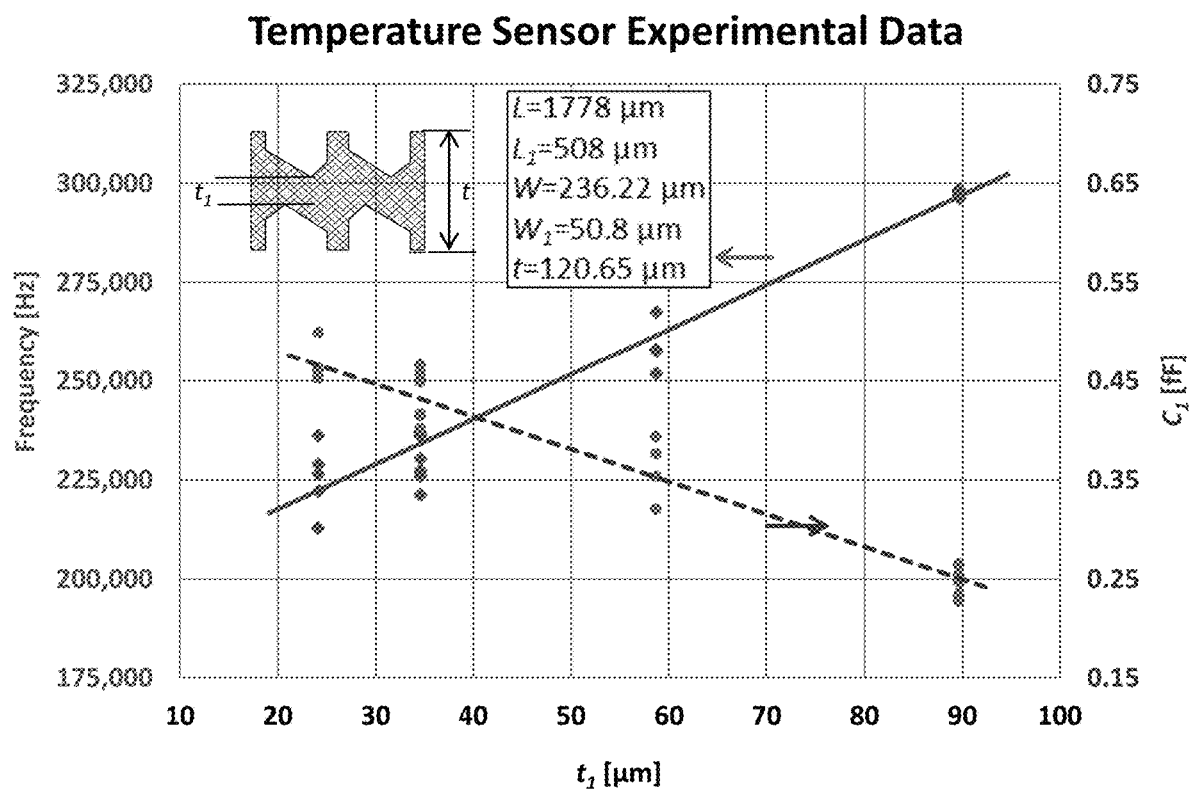
FIG. 30 is a graph illustrating the frequency and the motional capacitance ($C_1$) as a function of thickness parameters for a fork-shaped torsional mode quartz crystal devices comprising a groove structure with faceted corners, according to embodiments.

FIG. 29 is a graph illustrating the frequency and the motional capacitance ($C_1$) as a function of thickness parameters for a fork-shaped torsional mode quartz crystal devices comprising a mesa structure with faceted corners, according to embodiments. As illustrated, the frequency and the $C_1$ can vary inversely as a function of the height of the line structure or the mesa thickness FIG. 30 is a graph illustrating the frequency and the motional capacitance ($C_1$) as a function of thickness parameters for a fork-shaped torsional mode quartz crystal devices comprising a groove structure with faceted corners, according to embodiments. As illustrated, the frequency and the $C_1$ can vary inversely as a function of the height of the line structure or the mesa thickness.

ADDITIONAL EXAMPLES I

1. A quartz crystal device configured for temperature sensing, comprising:
    a fork-shaped quartz crystal comprising a pair of elongate tines laterally extending from a base region in a horizontal lengthwise direction of the fork-shaped quartz crystal, wherein each of the tines has formed on one or both of opposing sides thereof a vertically protruding line structure laterally elongated in the horizontal lengthwise direction; and
    a first electrode and a second electrode formed on the one or both of the opposing sides of each of the tines and configured such that, when an electrical bias is applied between the first and second electrodes, the fork-shaped quartz crystal vibrates in a torsional mode in which each of the tines twists about a respective axis extending in the horizontal lengthwise direction.
2. The quartz crystal device of Example 1, wherein the line structure laterally separates the first electrode from the second electrode on one or both of the opposing sides of each of the tines in a widthwise direction orthogonal to the horizontal lengthwise direction.
3. The quartz crystal device of Example 2, wherein the first electrode covers at least a portion of a first sidewall of the line structure, and wherein the second electrode covers at least a portion of a second sidewall of the line structure facing away from the first sidewall.
4. The quartz crystal device of Example 3, wherein the first electrode extends to cover at least a portion of a first one of recessed surfaces abutting the first sidewall of the line structure, and wherein the second electrode extends to cover at least a portion of a second one of the recessed surfaces abutting the second sidewall of the line structure.
5. The quartz crystal device of Example 1, wherein each of the tines comprises a line structure formed on each of the opposing sides thereof.
6. The quartz crystal device of Example 5, wherein one of the tines comprises:
    the first and second electrodes formed on sidewalls of a first line structure on one of the opposing sides and are configured to apply an electric field through the first line structure in a first direction; and
    the first and second electrodes formed on sidewalls of a second line structure on the other of the opposing sides and are configured to apply an electric field through the second line structure in a second direction opposite the first direction.
7. The quartz crystal device of Example 1, wherein each of the tines comprises a line structure formed on the same side such that the line structures have sidewalls facing each other and sidewalls facing away from each other.
8. The quartz crystal device of Example 7, wherein each of the sidewalls facing each other have one of the first or second electrodes formed thereon while each of the sidewalls facing away from each other have the other of the first or second electrodes formed thereon.
9. The quartz crystal device of Example 1, wherein the line structure forms an elongated rectangular mesa structure having substantially parallel sidewalls.

10. The quartz crystal device of Example 1, wherein each of the line structures has substantially the same shape and dimensions.
11. The quartz crystal device of Example 1, wherein the quartz crystal device is such that a motional resistance increases with increasing frequency in a frequency range of 100-500 kHz.
12. The quartz crystal device of Example 1, wherein the quartz crystal device has a motional resistance of 1-20 KΩ.
13. The quartz crystal device of Example 1, wherein the quartz crystal device has a substantially linear temperature dependence of a resonance frequency, wherein the temperature dependence is such that a coefficient of a linear temperature-dependent term is about 10-50 ppm/° C.
14. The quartz crystal device of Example 1, wherein the quartz crystal device has surface normal directions of main surfaces that are rotated between about −40 degrees and +40 degrees relative to a X-axis of a quartz crystal from which the fork-shaped quartz crystal is fabricated, and wherein the tines extend in an X-axis of the quartz crystal.
15. A quartz crystal device configured for temperature sensing, comprising:
    a fork-shaped quartz crystal comprising a pair of elongate tines laterally extending from a base region in a horizontal lengthwise direction of the fork-shaped quartz crystal,
    a first electrode and a second electrode formed on the one or both of the opposing sides of each of the tines, wherein each of the first and second electrodes have surfaces facing each other in a widthwise direction of the fork-shaped quartz crystal and configured such that, when an electrical bias is applied between the first and second electrodes, the fork-shaped quartz crystal vibrates in a torsional mode in which each of the tines twists about a respective axis extending in the horizontal lengthwise direction.
16. The quartz crystal device of Example 15, wherein each of the tines has formed on one or both of opposing sides thereof a vertically protruding line structure laterally elongated in the horizontal lengthwise direction, wherein the first and second electrodes are formed on opposing sidewalls of the line structure.
17. The quartz crystal device of Example 16, wherein the first electrode extends to cover at least a portion of a first one of recessed surfaces abutting the first sidewall of the line structure, and wherein the second electrode extends to cover at least a portion of a second one of the recessed surfaces abutting the second sidewall of the line structure.
18. The quartz crystal device of Example 16, wherein both of opposing sides of each of the tines comprises a line structure formed on each of the opposing sides thereof, wherein the first and second electrodes are formed on opposing sidewalls of the line structure.
19. The quartz crystal device of Example 16, wherein relative positions of the first electrode and the second electrode are oppositely arranged in different ones of the tines such that, when the electrical bias is applied between first and second electrodes, the tines twist in opposite rotational directions.
20. The quartz crystal device of Example 15, wherein the quartz crystal device has a substantially linear temperature dependence of a resonance frequency, wherein the temperature dependence is such that a coefficient of a linear temperature-dependent term is greater than a coefficient of a second order temperature-dependent term by a factor exceeding 500.
21. A quartz crystal oscillator device configured for temperature sensing, comprising:
    a package substrate;
    a quartz crystal device bonded to the package substrate, wherein the quartz crystal device comprises a fork-shaped quartz crystal device comprising a pair of elongate tines laterally extending from a base region in a horizontal lengthwise direction of the fork-shaped quartz crystal, wherein each of the tines has formed on one or both of opposing sides thereof a vertically protruding line structure laterally elongated in the horizontal lengthwise direction and electrodes configured such that the fork-shaped quartz crystal vibrates in a torsional mode in which each of the tines twists about a respective axis extending in the horizontal lengthwise direction; and
    an integrated circuit (IC) die electrically connected to the quartz crystal device and bonded to the package substrate.
22. The quartz crystal oscillator device of Example 21, wherein the electrodes comprises first and second electrodes having surfaces facing each other in a widthwise direction of the fork-shaped quartz crystal and configured such that, when an electrical bias is applied between the first and second electrodes, an electric field in the widthwise direction causes the fork-shaped quartz crystal to vibrate in the torsional mode.
23. The quartz crystal oscillator device of Example 22, wherein each of the tines has formed on one or both of opposing sides thereof a vertically protruding line structure laterally elongated in the horizontal lengthwise direction, wherein the first and second electrodes are formed on opposing sidewalls of the line structure.
24. The quartz crystal oscillator device of Example 21, wherein the quartz crystal device is disposed over and at least partly overlapping the IC die.
25. The quartz crystal device of Example 1, wherein a substantially vertical sidewall of the line structure and a substantially horizontal upper surface of a tine directly meet at a substantially right angle to form an edge.
26. The quartz crystal device of Example 1, wherein a substantially vertical sidewall of the line structure and a substantially horizontal upper surface of tine are indirectly connected by a facet.
27. The quartz crystal device of Example 16, wherein a substantially vertical sidewall of the line structure and a substantially horizontal upper surface of the base region directly meet at a substantially right angle to form an edge.
28. The quartz crystal device of Example 16, wherein a substantially vertical sidewall of the line structure and a substantially horizontal upper surface of the base region are indirectly connected by a facet.
29. The quartz crystal oscillator device of Example 23, wherein a substantially vertical sidewall of the line structure and a substantially horizontal upper surface of the base region directly meet at a substantially right angle to form an edge.
30. The quartz crystal oscillator device of Example 23, wherein a substantially vertical sidewall of the line structure and a substantially horizontal upper surface of the base region are indirectly connected by a facet.

ADDITIONAL EXAMPLES II

1. A quartz crystal device configured for temperature sensing, comprising:
   a fork-shaped quartz crystal comprising a pair of elongate tines laterally extending from a base region in a horizontal lengthwise direction of the fork-shaped quartz crystal, wherein each of the tines has formed on one or both of opposing sides thereof a pair of vertically recessed groove structures laterally elongated in the horizontal lengthwise direction, wherein the pair of groove structures are separated in a horizontal widthwise direction by a line structure; and
   a first electrode and a second electrode formed on the one or both of the opposing sides of each of the tines and configured such that, when an electrical bias is applied between the first and second electrodes, the fork-shaped quartz crystal vibrates in a torsional mode in which each of the tines twists about a respective axis extending in the horizontal lengthwise direction.
2. The quartz crystal device of Example 1, wherein each of the pair of groove structures is formed by the line structure and another line structure separated from the line structure in the widthwise direction by the respective one of the groove structures.
3. The quartz crystal device of Example 1, wherein the line structure laterally separates the first electrode from the second electrode on one or both of the opposing sides of each of the tines in a widthwise direction orthogonal to the horizontal lengthwise direction.
4. The quartz crystal device of Example 3, wherein the first electrode covers at least a portion of a first sidewall of the line structure, and wherein the second electrode covers at least a portion of a second sidewall of the line structure facing away from the first sidewall.
5. The quartz crystal device of Example 4, wherein the first electrode extends to cover at least a portion of a first one of recessed bottom surfaces of one of the pair of groove structures abutting the first sidewall of the line structure, and wherein the second electrode extends to cover at least a portion of a second one of the recessed bottom surfaces of the other of the pair of groove structures abutting the second sidewall of the line structure.
6. The quartz crystal device of Example 5, wherein the first electrode extends to cover at least a portion of each of opposing sidewalls of the one of the pair of groove structures, and wherein the second electrode extends to cover at least a portion of each of opposing sidewalls of the other of the pair of groove structures.
7. The quartz crystal device of Example 1, wherein each of the tines has formed on both of opposing sides thereof a pair of vertically recessed groove structures that are laterally elongated in the horizontal lengthwise direction and separated in the horizontal widthwise direction by a line structure.
8. The quartz crystal device of Example 7, wherein one of the tines comprises:
   the first and second electrodes formed on sidewalls of a first line structure on one of the opposing sides and are configured to apply an electric field through the first line structure in a first direction; and
   the first and second electrodes formed on sidewalls of a second line structure on the other of the opposing sides and are configured to apply an electric field through the second line structure in a second direction opposite the first direction.
9. The quartz crystal device of Example 1, wherein each of the tines comprises a line structure formed on the same side that separates a pair of groove structures, such that the line structures have sidewalls facing each other and sidewalls facing away from each other.
10. The quartz crystal device of Example 9, wherein each of the sidewalls facing each other have one of the first or second electrodes formed thereon while each of the sidewalls facing away from each other have the other of the first or second electrodes formed thereon.
11. The quartz crystal device of Example 1, wherein each of the groove structures forms an elongated rectangular groove structure having substantially parallel opposing sidewalls.
12. The quartz crystal device of Example 1, wherein each of the groove structures has substantially the same shape and dimensions.
13. The quartz crystal device of Example 1, wherein the quartz crystal device is such that a motional resistance increases with increasing frequency in a frequency range of 100-500 kHz.
14. The quartz crystal device of Example 1, wherein the quartz crystal device has a motional resistance of 1-20 KΩ.
15. The quartz crystal device of Example 1, wherein the quartz crystal device has a substantially linear temperature dependence of a resonance frequency, wherein the temperature dependence is such that a coefficient of a linear temperature-dependent term is about 10-50 ppm/° C.
16. The quartz crystal device of Example 1, wherein the quartz crystal device has surface normal directions of main surfaces that are rotated between about −40 degrees and +40 degrees relative to a X-axis of a quartz crystal from which the fork-shaped quartz crystal is fabricated, and wherein the tines extend in an X-axis of the quartz crystal.
17. A quartz crystal device configured for temperature sensing, comprising:
   a fork-shaped quartz crystal comprising a pair of elongate tines laterally extending from a base region in a horizontal lengthwise direction of the fork-shaped quartz crystal,
   wherein each of the tines has formed on one or both of opposing sides thereof a pair of vertically recessed groove structures laterally elongated in the horizontal lengthwise direction, wherein the groove structures are separated in a horizontal widthwise direction by a line structure; and
   a first electrode and a second electrode formed on the one or both of the opposing sides of each of the tines, wherein each of the first and second electrodes has a surface facing a widthwise direction of the fork-shaped quartz crystal and configured such that, when an electrical bias is applied between the first and second electrodes, the fork-shaped quartz crystal vibrates in a torsional mode in which each of the tines twists about a respective axis extending in the horizontal lengthwise direction.
18. The quartz crystal device of Example 17, wherein each of the pair of groove structures is formed by the line structure and another line structure separated from the line structure in the widthwise direction by the respective one of the groove structures.
19. The quartz crystal device of Example 18, wherein the first and second electrodes are formed on opposing sidewalls of the line structure.
20. The quartz crystal device of Example 19, wherein the first electrode extends to cover at least a portion of a first one of recessed bottom surfaces of one of the pair of groove structures abutting the first sidewall of the line structure, and wherein the second electrode extends to cover at least a portion of a second one of the recessed bottom surfaces of the other of the pair of groove structures abutting the second sidewall of the line structure.
21. The quartz crystal device of Example 19, wherein each of the tines has formed on both of opposing sides thereof a pair of vertically recessed groove structures that are laterally elongated in the horizontal lengthwise direction and separated in the horizontal widthwise direction by a line structure, wherein the first and second electrodes are formed on opposing sidewalls of the line structure.
22. The quartz crystal device of Example 19, wherein relative positions of the first electrode and the second electrode are oppositely arranged in different ones of the tines such that, when the electrical bias is applied between first and second electrodes, the tines twist in opposite rotational directions.
23. The quartz crystal device of Example 17, wherein the quartz crystal device has a substantially linear temperature dependence of a resonance frequency, wherein the temperature dependence is such that a coefficient of a linear temperature-dependent term is greater than a coefficient of a second order temperature-dependent term by a factor exceeding 500.
24. A quartz crystal oscillator device configured for temperature sensing, comprising:
    a package substrate;
    a quartz crystal device bonded to the package substrate, wherein the quartz crystal device comprises a fork-shaped quartz crystal device comprising a pair of elongate tines laterally extending from a base region in a horizontal lengthwise direction of the fork-shaped quartz crystal, wherein each of the tines has formed on one or both of opposing sides thereof:
        a pair of vertically recessed groove structures laterally elongated in the horizontal lengthwise direction, wherein the groove structures are separated in a horizontal widthwise direction by a line structure, and
        electrodes configured such that the fork-shaped quartz crystal vibrates in a torsional mode in which each of the tines twists about a respective axis extending in the horizontal lengthwise direction; and
    an integrated circuit (IC) die electrically connected to the quartz crystal device and bonded to the package substrate.
25. The quartz crystal oscillator device of Example 24, wherein the electrodes comprises first and second electrodes having surfaces facing a widthwise direction of the fork-shaped quartz crystal and configured such that, when an electrical bias is applied between the first and second electrodes, an electric field in the widthwise direction causes the fork-shaped quartz crystal to vibrate in the torsional mode.
26. The quartz crystal oscillator device of Example 25, wherein each of the tines has formed on both of opposing sides thereof a pair of vertically recessed groove structures that are laterally elongated in the horizontal lengthwise direction and separated in the horizontal widthwise direction by a line structure, wherein the first and second electrodes are formed on opposing sidewalls of the line structure.
27. The quartz crystal oscillator device of Example 24, wherein the quartz crystal device is disposed over and at least partly overlapping the IC die.
28. The quartz crystal device of Example 1, wherein a substantially vertical sidewall of the line structure and a substantially horizontal upper surface of a tine directly meet at a substantially right angle to form an edge.
29. The quartz crystal device of Example 1, wherein a substantially vertical sidewall of the line structure and a substantially horizontal upper surface of tine are indirectly connected by a facet.
30. The quartz crystal device of Example 17, wherein a substantially vertical sidewall of the line structure and a substantially horizontal upper surface of the base region directly meet at a substantially right angle to form an edge.
31. The quartz crystal device of Example 17, wherein a substantially vertical sidewall of the line structure and a substantially horizontal upper surface of the base region are indirectly connected by a facet.
32. The quartz crystal oscillator device of Example 24, wherein a substantially vertical sidewall of the line structure and a substantially horizontal upper surface of the base region directly meet at a substantially right angle to form an edge.
33. The quartz crystal oscillator device of Example 24, wherein a substantially vertical sidewall of the line structure and a substantially horizontal upper surface of the base region are indirectly connected by a facet.

Aspects of this disclosure can be implemented in various electronic devices. In particular, applications of the electronic devices include, but are not limited to, high temperature, high reliability and/or high shock and vibration environments, such as oil/gas exploration, geophysical services, avionics, aerospace, military, process control and other harsh industrial applications. However, applications are not so limited and examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products. Aspects of this disclosure can be particularly implemented in various wireless telecommunication technologies in which high power, high frequency bands, improved linearity and/or improved efficiency are desired, including military and space applications such as radars, community antenna television (CATV), radar jammers and wireless telecommunication base-stations, to name a few.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A quartz crystal device configured for temperature sensing, comprising:
a quartz crystal comprising first and second elongate arms laterally extending from a base region in a horizontal lengthwise direction of the arms, wherein each arm has formed on each of upper and lower sides thereof a pair of vertically recessed groove structures laterally elongated in the horizontal lengthwise direction; and
a first electrode and a second electrode formed on the upper and lower sides of each of the first and second elongate arms and configured to be biased at opposite polarities, wherein adjacent ones of the groove structures on a same side of each of the first and second elongate arms have formed therein different ones of the first and second electrodes.

2. The quartz crystal device of claim 1, wherein the pair of groove structures on the same side of each arm are separated in a horizontal widthwise direction of the arms by a vertically protruding line structure extending in the horizontal lengthwise direction.

3. The quartz crystal device of claim 2, wherein the first and second electrodes in each of the pairs of vertically recessed groove structures have vertical portions that face each other laterally across the vertically protruding line structure in the horizontal widthwise direction crossing the lengthwise direction.

4. The quartz crystal device of claim 1, wherein each of the groove structures comprises a rectangular trench having opposing sidewalls connected by a bottom surface.

5. The quartz crystal device of claim 4, wherein each of the groove structures has formed on at least a portion of at least one of the sidewalls thereof the first electrode or the second electrode.

6. The quartz crystal device of claim 5, wherein the first electrode or the second electrode formed on the at least one of the sidewalls extends to cover the bottom surface.

7. The quartz crystal device of claim 1, wherein the first and second electrodes in each of the pairs of vertically recessed groove structures have vertical portions that face each other.

8. The quartz crystal device of claim 7, wherein the vertical portions face each other in a horizontal widthwise direction crossing the horizontal lengthwise direction.

9. The quartz crystal device of claim 1, wherein the quartz crystal device has a substantially linear temperature dependence of a resonance frequency, wherein the temperature dependence is such that a coefficient of a linear temperature-dependent term is about 10-50 ppm/° C.

10. The quartz crystal device of claim 1, wherein the horizontal lengthwise direction corresponds to the X-axis of a quartz crystal from which the quartz crystal is fabricated, and wherein the quartz crystal device has surface normal directions of main surfaces that are rotated between about −40 degrees and +40 degrees relative to the X-axis.

11. The quartz crystal device of claim 1, wherein the quartz crystal device is hermetically sealed in a package substrate having disposed therein an integrated circuit (IC) die electrically connected to the quartz crystal device and bonded to the package substrate.

12. A quartz crystal device configured for temperature sensing, comprising:
a quartz crystal comprising first and second elongate arms laterally extending from a base region in a horizontal lengthwise direction of the quartz crystal, wherein each arm has formed on each of upper and lower sides thereof a pair of vertically recessed groove structures laterally elongated in the horizontal lengthwise direction; and
a first electrode and a second electrode formed on the upper and lower sides of each of the first and second elongate arms, wherein the first and second electrodes are configured to be biased at opposite polarities and wherein the groove structures in each of the pairs of vertically recessed groove structures have formed therein different ones of the first and second electrodes.

13. The quartz crystal device of claim 12, wherein the pair of groove structures on a same side of each arm are separated in a horizontal widthwise direction of the arms by a vertically protruding line structure extending in the horizontal lengthwise direction.

14. The quartz crystal device of claim 13, wherein the first and second electrodes in each of the pairs of vertically recessed groove structures have vertical portions that face each other laterally across the vertically protruding line structure in the horizontal widthwise direction crossing the horizontal lengthwise direction.

15. The quartz crystal device of claim 14, wherein the first and second electrodes formed on the same side of each of the first and second elongate arms are in contact with surfaces of a respective one of the line structures.

16. The quartz crystal device of claim 15, wherein the first and second electrodes formed on the same side of each of the first and second elongate arms are each in contact with different surfaces of the respective one of the line structures.

17. The quartz crystal device of claim 12, wherein the quartz crystal device has a substantially linear temperature dependence of a resonance frequency, wherein the temperature dependence is such that a coefficient of a linear temperature-dependent term is about 10-50 ppm/° C.

18. The quartz crystal device of claim 12, wherein the horizontal lengthwise direction corresponds to the X-axis of a quartz crystal from which the quartz crystal is fabricated, and wherein the quartz crystal device has surface normal directions of main surfaces that are rotated between about −40 degrees and +40 degrees relative to the X-axis.

19. The quartz crystal device of claim 12, wherein the quartz crystal device is hermetically sealed in a package substrate having disposed therein an integrated circuit (IC) die electrically connected to the quartz crystal device and bonded to the package substrate.

20. A quartz crystal device configured for temperature sensing, comprising:

a quartz crystal comprising first and second elongate arms laterally extending from a base region in a horizontal lengthwise direction of the arms, wherein each of the first and second elongate arms has formed on lower and upper sides thereof a pair of vertically recessed groove structures laterally elongated in the horizontal lengthwise direction;

wherein adjacent ones of the groove structures on a same side of each of the arms have formed therein electrodes having portions that face each other and configured to be biased at opposite polarities.

21. The quartz crystal device of claim 20, wherein the pair of vertically recessed groove structures on the same side of each arm are separated in a horizontal widthwise direction of the arms by a vertically protruding line structure extending in the horizontal lengthwise direction.

22. The quartz crystal device of claim 21, wherein the portions of the electrodes that face each other are formed on opposing surfaces of the vertically protruding line structure and face each other across the vertically protruding line structure.

23. The quartz crystal device of claim 20, wherein the quartz crystal device has a substantially linear temperature dependence of a resonance frequency, wherein the temperature dependence is such that a coefficient of a linear temperature-dependent term is about 10-50 ppm/° C.

24. The quartz crystal device of claim 20, wherein the horizontal lengthwise direction corresponds to the X-axis of a quartz crystal from which the quartz crystal is fabricated, and wherein the quartz crystal device has surface normal directions of main surfaces that are rotated between about −40 degrees and +40 degrees relative to the X-axis.

25. The quartz crystal device of claim 20, wherein the quartz crystal device is hermetically sealed in a package substrate having disposed therein an integrated circuit (IC) die electrically connected to the quartz crystal device and bonded to the package substrate.

\* \* \* \* \*